United States Patent
Mertz et al.

(10) Patent No.: US 12,007,483 B2
(45) Date of Patent: Jun. 11, 2024

(54) THREE-DIMENSIONAL COORDINATE MEASURING DEVICE

(71) Applicant: FARO Technologies, Inc., Lake Mary, FL (US)

(72) Inventors: Jacob J. Mertz, Elkridge, MD (US); Jun Li, Downingtown, PA (US); Michael Ferrara, Garnet Valley, PA (US); Robert E. Bridges, Kennett Square, PA (US)

(73) Assignee: FARO Technologies, Inc., Lake Mary, FL (US)

( * ) Notice: Subject to any disclaimer, the term of this patent is extended or adjusted under 35 U.S.C. 154(b) by 539 days.

(21) Appl. No.: 17/081,431

(22) Filed: Oct. 27, 2020

(65) Prior Publication Data

US 2021/0080579 A1 Mar. 18, 2021

Related U.S. Application Data

(63) Continuation of application No. 15/715,553, filed on Sep. 26, 2017, now abandoned.
(Continued)

(51) Int. Cl.
*G01S 17/42* (2006.01)
*G01B 11/00* (2006.01)
(Continued)

(52) U.S. Cl.
CPC ............ *G01S 17/42* (2013.01); *G01B 11/002* (2013.01); *G01C 15/002* (2013.01);
(Continued)

(58) Field of Classification Search
None
See application file for complete search history.

(56) References Cited

U.S. PATENT DOCUMENTS

| 7,327,446 B2 | 2/2008 | Cramer et al. |
| 7,583,375 B2 | 9/2009 | Cramer et al. |

(Continued)

FOREIGN PATENT DOCUMENTS

CN 102738702 B 10/2012

OTHER PUBLICATIONS

International Search Report and Written Opinion for International Application No. PCT/US2017/053580 dated Jan. 4, 2018; 15 pgs.

*Primary Examiner* — Hovhannes Baghdasaryan
(74) *Attorney, Agent, or Firm* — McCarter & English, LLP; Dave S. Christensen

(57) ABSTRACT

A coordinate measuring device is provided having a light source that emits a beam of light. A distance meter measures a distance to a target. A first locator camera assembly includes a first camera and first lights. A second locator camera assembly includes a second camera and second lights. The processor matches retroreflectors in a first image of the first camera and a second image of the second camera based on a shape-and-context matching of retroreflector spots in the first and second image and on an area-context-matching of background objects in the first and second image. The retroreflector spots in the first image produced by illumination of the retroreflectors by the first lights, the retroreflector spots in the second image produced by illumination of the retroreflectors by the second lights. The processor provides a third image that includes both the background objects and markers indicating the matched retroreflectors.

7 Claims, 32 Drawing Sheets

Related U.S. Application Data

(60) Provisional application No. 62/402,152, filed on Sep. 30, 2016.

(51) Int. Cl.
  *G01C 15/00* (2006.01)
  *G01S 7/481* (2006.01)
  *G01S 7/497* (2006.01)
  *G01S 17/36* (2006.01)
  *G01S 17/66* (2006.01)
  *G02B 6/32* (2006.01)
  *G02F 1/095* (2006.01)
  *H01S 5/024* (2006.01)
  *H01S 5/042* (2006.01)
  *H01S 5/062* (2006.01)
  *H01S 5/068* (2006.01)

(52) U.S. Cl.
  CPC .......... *G01S 7/4814* (2013.01); *G01S 7/4818* (2013.01); *G01S 7/497* (2013.01); *G01S 17/36* (2013.01); *G01S 17/66* (2013.01); *G02B 6/32* (2013.01); *G02F 1/0955* (2013.01); *G02F 2203/21* (2013.01); *H01S 5/02415* (2013.01); *H01S 5/0427* (2013.01); *H01S 5/062* (2013.01); *H01S 5/068* (2013.01)

(56) References Cited

U.S. PATENT DOCUMENTS

| | | |
|---|---|---|
| 8,081,297 B2 | 12/2011 | Bridges et al. |
| 8,422,034 B2 | 4/2013 | Steffensen et al. |
| 8,511,891 B2 | 8/2013 | Cramer et al. |
| 8,537,371 B2 | 9/2013 | Steffensen et al. |
| 8,537,376 B2 | 9/2013 | Brown et al. |
| 8,558,992 B2 | 10/2013 | Steffey |
| 8,619,265 B2 | 12/2013 | Steffey et al. |
| 8,638,446 B2 | 1/2014 | Briggs |
| 8,659,752 B2 | 2/2014 | Cramer et al. |
| 8,670,114 B2 | 3/2014 | Bridges et al. |
| 8,724,119 B2 | 5/2014 | Steffey et al. |
| 8,842,259 B2 | 9/2014 | Garey et al. |
| 8,848,203 B2 | 9/2014 | Bridges et al. |
| 8,902,408 B2 | 12/2014 | Bridges |
| 8,908,154 B2 | 12/2014 | Bridges et al. |
| 9,075,025 B2 | 7/2015 | Bridges |
| 9,151,830 B2 | 10/2015 | Bridges |
| 9,157,987 B2 | 10/2015 | Mertz et al. |
| 9,164,173 B2 | 10/2015 | Bridges et al. |
| 9,207,309 B2 | 12/2015 | Bridges |
| 9,234,742 B2 | 1/2016 | Bridges et al. |
| 9,377,885 B2 | 6/2016 | Bridges et al. |
| 9,476,695 B2 | 10/2016 | Becker et al. |
| 9,482,746 B2 | 11/2016 | Bridges |
| 9,482,755 B2 | 11/2016 | Cramer et al. |
| 9,618,602 B2 | 4/2017 | Bridges et al. |
| 9,746,560 B2 | 8/2017 | Steffey et al. |
| 9,772,394 B2 | 9/2017 | Kalyan et al. |
| 2003/0222983 A1* | 12/2003 | Nobori .............. G06T 7/97 348/E7.086 |
| 2006/0268405 A1 | 11/2006 | Takeuchi et al. |
| 2008/0013163 A1 | 1/2008 | Leonardo et al. |
| 2011/0141480 A1 | 6/2011 | Meissner |
| 2012/0206716 A1* | 8/2012 | Cramer ............... G01S 7/497 356/614 |
| 2015/0160344 A1* | 6/2015 | Bridges ............ G01S 7/4818 356/3.11 |
| 2016/0187470 A1 | 6/2016 | Becker et al. |
| 2016/0349746 A1 | 12/2016 | Markus |
| 2018/0095174 A1 | 4/2018 | Mertz |

\* cited by examiner

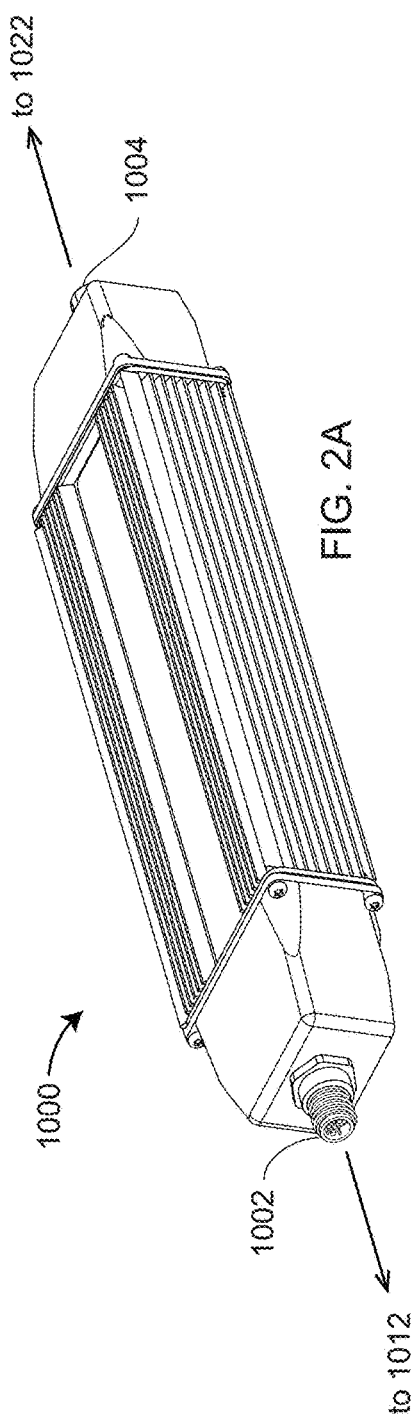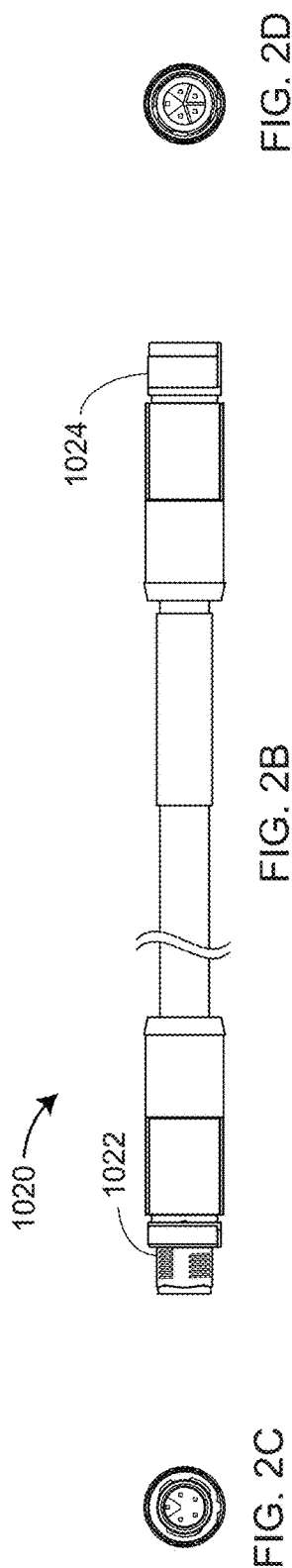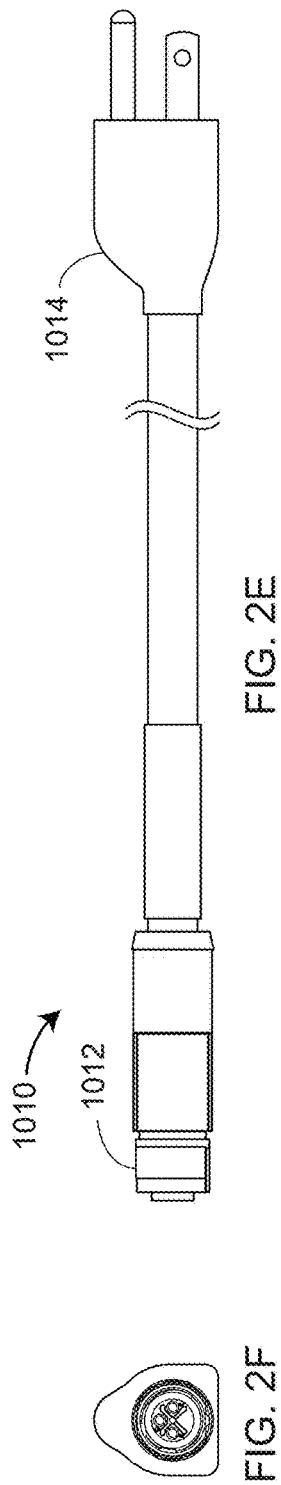

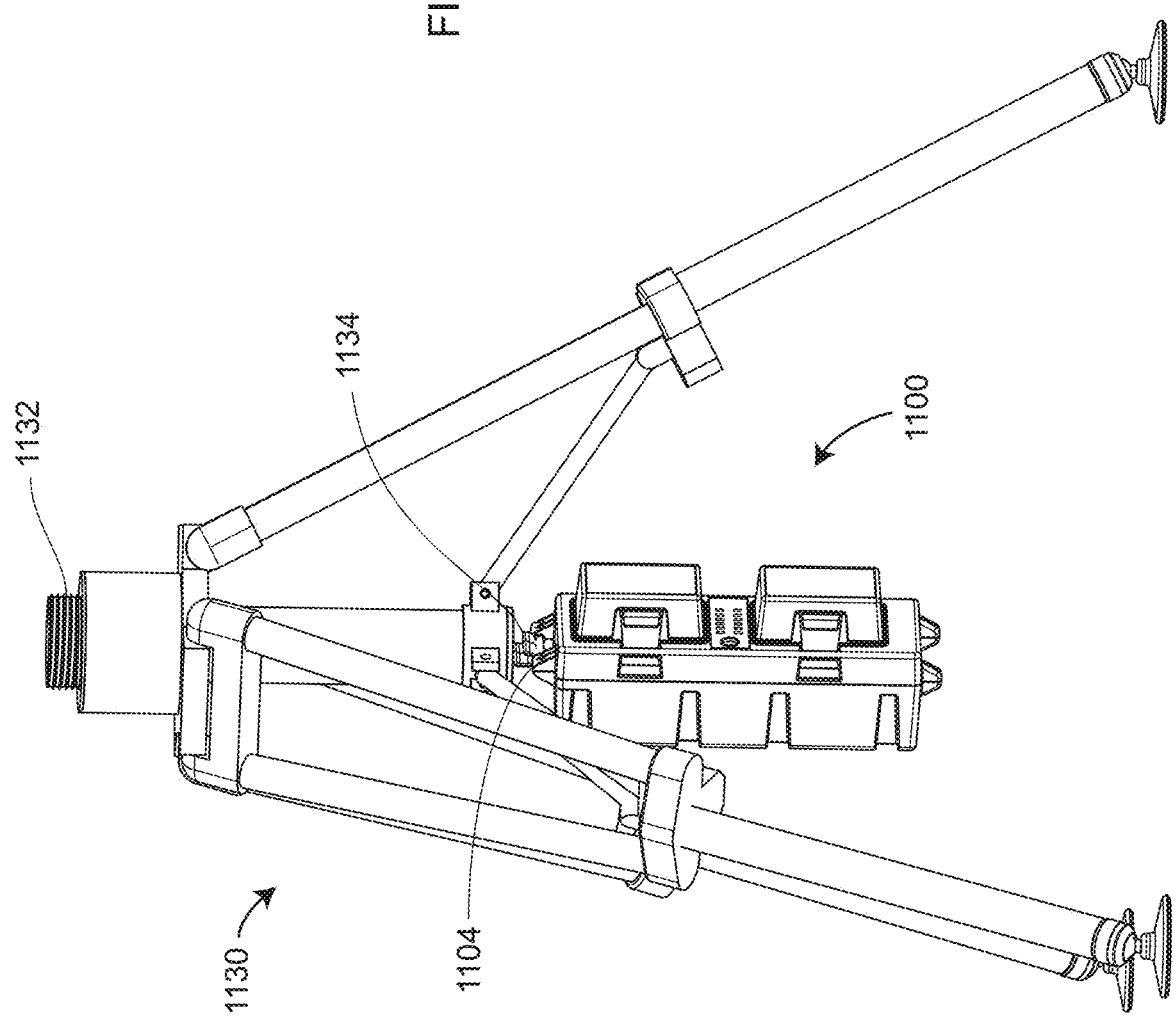

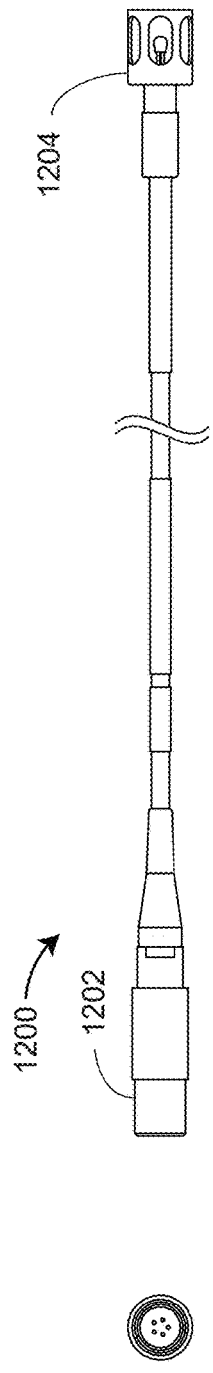
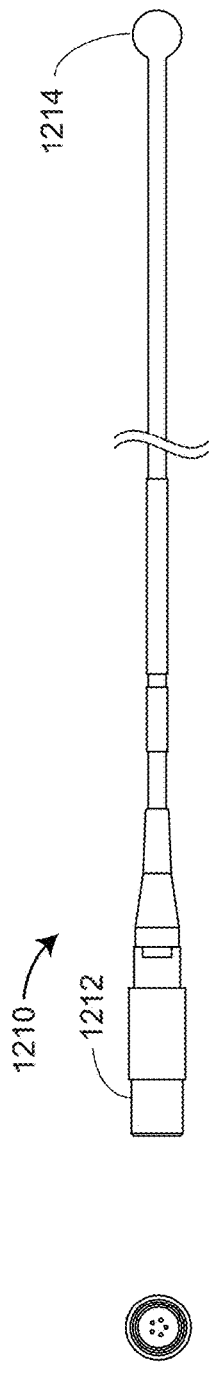
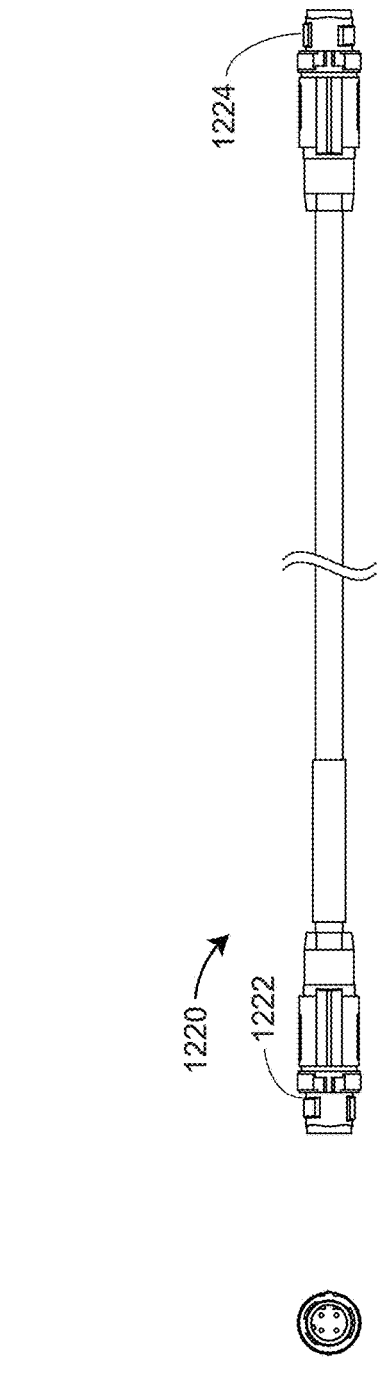

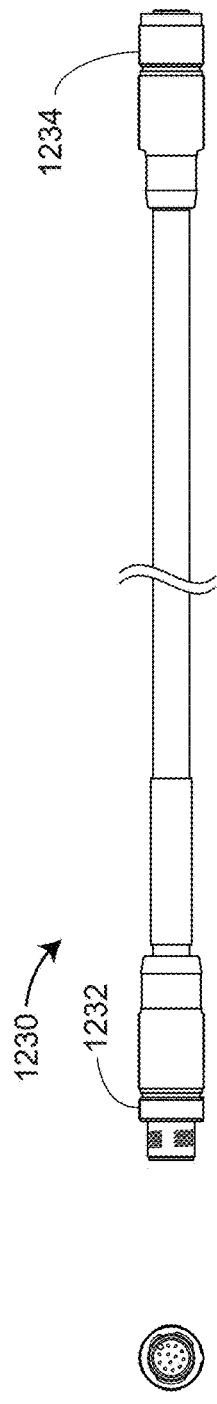
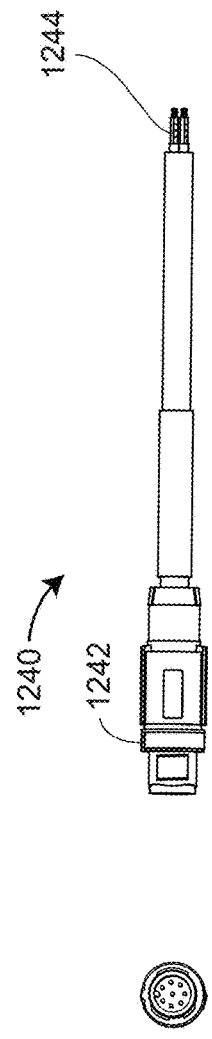
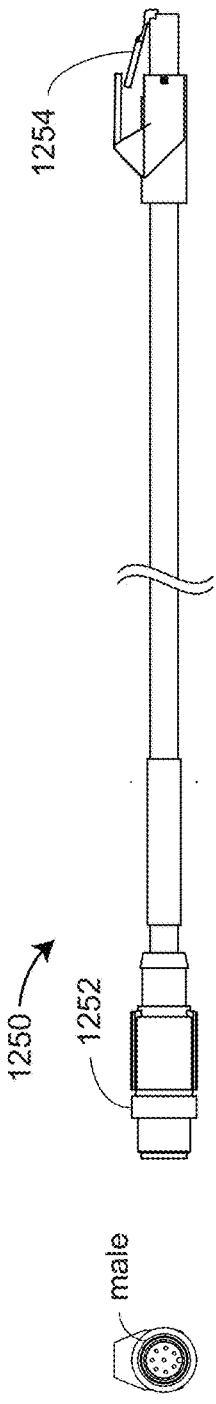
FIG. 5H  FIG. 5I  FIG. 5J  FIG. 5K  FIG. 5L  FIG. 5M  FIG. 5N  FIG. 5O

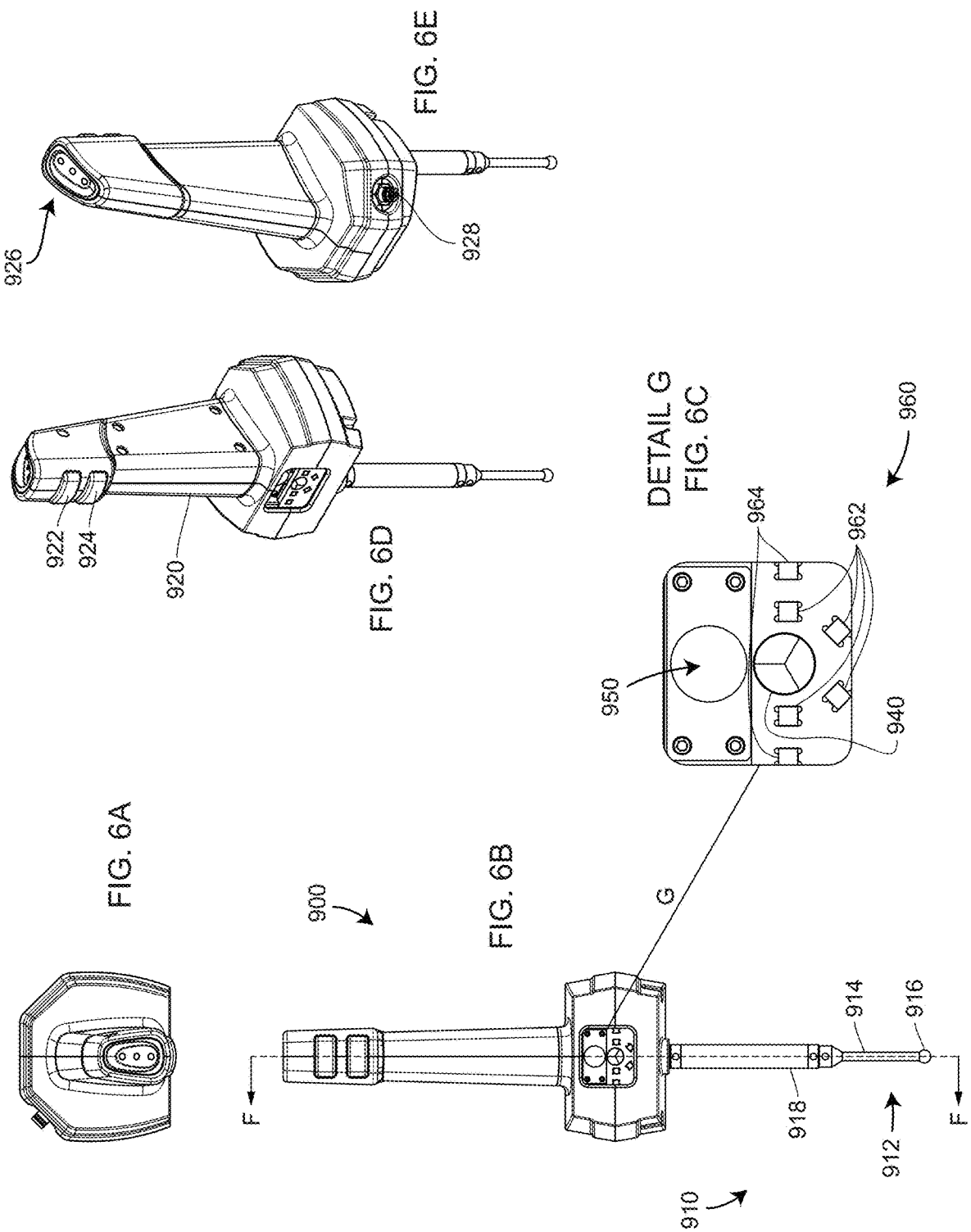

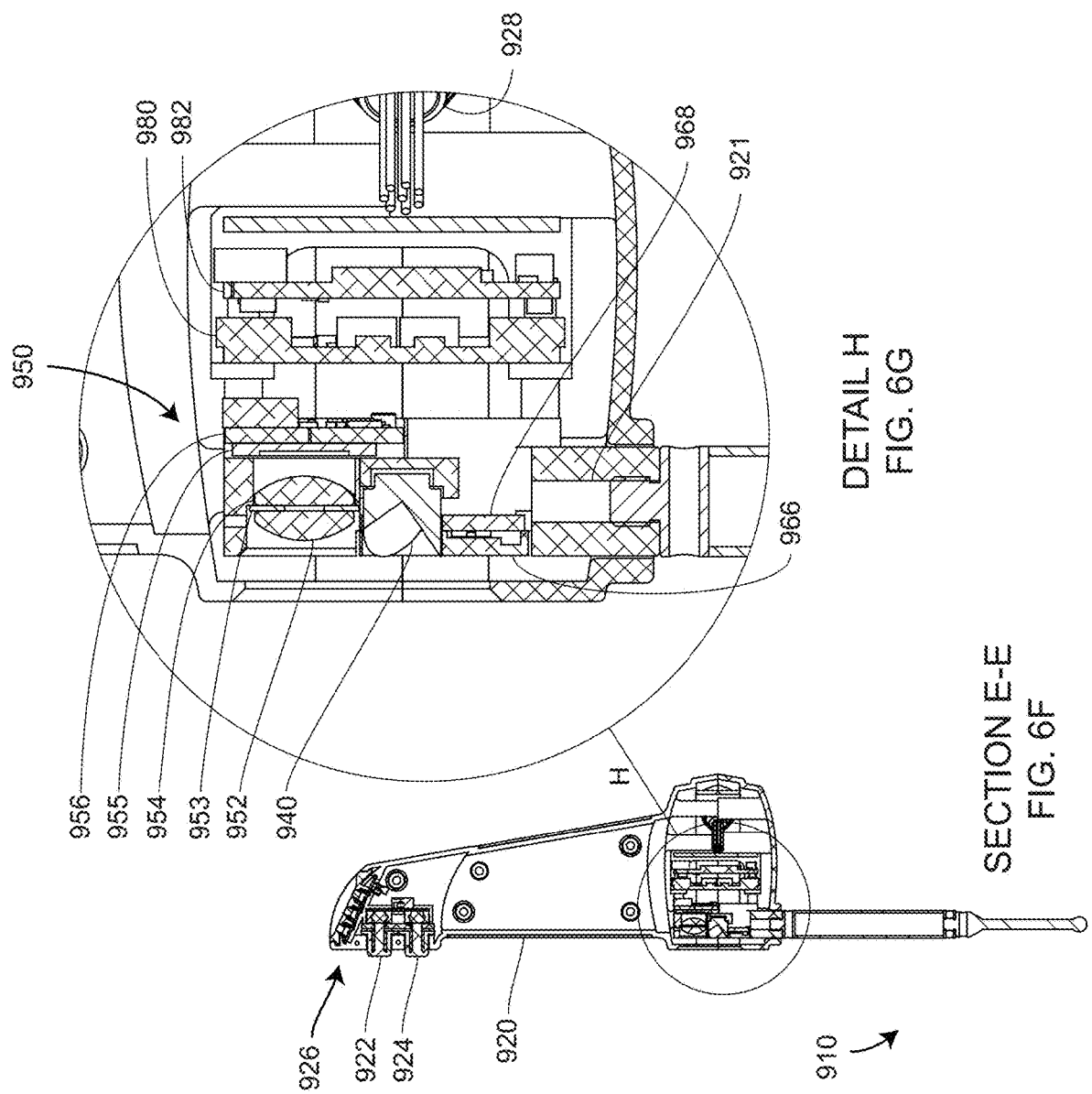

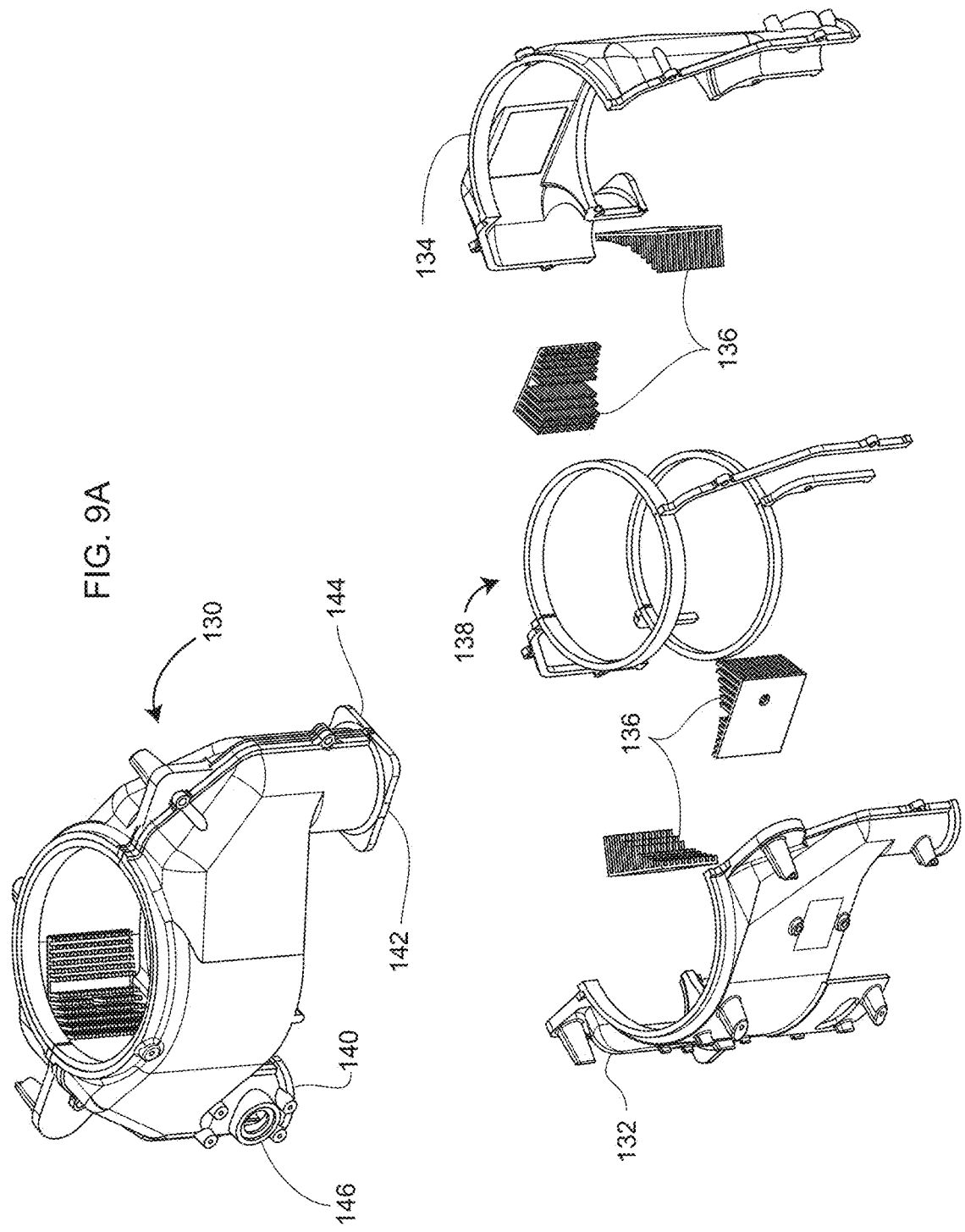

SECTION VIEW A-A

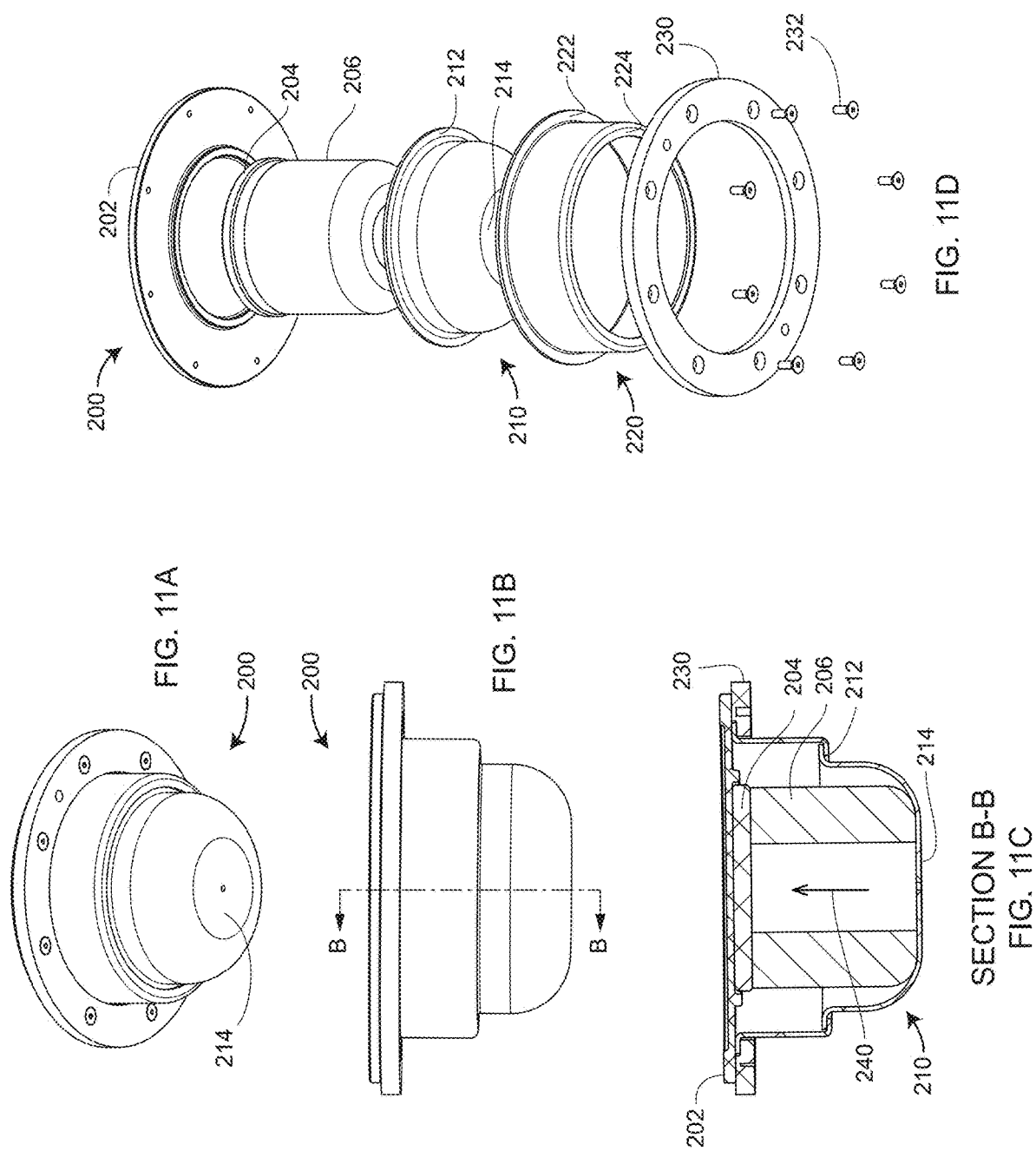

SECTION VIEW C-C

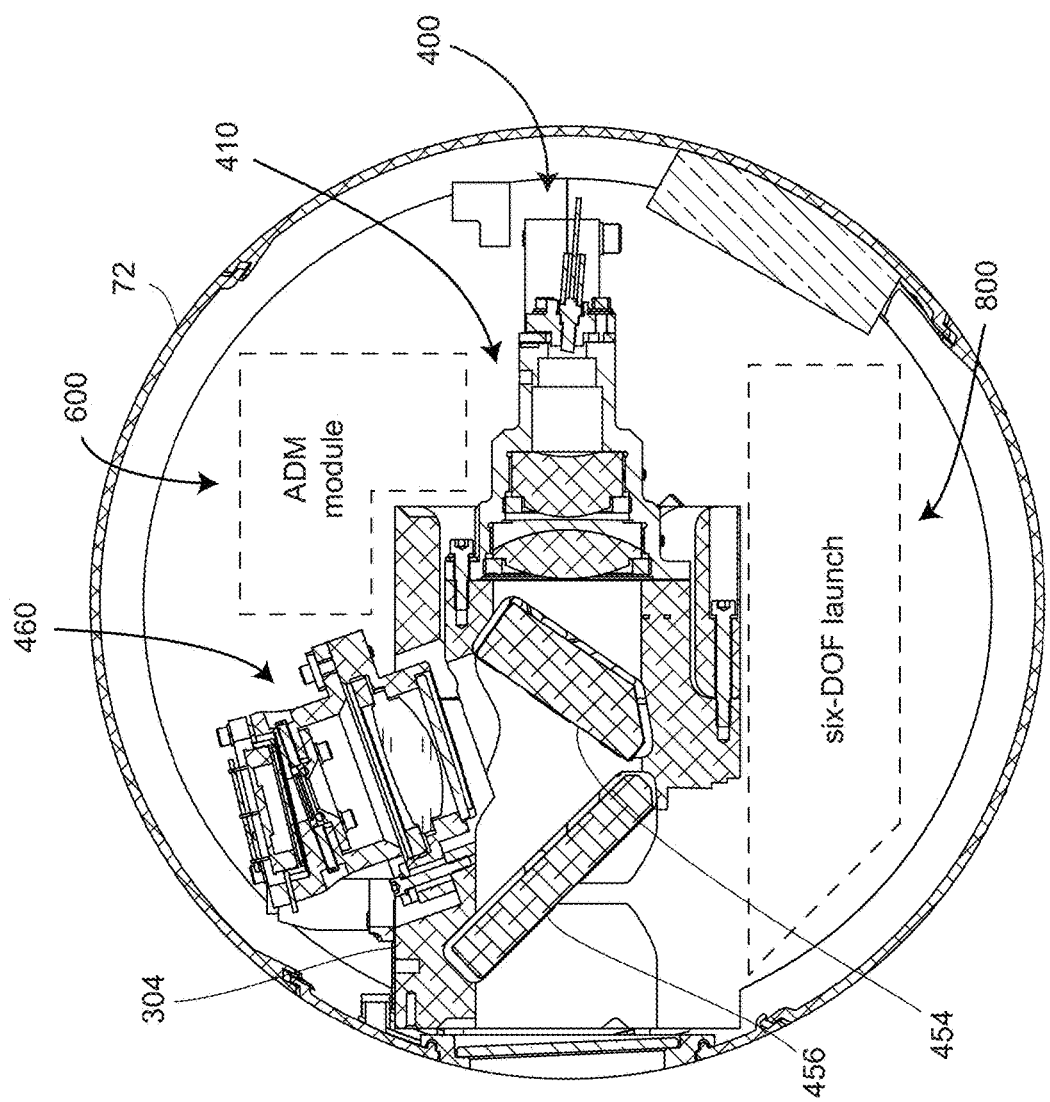
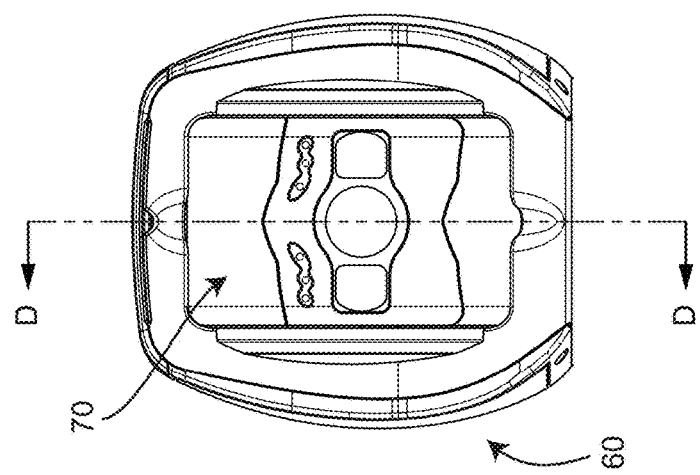
SECTION D-D
FIG. 16B
FIG. 16A

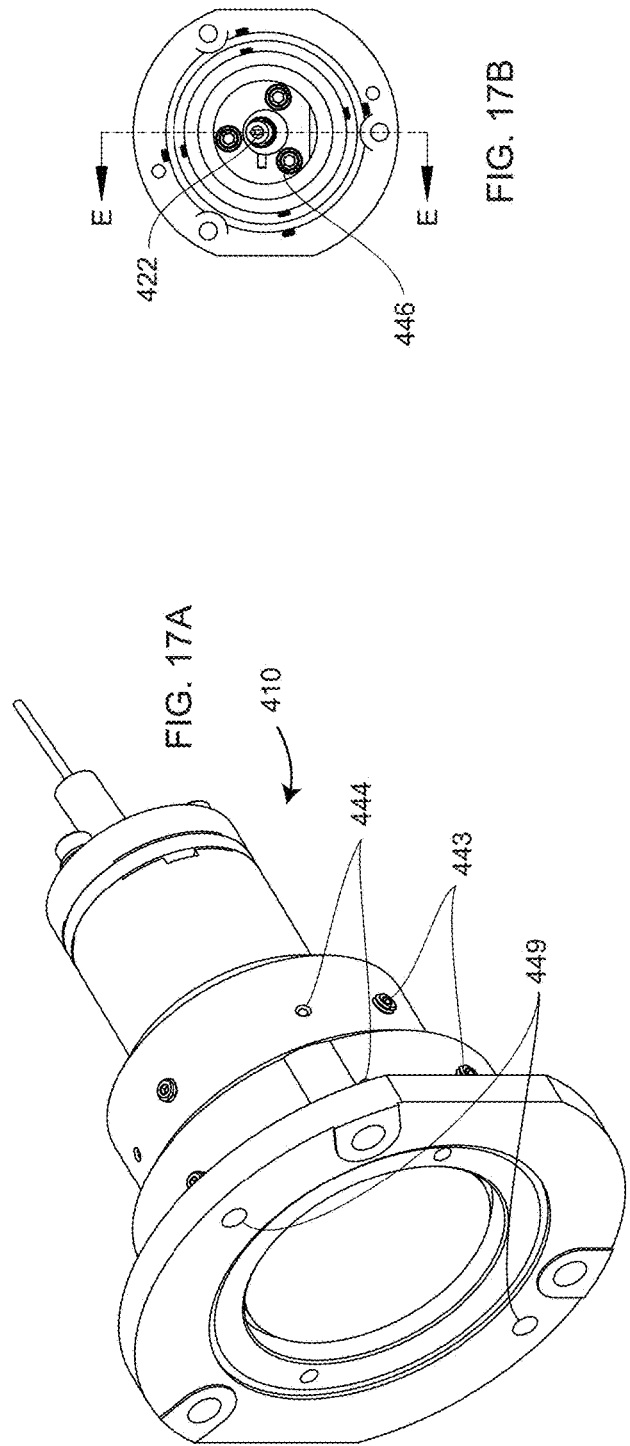
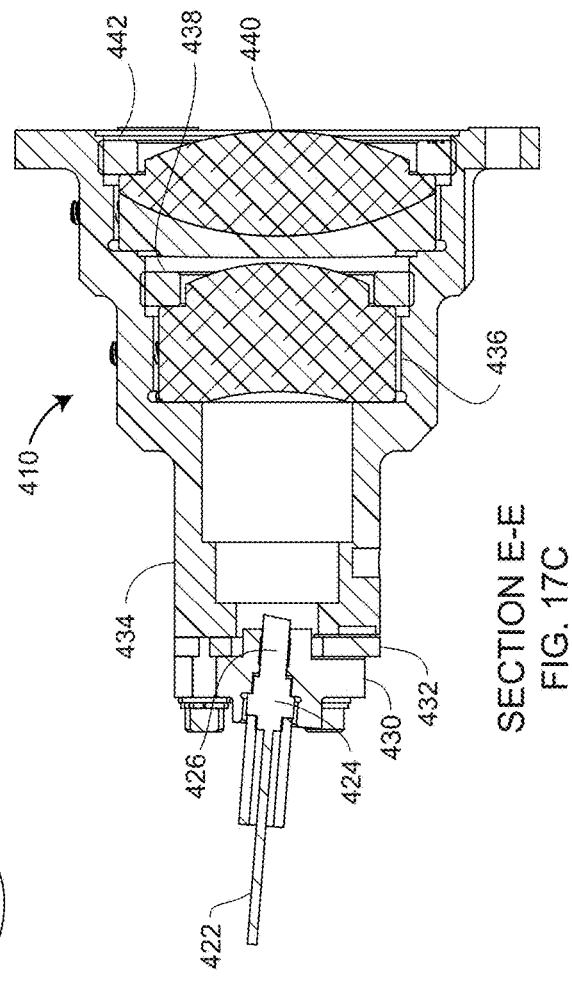
FIG. 17B
FIG. 17A
SECTION E-E
FIG. 17C

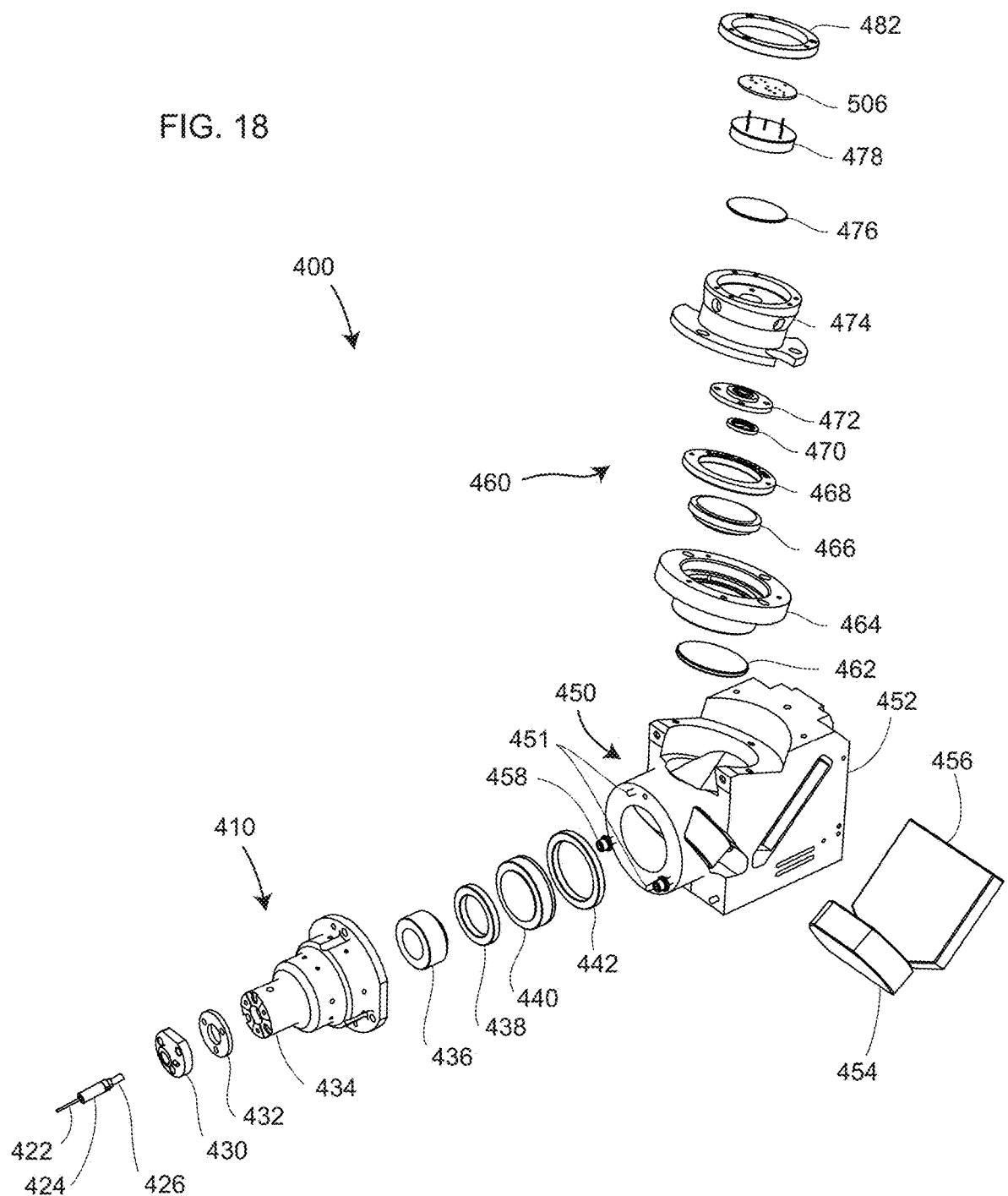

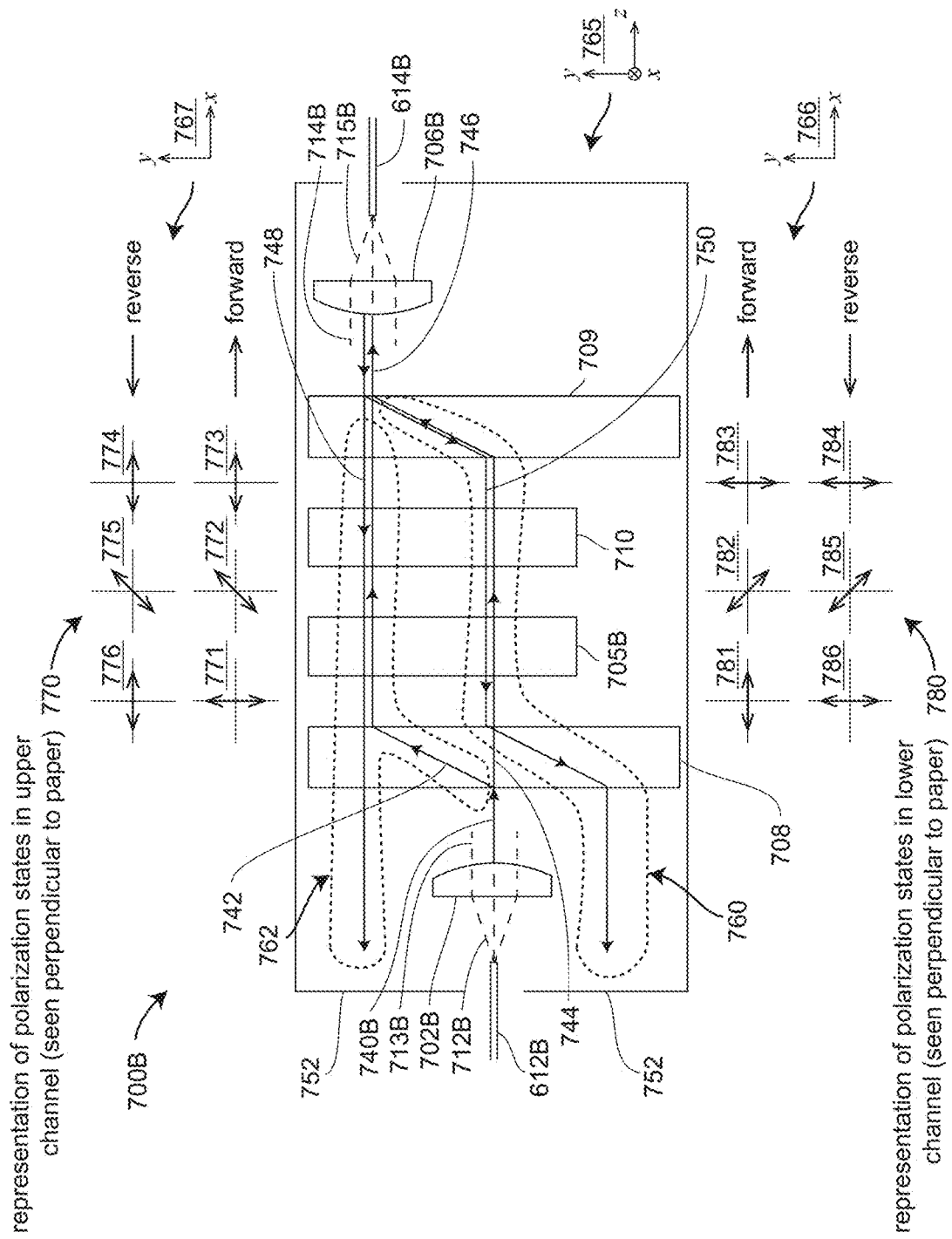

FIG. 24A
FIG. 24B
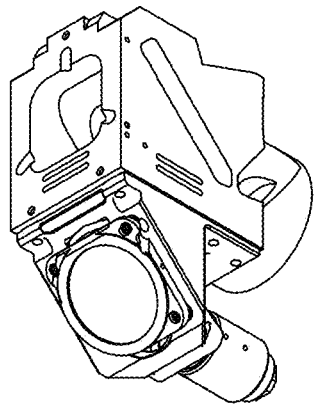
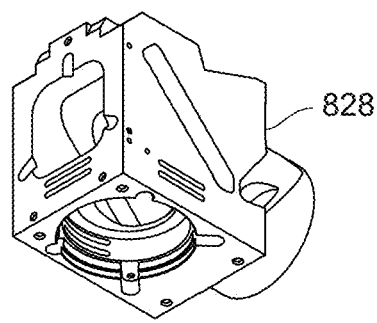
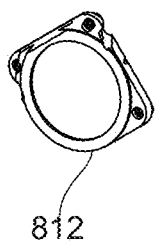
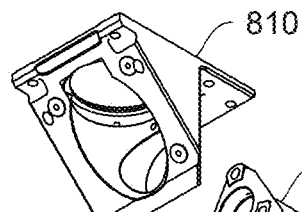

THREE-DIMENSIONAL COORDINATE MEASURING DEVICE

CROSS-REFERENCE TO RELATED APPLICATIONS

This application is a continuation application of U.S. patent application Ser. No. 15/715,553 filed on Sep. 26, 2017, which is a nonprovisional application of U.S. Provisional Application Ser. No. 62/402,152 filed on Sep. 30, 2016, the contents of both of which are incorporated by reference herein.

BACKGROUND

The present disclosure relates to a coordinate measuring device. One set of coordinate measurement devices belongs to a class of instruments that measure the three-dimensional (3D) coordinates of a target point by sending a beam of light to the point. The beam of light may impinge directly on the point or on a retroreflector target in contact with the point. In either case, the instrument determines the coordinates of the target point by measuring a distance and two angles to the target. The distance is measured with a distance-measuring device such as an absolute distance meter or an interferometer. The angles are measured with an angle-measuring device such as an angular encoder. The beam may be steered with a gimbaled mechanism, a galvanometer mechanism, or other mechanism.

A laser tracker is a particular type of coordinate-measuring device that tracks the retroreflector target with one or more beams it emits, which may include light from a laser or non-laser light source. Coordinate-measuring devices closely related to the laser tracker are the time-of-flight (TOF) scanner and the total station. The TOF scanner steps one or more beams of light to points on a surface. It picks up light reflected from the surface and in response determines a distance and two angles to each surface point. A total station is a 3D measuring device most often used in surveying applications. It may be used to measure the coordinates of a diffusely scattering target or a retroreflective target. Hereinafter, the term laser tracker is used in a broad sense to include laser scanners and total stations and to include dimensional measuring devices that emit laser or non-laser light.

In many cases, a laser tracker sends a beam of light to a retroreflector target. A common type of retroreflector target is the spherically mounted retroreflector (SMR), which comprises a cube-corner retroreflector embedded within a metal sphere. The cube-corner retroreflector comprises three mutually perpendicular mirrors. The vertex, which is the common point of intersection of the three mirrors, is located at the center of the sphere. Because of this placement of the cube corner within the sphere, the perpendicular distance from the vertex to any surface of the SMR rests remains constant, even as the SMR is rotated. Consequently, the laser tracker can measure the 3D coordinates of a surface by following the position of an SMR as it is moved over the surface. Stating this another way, the laser tracker needs to measure only three degrees of freedom (one radial distance and two angles) to fully characterize the 3D coordinates of a surface.

One type of laser tracker contains only an interferometer (IFM) without an absolute distance meter (ADM). If an object blocks the path of the laser beam from one of these trackers, the IFM loses its distance reference. The operator must then track the retroreflector to a known location to reset to a reference distance before continuing the measurement. A way around this limitation is to put an ADM in the tracker. The ADM can measure distance in a point-and-shoot manner, as described in more detail below. Some laser trackers contain only an ADM without an interferometer.

A gimbal mechanism within the laser tracker may be used to direct a laser beam from the tracker to the SMR. Part of the light retroreflected by the SMR enters the laser tracker and passes onto a position detector. A control system within the laser tracker uses position of the light on the position detector to adjust the rotation angles of the mechanical axes of the laser tracker to keep the beam of light centered on the SMR. In this way, the tracker is able to follow (track) a moving SMR.

Angle measuring devices such as angular encoders are attached to the mechanical axes of the tracker. The one distance measurement and two angle measurements of the laser tracker are sufficient to completely specify a three-dimensional location of the SMR. In addition, several laser trackers are available or have been proposed for measuring six degrees-of-freedom (six-DOF), rather than the ordinary three degrees-of-freedom.

Although laser trackers are generally suitable for their intended purpose, some limitations still exist in tracker complexity, maintenance, resistance to shock, and identification of target objects. What is needed is a laser tracker having features to overcome these limitations.

SUMMARY

According to an embodiment, a coordinate measuring device is provided. The coordinate measuring device includes a housing and a light source operable to emit a first beam of light. A first motor and a second motor are operable to direct the first beam of light to a first direction, the first direction determined by a first angle of rotation about a first axis and a second angle of rotation about a second axis, the first angle of rotation produced by the first motor and the second angle of rotation produced by the second motor. A first angle measuring device is operable to measure the first angle of rotation and a second angle measuring device operable to measure the second angle of rotation. A distance meter is operable to measure a first distance to a target illuminated by the first beam of light. A first locator camera assembly is affixed to the housing, the first locator camera assembly including a first camera and one or more first flashing lights. A second locator camera assembly is affixed to the housing, the second locator camera assembly including a second camera and one or more second flashing lights. A processor is operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the matching based at least in part on a shape-and-context matching of retroreflector spots in the first image and the second image and on an area-context-matching of background objects in the first image and the second image, the retroreflector spots in the first image produced by illumination of the retroreflectors by the first flashing lights, the retroreflector spots in the second image produced by illumination of the retroreflectors by the second flashing lights, the processor further operable to provide a third image that includes both the background objects and markers indicating the matched retroreflectors.

According to another embodiment. another coordinate measuring device is provided. The coordinate measuring device includes a housing and a light source operable to emit a first beam of light. A first motor and a second motor are operable to direct the first beam of light to a first direction, the first direction determined by a first angle of rotation about a first axis and a second angle of rotation about a second axis, the first angle of rotation produced by the first motor and the second angle of rotation produced by the second motor. A first angle measuring device is operable to measure the first angle of rotation and a second angle measuring device operable to measure the second angle of rotation. A distance meter is operable to measure a first distance to a target illuminated by the first beam of light. A first locator camera assembly is affixed to the housing, the first locator camera assembly including a first camera and one or more first flashing lights having a first infrared wavelength greater than 700 nanometers, the first camera including a first lens and a first photosensitive array, the first camera being corrected for both visible and first infrared wavelengths. A second locator camera assembly is affixed to the housing, the second locator camera assembly including a second camera and one or more second flashing lights having a second infrared wavelength greater than 700 nanometers, the second camera including a second filter, a second lens and a second photosensitive array, the second filter being operable to pass the second infrared wavelength and to block visible wavelengths, the second camera being corrected for the second infrared wavelength. A processor is operable to determine three-dimensional (3D) coordinates of the target based at least in part on the measured first angle of rotation, the measured second angle of rotation, and the measured first distance, the processor further operable to capture background objects in a first image of the first camera and to capture illuminated retroreflectors in a second image of the second camera, the captured illuminated retroreflectors being within a field-of-view of second camera, the processor further operable to provide a third image of both the background objects and the illuminated retroreflectors.

According to another embodiment. another coordinate measuring device is provided. The coordinate measuring device includes a housing and a light source operable to emit a first beam of light. A first motor and a second motor are operable to direct the first beam of light to a first direction, the first direction determined by a first angle of rotation about a first axis and a second angle of rotation about a second axis, the first angle of rotation produced by the first motor and the second angle of rotation produced by the second motor. A first angle measuring device is operable to measure the first angle of rotation and a second angle measuring device operable to measure the second angle of rotation. A distance meter is operable to measure a first distance to a target illuminated by the first beam of light. A first locator camera assembly is affixed to the housing, the first locator camera assembly including a first camera and one or more first flashing lights, the first flashing lights operable at a first infrared wavelength longer than 700 nanometers, the first camera having a first lens and a first photosensitive array, a first separation distance between the first camera and the first photosensitive array being selected to permit a first image to be obtained in focus for the first infrared wavelength. A second locator camera assembly is affixed to the housing, the second locator camera assembly including a second camera and one or more second flashing lights, the second flashing lights operable at a second infrared wavelength longer than 700 nanometers, the second camera having a second lens and a second photosensitive array, a second separation distance between the second camera and the second photosensitive array being selected to permit a second image to be obtained in focus for the visible wavelengths. A processor is operable to determine three-dimensional (3D) coordinates of the target based at least in part on the measured first angle of rotation, the measured second angle of rotation, and the measured first distance, the processor further operable to provide a third image of both the background objects and the illuminated retroreflectors.

According to another embodiment. another coordinate measuring device is provided. The coordinate measuring device includes a housing and a light source operable to emit a first beam of light. A first motor and a second motor are operable to direct the first beam of light to a first direction, the first direction determined by a first angle of rotation about a first axis and a second angle of rotation about a second axis, the first angle of rotation produced by the first motor and the second angle of rotation produced by the second motor. A first angle measuring device is operable to measure the first angle of rotation and a second angle measuring device operable to measure the second angle of rotation. A distance meter is operable to measure a first distance to a target illuminated by the first beam of light. A first locator camera assembly is affixed to the housing, the first locator camera assembly including a first camera and one or more first flashing lights, the first flashing lights operable at a first infrared wavelength longer than 700 nanometers, the first camera having a first lens and a first photosensitive array, the first locator camera having a first field of view. A second locator camera assembly is affixed to the housing, the second locator camera assembly including a second camera and one or more second flashing lights, the second flashing lights operable at a second infrared wavelength longer than 700 nanometers, the second camera having a second lens and a second photosensitive array, the second locator camera having a second field of view smaller than the first field of view by at least a factor of two. A processor is operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the processor further operable to provide a third image that includes both the background objects and the matched retroreflectors.

According to another embodiment. another coordinate measuring device is provided. The coordinate measuring device includes a housing and a light source operable to emit a first beam of light. A first motor and a second motor are operable to direct the first beam of light to a first direction, the first direction determined by a first angle of rotation about a first axis and a second angle of rotation about a second axis, the first angle of rotation produced by the first motor and the second angle of rotation produced by the second motor. A first angle measuring device is operable to measure the first angle of rotation and a second angle measuring device operable to measure the second angle of rotation. A distance meter is operable to measure a first distance to a target illuminated by the first beam of light. A first locator camera assembly is affixed to the housing, the first locator camera assembly including a first camera and one or more first flashing lights, the first flashing lights operable at a first infrared wavelength longer than 700 nanometers, the first camera having a first cover window, a first lens and a first photosensitive array, the first cover window being tilted to a first angle, the first angle being large enough to prevent first ghost beams from reflections of the first cover window from reaching the first photosensitive array. A second locator camera assembly is affixed to the housing, the second locator camera assembly including a second camera and one or more second flashing lights, the second flashing lights operable at a second infrared wavelength longer than 700 nanometers, the second camera having a second cover window, a second lens and a second photosensitive array, the second cover window being tilted to a second angle, the second angle being large enough to prevent second ghost beams from reflections of the second cover window from reaching the second photosensitive array. A processor is operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the processor further operable to provide a third image that includes both the background objects and the matched retroreflectors.

BRIEF DESCRIPTION OF THE DRAWINGS

Referring now to the drawings, exemplary embodiments are shown which should not be construed to be limiting regarding the entire scope of the disclosure, and wherein the elements are numbered alike in several FIGURES:

FIG. 2A is an isometric view of an external power supply in accordance with an embodiment;

FIGS. 2B-2D are front, left-side, and right-side views, respectively, of a cable according to an embodiment;

FIGS. 2E-2F are front and left-side views, respectively, of a cable according to an embodiment;

FIG. 3C is an isometric view of the battery pack attached to an industrial tripod according to an embodiment;

FIGS. 5A-5O are views of six cables used in conjunction with a laser tracker according to an embodiment;

FIGS. 6A, 6B, 6C, 6D, 6E are a top view, a front view, a detail, a first perspective view, and a second perspective view, respectively, according to an embodiment;

FIGS. 6F, 6G are a sectional view and a detail, respectively, according to an embodiment;

FIG. 9A is an isometric view of a plenum assembly according to an embodiment;

FIG. 9B is an exploded view of the plenum assembly according to an embodiment;

FIGS. 11A, 11B, 11C, 11D are isometric, front, section, and exploded views, respectively, of a shock absorber according to an embodiment;

FIGS. 16A, 16B are front and section views, respectively, of the payload assembly according to an embodiment;

FIGS. 17A, 17B, 17C are isometric, rear, and section views of a launch/collimator assembly according to an embodiment;

FIG. 18 is an exploded view of the central optics assembly 400 according to an embodiment;

FIGS. 21A, 21B are block diagrams of elements within a polarization-dependent Faraday isolator and a polarization-independent Faraday isolator, respectively, according to embodiments;

FIGS. 24A, 24B are perspective and exploded views of a six-DOF launch attached to an optics body according to an embodiment.

DETAILED DESCRIPTION

A laser tracker 10 is shown in FIG. 1. Although element 10 is referred to as a laser tracker, it may be more generally referred to as a 3D coordinate measuring device. As explained in the introduction, the term laser tracker is here used to refer to laser tracker in a general sense and may include a TOF scanner, a total station or other related device. As further explained herein above, a laser tracker does not necessarily launch light from a laser but instead may launch light from a superluminescent diode, a light emitting diode (LED), or other light source. Likewise if the element 10 is a TOF scanner that measures distance and two angles to a point on an arbitrary surface, the TOF scanner may emit a laser beam, light from a superluminescent diode, an LED, or any other light source.

Figure 1A:
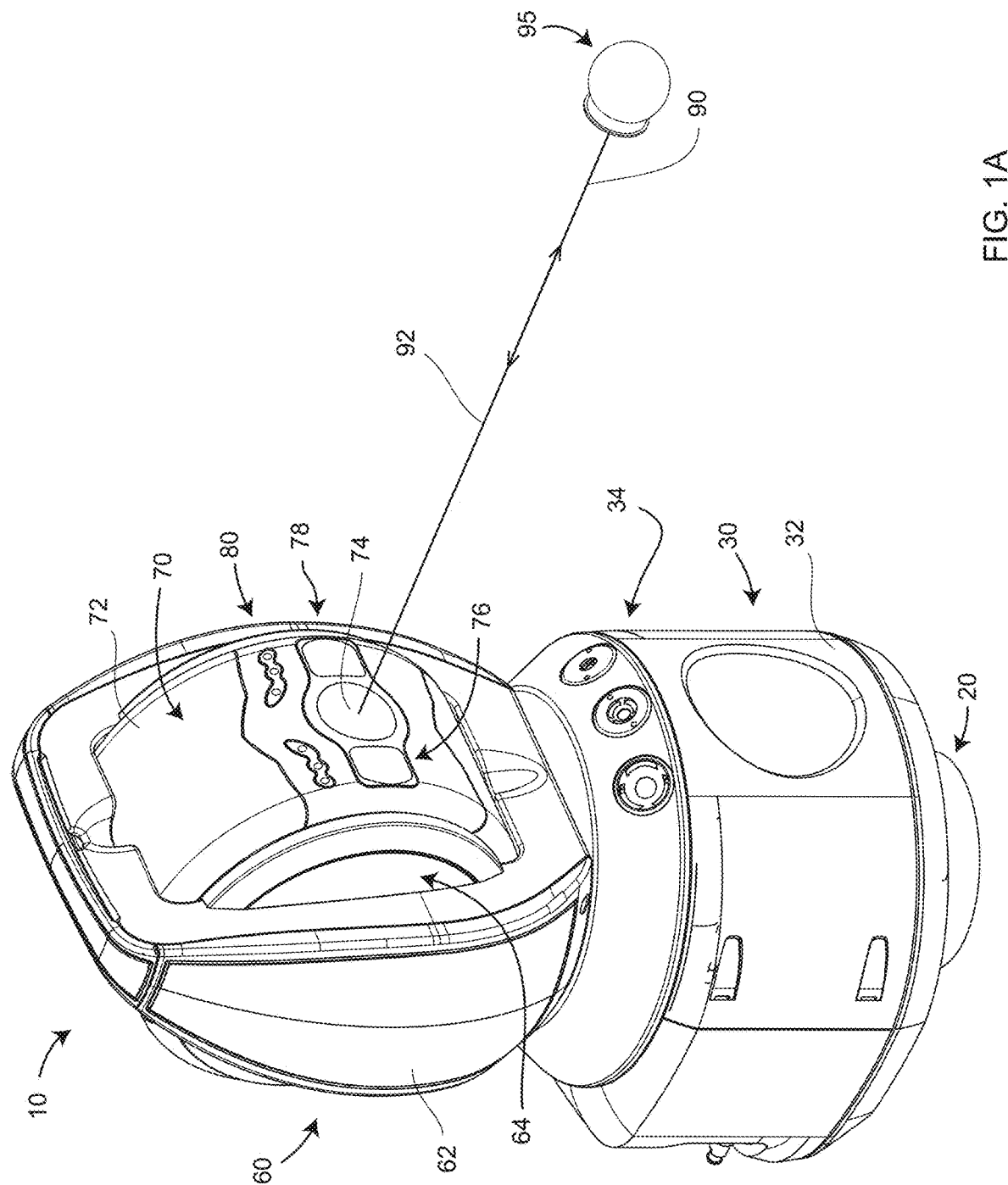
FIG. 1A is an isometric view of a laser tracker and a retroreflector target in accordance with an embodiment.
Figure 1B:
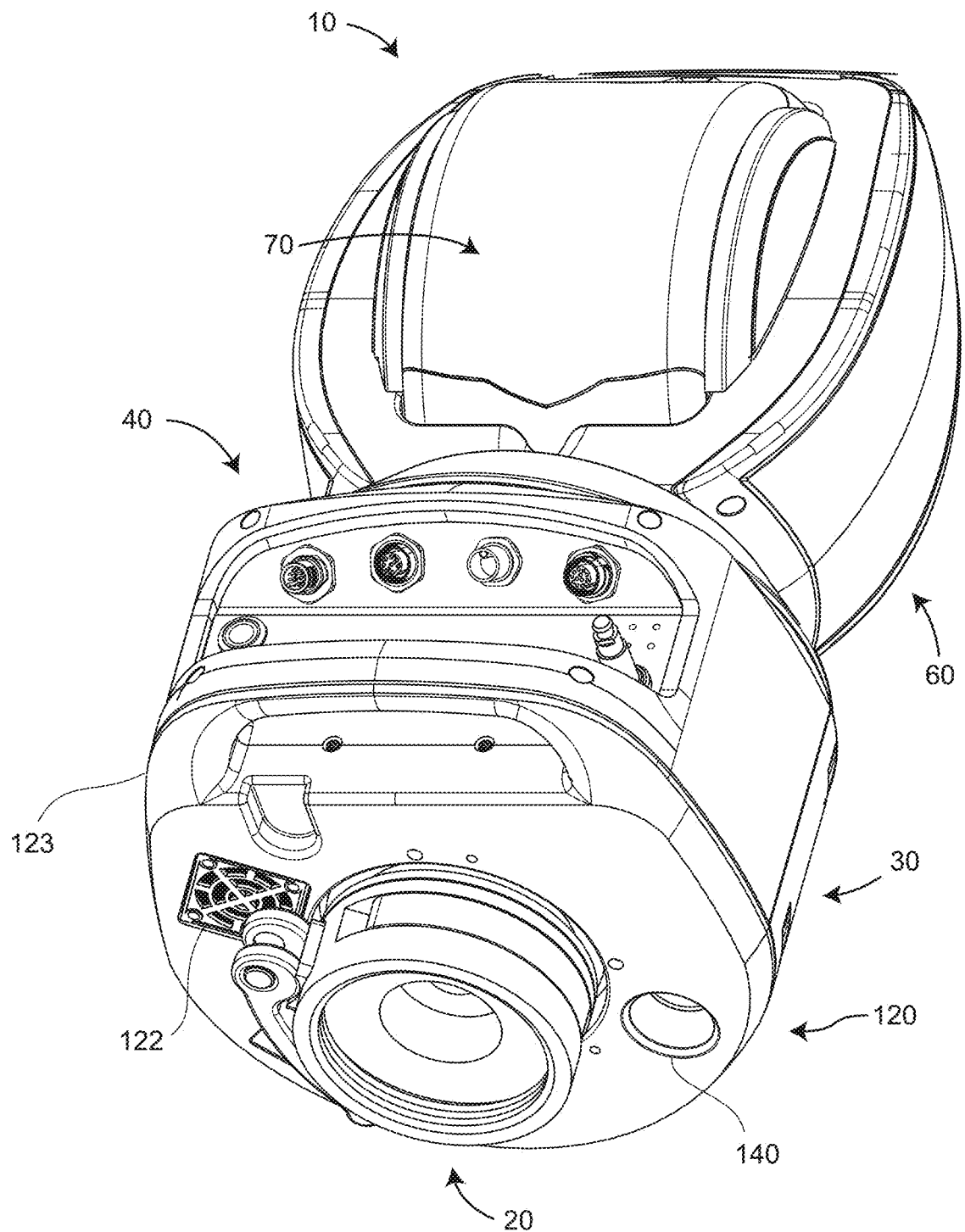
FIG. 1B is an isometric view of a laser tracker in accordance with an embodiment.
Figure 1C:
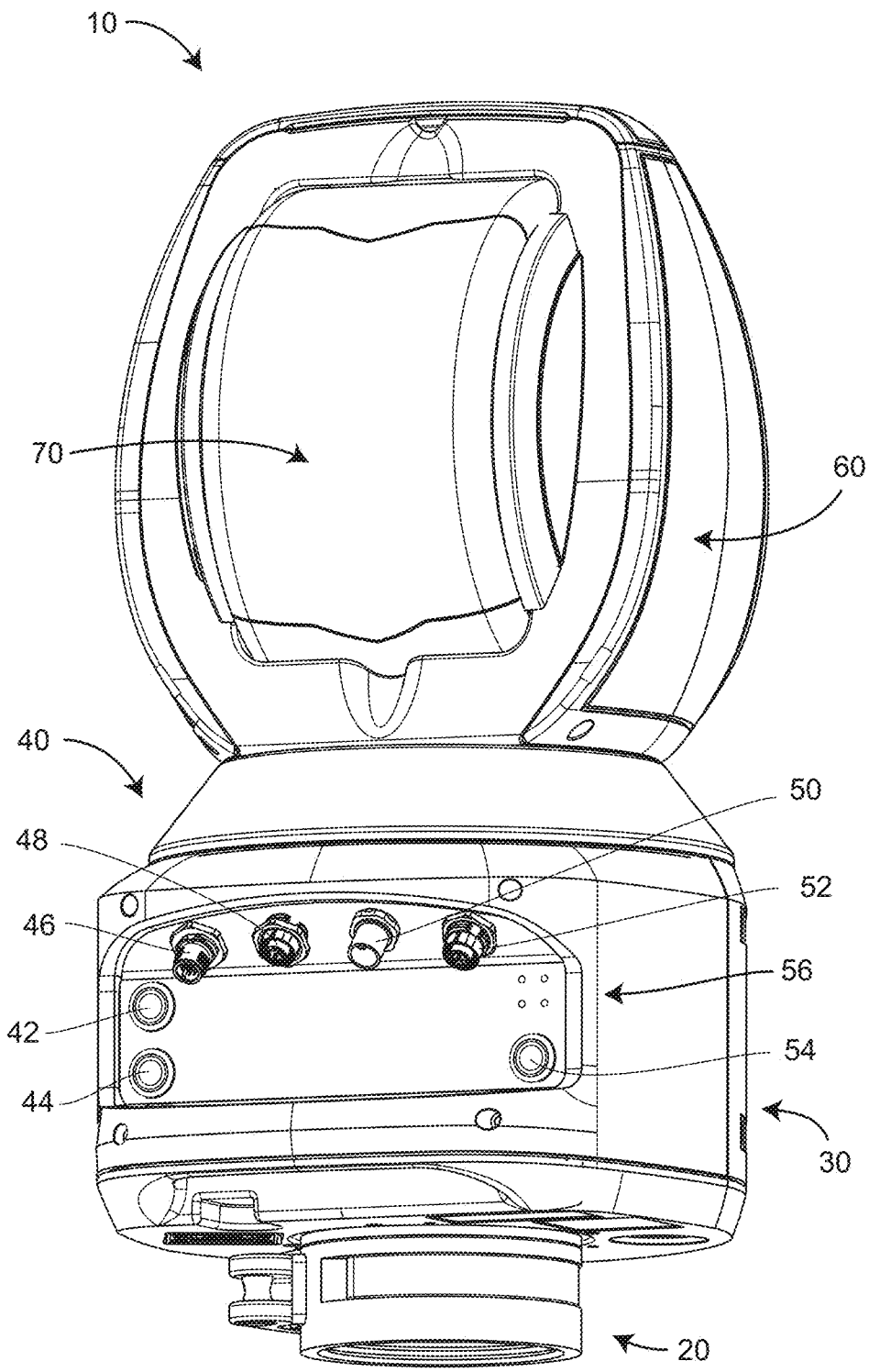
FIG. 1C is an isometric view of a laser tracker in accordance with an embodiment.

The laser tracker 10 in FIGS. 1A, 1B, 1C sends outgoing light 90 through an exit aperture 74 to a retroreflector 95, which returns the light along a parallel path as returning light 92, which passes a second time through the exit aperture 74. The tracker includes a base assembly 30, a yoke assembly 60, and a payload assembly 70. An outer portion of the payload assembly 70 includes payload assembly covers 72, a first locator camera 76, a second locator camera 78, and payload indicator lights 80. In an embodiment, the indicator lights may shine green to indicate found target, red to indicate measuring, and blue or yellow for user-definable or six-DOF indications. An outer portion of the yoke assembly 60 includes yoke-assembly covers 62 and yoke indicator lights 64. Yoke indicator lights may advantageously be seen at large distances from the tracker. An outer portion of the base assembly 30 includes base-assembly covers 32 and magnetic home-position nests 34 operable to hold SMRs of different diameters. In an embodiment, three magnetic home-position nests 34 accept SMRs having diameters of 1.5 inches, 0.875 inch, and 0.5 inch. A mandrel 20 may optionally be attached to a lower portion of the laser tracker 10.

The base assembly 30 includes a base pan 120, which includes a handle 122, an air intake 140, and a fan 122 that serves as an air exhaust. In an embodiment, the base assembly 30 further includes an interface panel 40 having a number of buttons, ports, and indicator lights. Buttons include an on-off button 42 and a Wi-Fi (IEEE 802.11) button 44. In an embodiment, indicator lights 56 lights indicate laser power, system health, tracker Ethernet (IEEE 802.3) activity, or six-DOF Ethernet activity.

In an embodiment, a temperature-sensor port 54 may accept an air temperature sensor cable 1200 (FIGS. 5A, 5B) or a material temperature sensor cable 1210 (FIGS. 5D, 5D). The air temperature sensor cable 1200 attaches to the tracker temperature sensor port 54 with the connector 1202 and senses air temperature with a cabled air-temperature sensor 1204. The material temperature sensor cable 1210 attaches to the tracker temperature sensor port 54 with the connector 1212 and senses material temperature with a cabled material temperature sensor 1214.

In an embodiment, the interface panel 40 includes a power-input port 50 that receives power from a cable 1020 (FIGS. 2B, 2C, 2D), which attaches with connector 1024 to the power-input port 50. The cable 1020 further attaches a connector 1022 to a second connector 1004 of an external power supply 1000 (FIG. 2A). A cable 1010 attaches with connector 1012 to a first connector 1002 of the external power supply 1000. The cable 1010 attaches to power mains with a country-specific power-mains plug 1014.

In an embodiment, a port 48 provides an Ethernet connection for bidirectional communication between a computing device and the laser tracker 10. In an embodiment, a cable 1250 (FIGS. 5N, 5O) attaches with a connector 1252 to the Ethernet port 48, and it attaches with an Ethernet connector 1254 to the computing device. In an embodiment, the Ethernet port 48 supports Gigabit Ethernet.

Figure 4A:
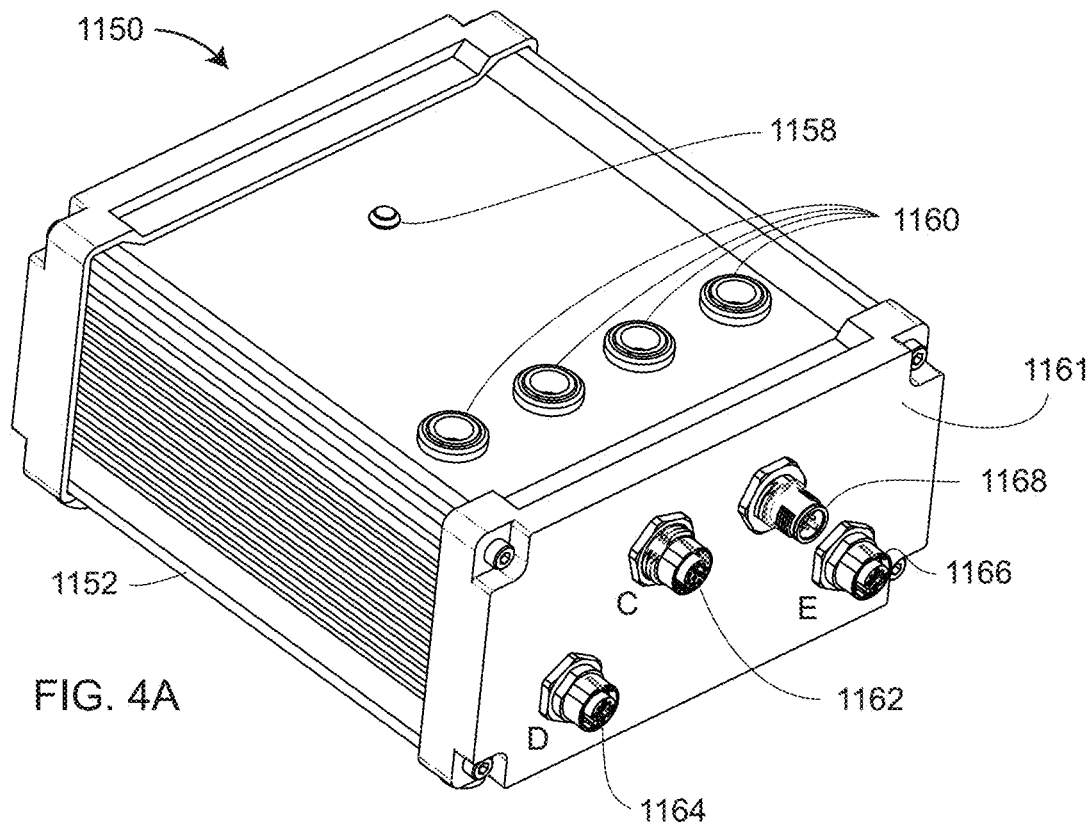
FIGS. 4A-4B are front and rear isometric views of an auxiliary box according to an embodiment.
Figure 4B:
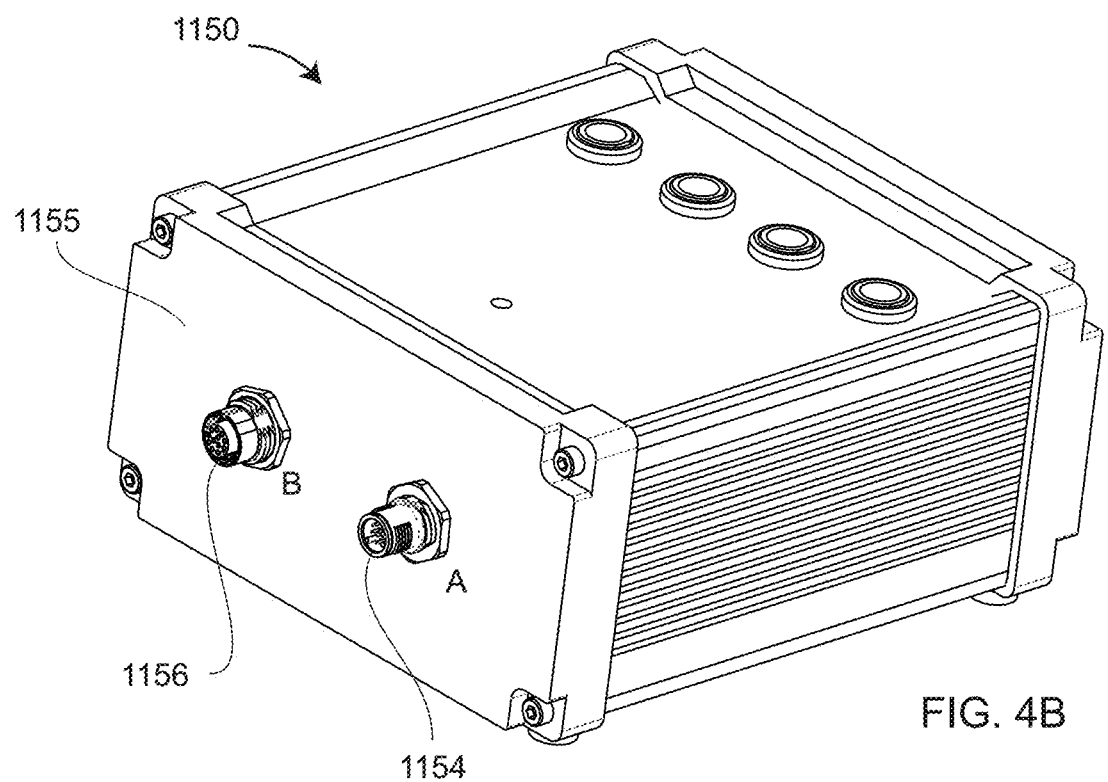

In an embodiment, a tracker B port 52 provides auxiliary interface signals to a B port 1156 of an auxiliary box 1150 (FIG. 4B). The auxiliary interface signals, which include power to the B port 1156, may be delivered by a cable 1230 (FIGS. 5H, 5I, 5J), which attaches with connector 1232 to the tracker B port 52 and with connector 1234 to the auxiliary box B port 1156. A user trigger signal may be delivered by a trigger cable 1240 (FIGS. 5K, 5L), which attaches with connector 1242 to a port 1168 of the auxiliary box 1150. The trigger cable 1240 attaches at the other end 1244 to a user trigger device.

In an embodiment, a tracker A port 46 provides a 24 VDC power signal, a synchronization (sync) signal, and a time stamp to a port 928 of a six-DOF probe 900 (FIGS. 6A-6G). The six-DOF probe 900 returns six-DOF signals to the tracker A port 46. In an embodiment, the laser tracker 10 and the six-DOF probe 900 communicate bi-directionally over 100-Mb Ethernet between the A port 46 and the port 928. In an alternative embodiment, the signals from the tracker A port 46 are sent first to the A port 1154 of the auxiliary box 1150 before being sent on to the port 928 of the six-DOF probe 900.

In an embodiment, the auxiliary box 1150 includes a front panel 1161 and a rear panel 1155. The front panel 1161 includes a D port 1164 and an E port 1166, each supporting industrial Ethernet. In an embodiment, a cable 1220 attaches to the D port 1164 or the E port 1166 with the connector 1222 of the cable 1220 and to an industrial Ethernet component through the connector 1224. Industrial Ethernet is Ethernet having protocols that provide determinism and real-time control. Examples of protocols for industrial Ethernet include EtherCAT, EtherNet/IP, PROFINET, POWERLINK, SERCOS III, CC-Link IE, and Modbus/TCP.

Figure 3A:
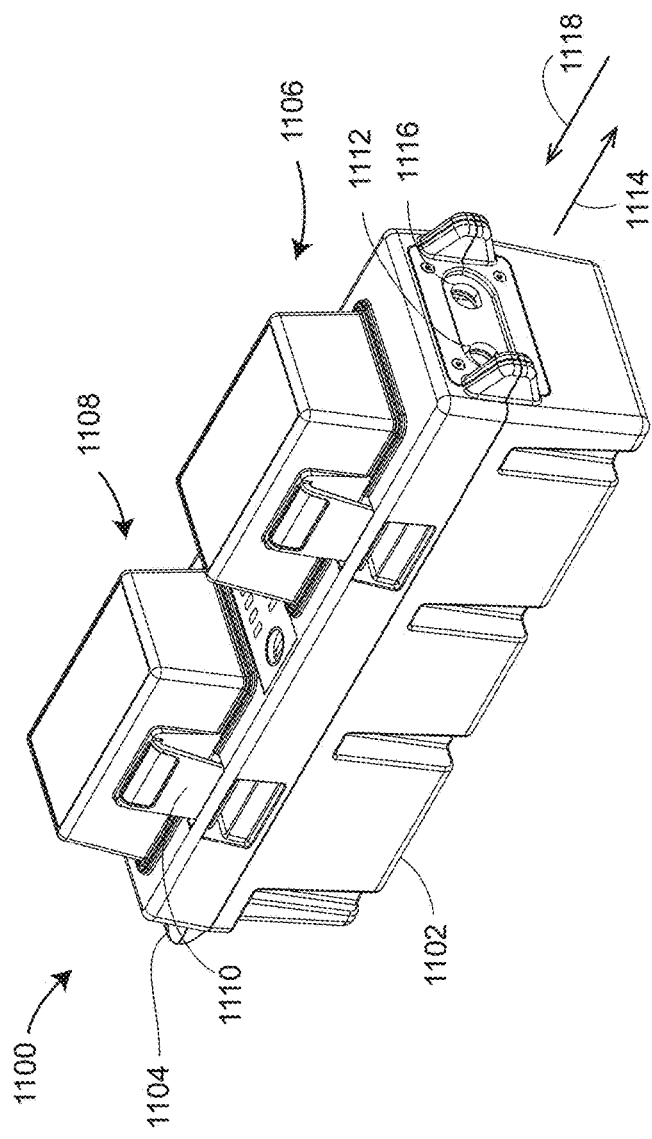
FIGS. 3A-3B are isometric and top views, respectively, of a battery pack according to an embodiment.
Figure 3B:
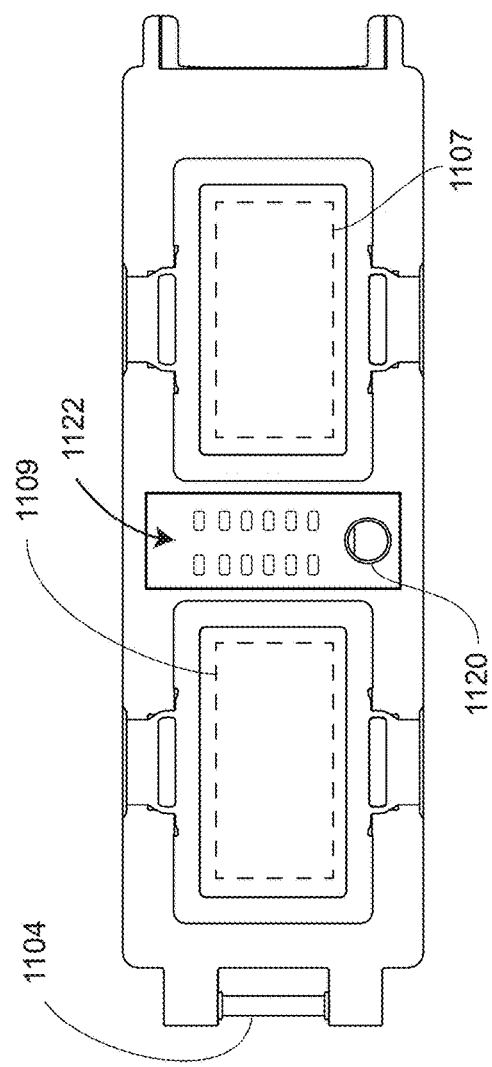

In an embodiment illustrated in FIGS. 3A, 3B, a battery pack 1100 is used with the laser tracker 10. In an embodiment, the battery pack 1100 includes a battery enclosure 1102, a battery handle 1104, a first battery cover 1106, a second battery cover 1108, battery latches 1110, and input port 1116, and an output port 1112. Also included in the battery pack are a first battery unit 1107 and a second battery unit 1109 held inside the battery enclosure 1102. A top side of the battery enclosure includes an on/off button 1120 and battery indicator lights 1122. The battery indicator lights 1122 show the amount of power left in the batteries of the battery pack. In an embodiment, the power from the two batteries is depleted in parallel. In another embodiment, the power form the two batteries is depleted one at a time. In an embodiment, the batteries may be hot-swapped without first powering down the power supply unit. This enables power to be continuously supplied to the laser tracker 10 even if the batteries have to be replaced with freshly charged battery units.

In one mode of operation, the battery pack 1100 is used stand-alone without being connected to the external power supply 1000. In this mode of operation, the battery pack 1100 provides DC power through the output port 1112 to the laser tracker 10. In another mode of operation, the battery pack 1100 receives DC power from the external power supply 1000. In this case, DC power 1118 is provided from the external power supply 1000 to the input port 1116 and passes through the output port 1112 to provide the DC out power 1114. In an embodiment shown in FIG. 3C, the battery handle 1104 of the battery pack 1100 is hung from a tripod hook 1134 of an industrial tripod 1130. A laser tracker 10 is coupled to the industrial tripod 1130 through a threaded mount 1132. Hanging the battery pack 1100 from the industrial tripod 1130 provides an advantage in reducing the number of components in a limited work area.

Figure 7:
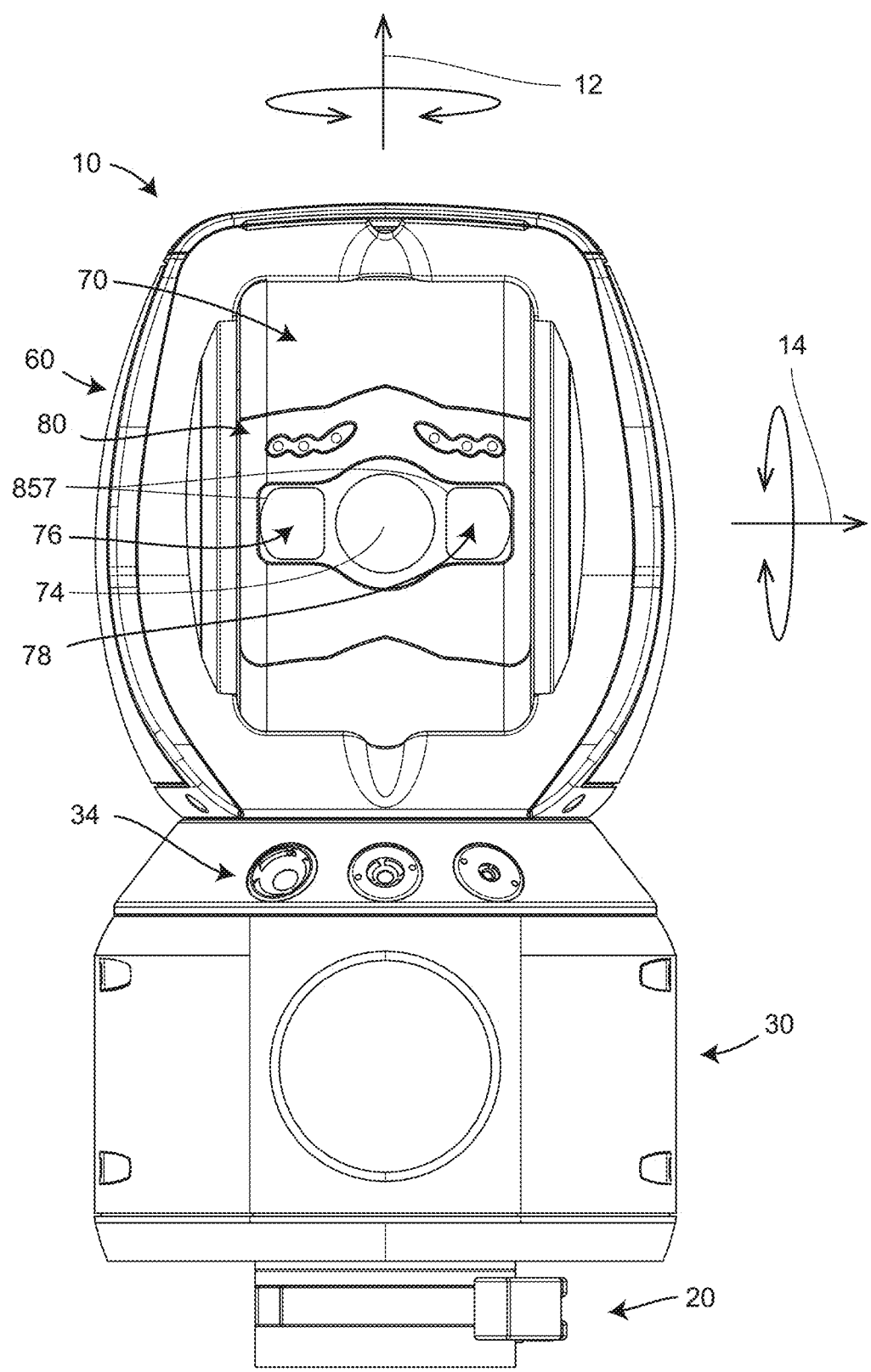
FIG. 7 is a front view of a laser tracker according to an embodiment.

FIG. 7 shows a front view of the laser tracker 10. The base assembly 30 is ordinarily stationary with respect to a work area, for example, being mounted on an instrument stand or an industrial tripod, possibly with a mandrel 20 placed between the laser tracker 10 and the mount 1132. The yoke assembly 60 rotates about an azimuth axis 12, sometimes referred to as a standing axis or a vertical axis, although it should be appreciated that the laser tracker 10 may, in general, be positioned upside down or be rotated to an arbitrary angle with respect to a floor. The payload assembly 70 rotates about a zenith axis 14, sometimes referred to as a transit axis or a horizontal axis.

Figure 8B:
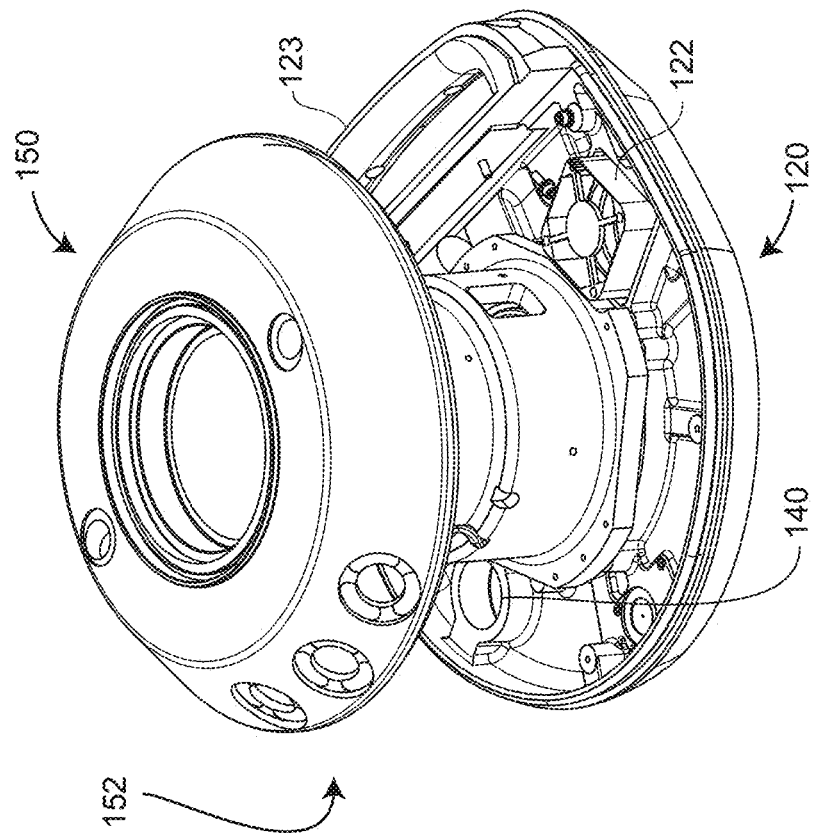
FIGS. 8A, 8B are isometric views of a base-assembly structure according to an embodiment.
Figure 8A:
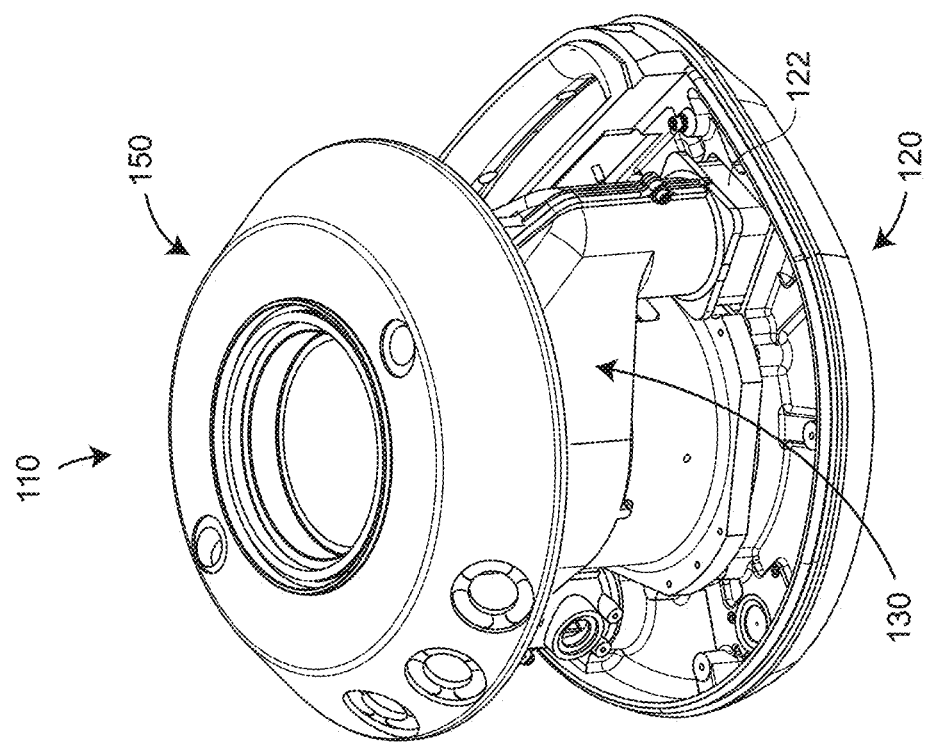

FIG. 8A shows elements of a base-assembly structure 110, which includes a post 150, a plenum 130, a base pan 120, and a fan 122 that sits between the base pan 120 and the plenum assembly 130. The base pan 120 and its integrated handle 122 is also seen in FIG. 1B. FIG. 8B shows the base-assembly structure 110 with the plenum assembly 130 removed. With the plenum assembly 130 removed, the air intake 140 and the fan 122 are more clearly shown. The SMR cutouts 152 accept additional components to become the magnetic home-position nests 34 of FIG. 1A.

FIGS. 9A, 9B are isometric and exploded views, respectively, of the plenum assembly 130. In an embodiment, room-temperature air is pulled in through the air intake 140 and is expelled through the air exhaust 142 before reaching the fan 122, which is attached to the fan flange 144. As room temperature air is pulled into the tracker, its temperature is measured with an air temperature sensor placed in the air flow. The air temperature sensor is inserted into the plenum assembly 130 through the plenum temperature sensor port 146. This air temperature sensor may be used along with a measured pressure and a measure relative humidity to determine an index of refraction of the air. Such a calculation may be done using an Edlin equation or a Ciddor equation, as is known in the art. Alternatively, the air temperature may be determined using an external air temperature sensor 1200 as shown in FIGS. 5A, 5B. Such an external air temperature sensor 1200 may be attached to the temperature sensor port 54 or to one of the temperature sensor ports 1160 of the auxiliary box 1150.

The relatively cool air entering the air intake 140 removes heat from the electrical components within the tracker base assembly 30 and expels heated air through the air exhaust 142. By keeping the air drawn in from the outside enclosed within the plenum assembly, electrical components may be cooled without the possibility of contaminating other portions of the laser tracker with dirt or moisture drawn in from outside the tracker. In an embodiment, heat sinks 136 are attached on the inside of the left-half plenum frame 132 and the right-half plenum frame 134 at locations directly opposite hot electrical circuit components on the outside of the plenum frame. In an embodiment, electrical circuit components are attached to the outside of the plenum frame with thermal adhesive to maximize heat transfer into the circulating air within the plenum assembly 130. In an embodiment, plenum gaskets 138 are used to seal the left-half plenum frame 132 to the right-half plenum frame 134.

Figure 10A:
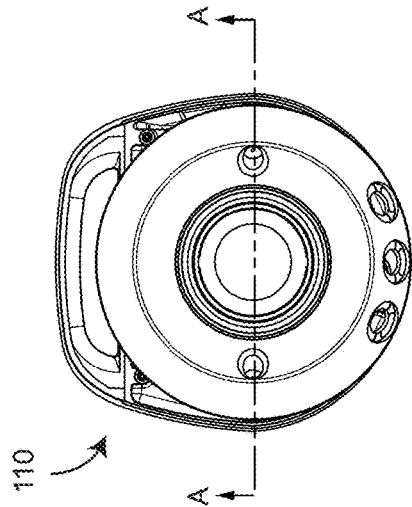
FIGS. 10A, 10B are top and section views, respectively of the base-assembly structure according to an embodiment.
Figure 10C:
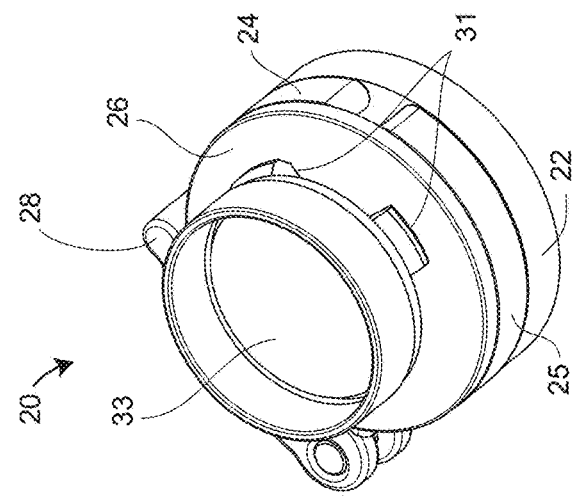
FIG. 10C is an isometric view of a mandrel according to an embodiment.
Figure 10B:
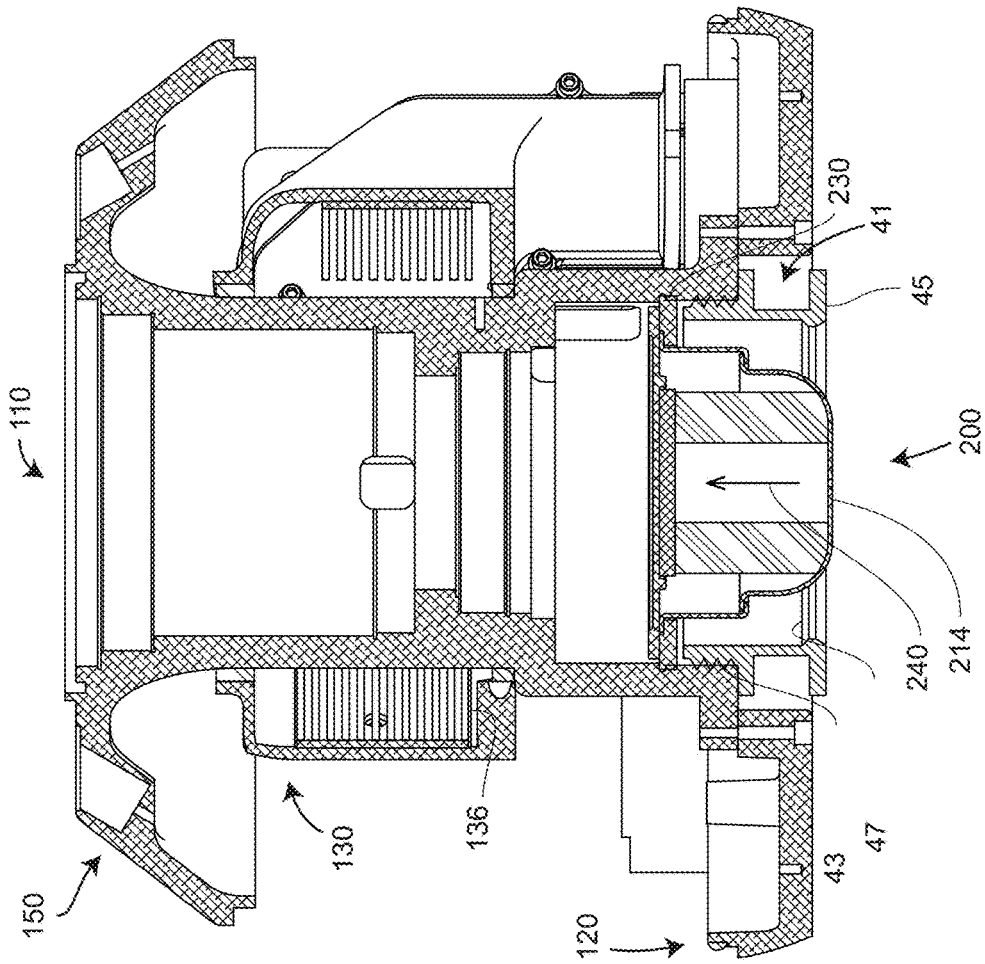

FIGS. 10A, 10B show top and cross-sectional views of the base-assembly structure 110. The post 150, the plenum assembly 130, the heat sinks 136, and the base pan 120 are shown in the cross-sectional view. FIG. 10B also shows a shock absorber 200 and a mandrel receptacle 40. The mandrel receptacle is not a part of the laser tracker 10 but may be attached to the post 150 by receptacle threads 42.

FIGS. 11A, 11B, 11C, 11D are isometric, front, sectional, and exploded views, respectively, of the shock absorber 200. A cap 202 provides a feature to accept a preload spacer 204 adjacent to a damper 206 of compressible material. A stationary cover 220 having an upper lip 222 and a lower lip 224 fits over a bell 210 having a retractable surface 214 and a bell lip 212. Screws 232 attach a threaded cover 230 onto the cap 202 to hold the bell 210 and stationary cover 220 in place over the damper 206. The threaded cover screws 230 into the post 150 to affix the shock absorber to the post 150 as shown in FIG. 10B.

With the mandrel receptacle 40 screwed into the post 150, a mandrel 20 may be coupled to the laser tracker 10. Many types of mandrels and receptacles may be designed for us with the laser tracker 10. A simple way to mount a laser tracker 10 on a stand or a tripod is to attach the laser tracker 10 directly to a threaded mount 1132 as shown in FIG. 3C. In this case, to rotate an entire tracker assembly, including the base assembly 30, about a vertical axis, the entire stand or tripod must be rotated. A mandrel provides a way to rotate the entire tracker assembly 10 without rotating the stand. In the case of the particular mandrel 20 shown in FIG. 10C, mandrel inner threads shown in FIG. 1B are screwed onto a threaded mount 1132 (FIG. 3C). A first wing 24 and second wing 25 may assist in tightening or loosening the mandrel on the threaded mount 1132. A laser tracker 10 placed on the mandrel with the latch 28 opened is enabled to seat within the mandrel receptacle 40 so that the flat mandrel contact surface 26 is brought into contact with the lower flat contact surface 44 of the mandrel receptacle 40. When the latch 28 is closed, one or more of the teeth 30 extends outward to make contact with a tooth contact surface 46, thereby locking the mandrel 20 to the post 150. There are many alternative methods of locking a mandrel to a mandrel receptacle beside the method described here.

Before the mandrel 20 is locked onto the post 150, while the mandrel 20 is pushed into the mandrel receptacle 40, the mandrel 20 may suddenly drop a several millimeters onto the mandrel 20, thereby exposing the laser tracker 10 to a mechanical shock. To minimize the potential of such a shock to the laser tracker 10, the shock absorber 200 may be integrated into the post 150. When the laser tracker 10 begins to drop onto the mandrel 20, the mandrel pressing surface 32 contacts the retractable surface 214, thereby causing a compression of the damper 206 in the direction of compression 240.

In an embodiment, a coordinate measuring device such as a laser tracker 10 includes a housing, which is a structural support of the coordinate measuring device. For example, in the laser tracker 10, the housing is post 150 or the post 150 when combined with the mandrel receptacle 40. The shock-absorber assembly 200 is coupled to a lower portion of the housing 150. The shock-absorber assembly reduces mechanical shock to the coordinate measuring device 10 when the coordinate measuring device is brought into contact with an external element (for example, the industrial tripod 1130) that supports the housing.

Figure 12:
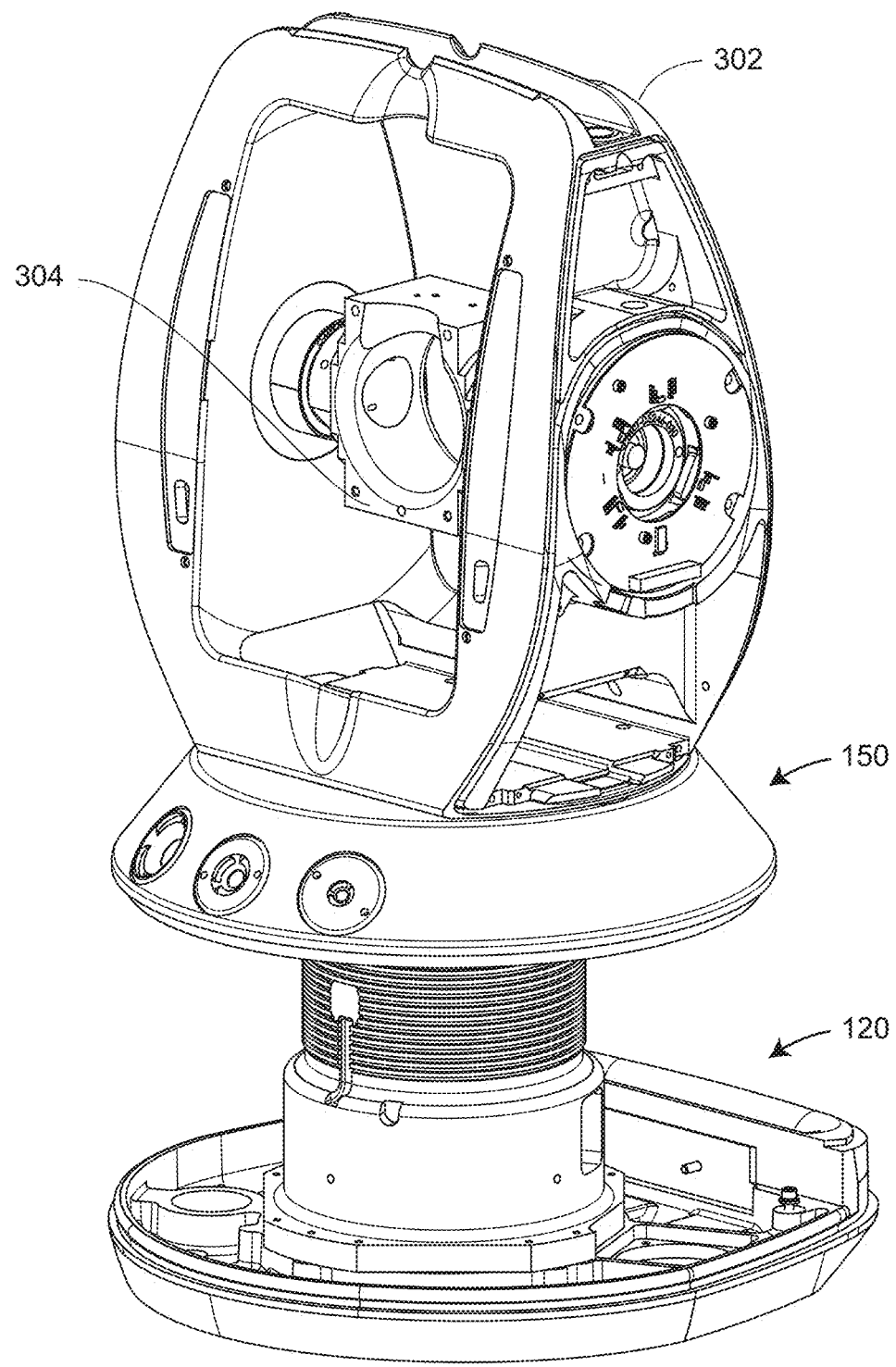
FIG. 12 is a isometric view of structural elements of the laser tracker according to an embodiment.
Figure 13A:
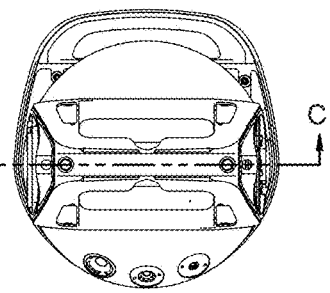
FIGS. 13A, 13B are front and sectional views of laser-tracker structural elements according to an embodiment.
Figure 13B:
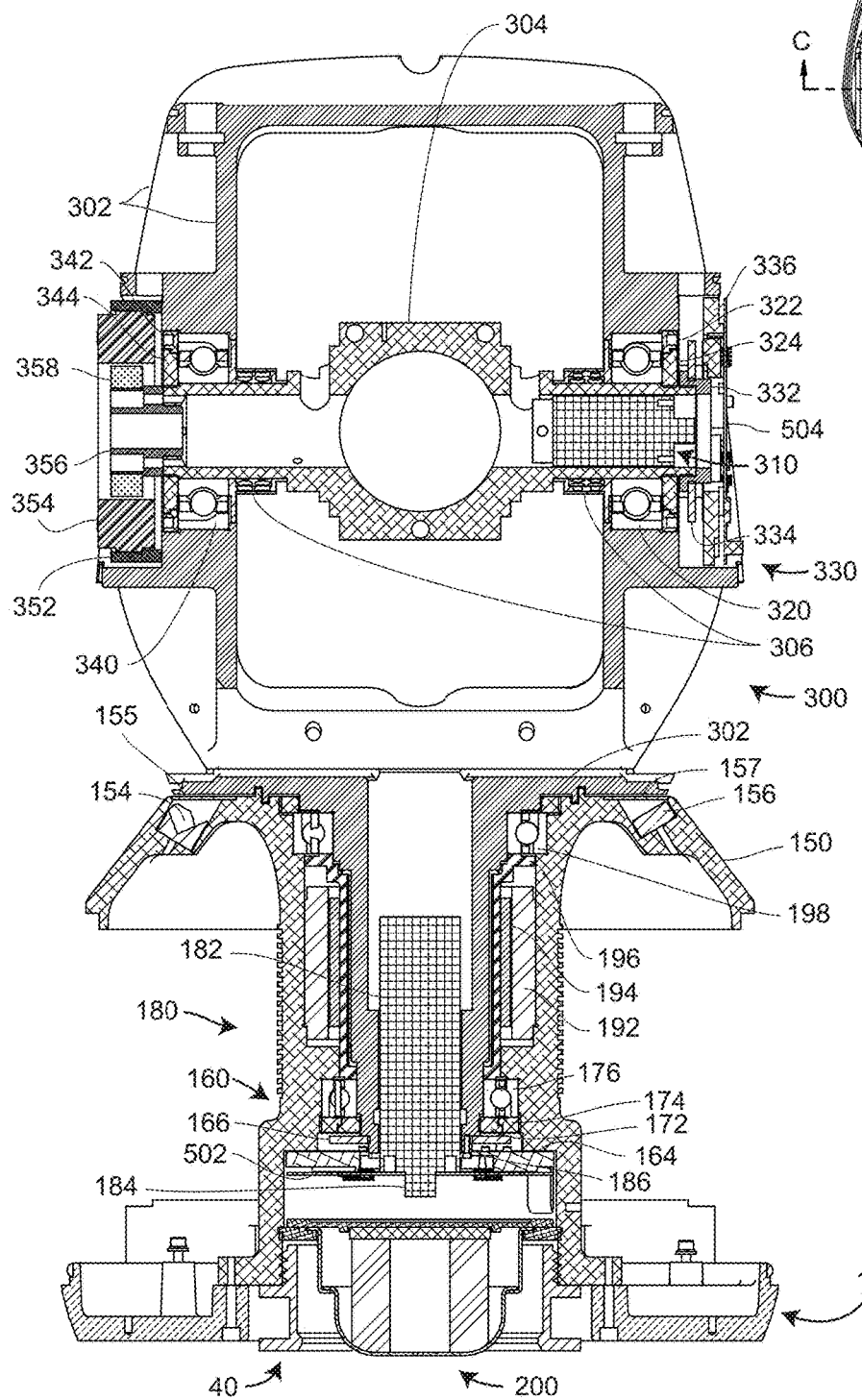
Figure 14:
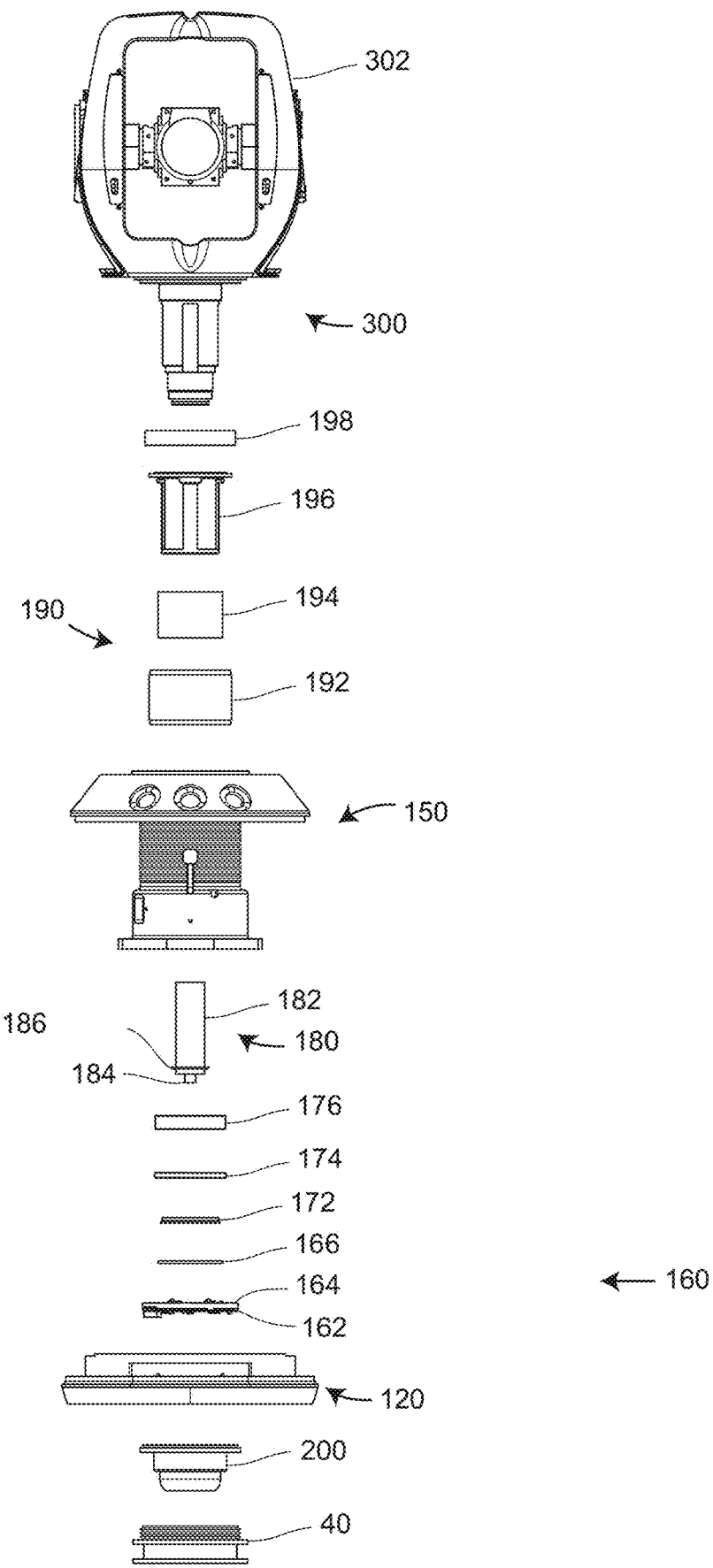
FIG. 14 is an exploded view of structural elements according to an embodiment.

FIG. 12 is an isometric view of a yoke frame 302 and a zenith shaft 304 attached to the post 150 and base pan 120. FIG. 13A is a top view of the yoke frame 302, zenith shaft 304, post 150, and base pan 120. FIG. 13B is a cross section view of these same components, and further includes some components internal to these structural components. In an embodiment, the yoke frame 302 is a monolithic element of a metal, cast and then machined. FIG. 14 is an exploded view of elements in FIG. 13B. In an embodiment, a yoke-assembly structure 300 includes the yoke frame 302. The yoke-assembly structure 300 rotates within the post 150 about a lower azimuth bearing 176 and an upper azimuth bearing 198, the two azimuth bearings separated by a bearing spacer 196. The lower azimuth bearing 176 is held in place with a bearing retaining ring 174 and an azimuth-bearing spindle nut 172. In an embodiment, an azimuth rotor 194 is affixed to the bearing spacer 196. The azimuth rotor 194, which in an embodiment includes permanent magnets, rotates in response to changing electromagnetic fields produced by an azimuth stator 192. Hence the azimuth rotor 194 and the azimuth stator 192 are elements of an azimuth motor that rotates the yoke frame 302 about the azimuth axis 12.

An azimuth encoder disk 166 is affixed to the yoke frame 302 and rotates with the yoke frame 302. A read-head circuit board 162 attaches to an alignment plate 164 that is affixed to the post 150. The read-head circuit board 162 includes one or more read-heads configured to read light reflected off fine markings evenly spaced around a circumference of the azimuth encoder disk 166. Electronic processing within the read-head circuit board 162 enables determination of an azimuth angle of rotation about the azimuth axis 12. An azimuth-encoder pack 160 includes the read-head circuit board 162, the alignment plate 164, and the azimuth encoder disk 166.

An azimuth slip ring 180 is mounted within an interior portion of the yoke frame 302. The azimuth slip ring 180 includes a slip-ring housing 182, a slip-ring shaft 184, and a slip-ring collar 186, which screws onto the yoke frame 302. A lower collection of electrical wires feeds into the slip-ring shaft 184, and an upper collection of electrical wires feed out of the slip-ring housing 182. Electrical contacts internal to the azimuth slip ring 180 cause electrical continuity to be maintained as the housing rotates relative to the shaft. Electrical power and electrical signals passing through the lower collection of electrical wires passes through to the upper collection of electrical wires and into electrical windings that create electromagnetic fields in the azimuth stator 192. Signals from the read-head circuit board 162 pass directly to circuit boards in the base assembly 30 for processing to determine the azimuth angle of rotation about the azimuth axis 12.

In an embodiment, the post 150 includes cutout regions providing an on-tracker retroreflector 154 and an on-tracker mirror 156. These are covered by thin glass windows 155, 157, respectively. In an embodiment, the on-tracker retroreflector 154 and on-tracker mirror 156 are each measured in a front-sight mode and a back-sight mode, which enables extraction of compensation parameters. Methods for determining such parameters are described in U.S. Pat. No. 7,327,446 ('446), the contents of which are incorporated by reference. A front-sight measurement is a 3D measurement performed in a front-sight mode, which is a usual mode of operation of the laser tracker 10. A back-sight measurement is a 3D measurement performed in a back-sight mode, which is a mode obtained by starting with the tracker in the front-sight mode, rotating the yoke frame by 180 degrees about the azimuth axis and then rotating the zenith axis to point back and lock onto the retroreflector or mirror target. In an ideal tracker, the pointing direction in azimuth and zenith angles will be the same in the front-sight and back-sight modes. Any discrepancy in the pointing direction is indicative of an error, which can be corrected with a compensation parameter, as described in '446.

Figure 15:
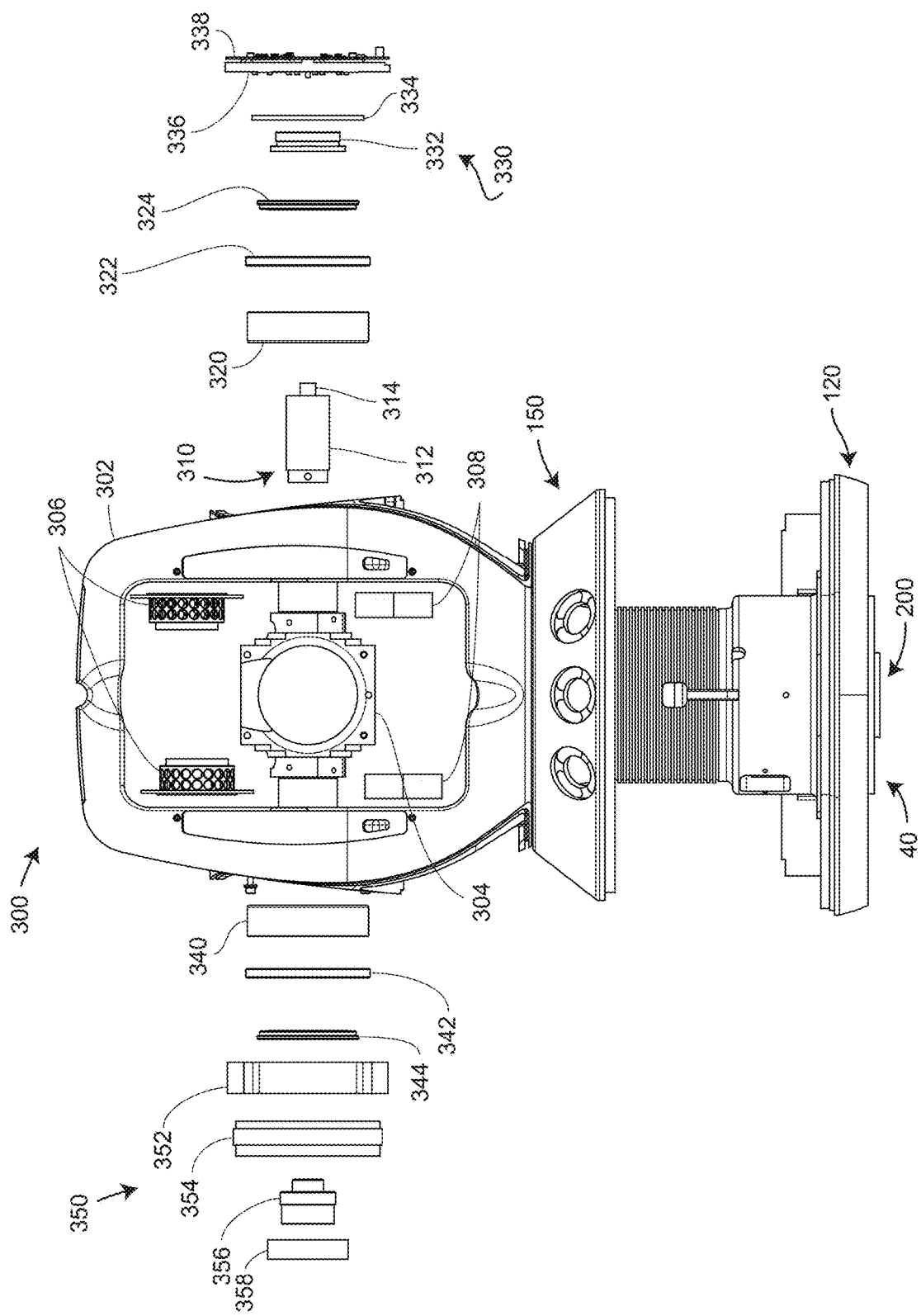
FIG. 15 is an exploded view of elements with the yoke assembly structure according to an embodiment.

The zenith shaft 304 is affixed to the yoke frame 302 as shown in the cross-section view of FIG. 13B and the exploded view of FIG. 15. In an embodiment, the zenith shaft 304 rotates within the yoke frame 302 about zenith bearings 320, 340. In an embodiment, the zenith bearings 320, 340 are spaced by zenith bearing spacers 306, over which are placed spacer gaskets 308.

On one side of the zenith shaft 304, the zenith bearings 320, 340 are held in place with a bearing retaining ring 342 and a bearing spindle nut 344. A rotor hub 356 attached to this side of the zenith shaft 304 provides support for a zenith rotor 358, which includes permanent magnet elements. A stator mount 352 attached to the yoke frame 302 provides support for a zenith stator 354, which includes electrical windings operable to produce electric fields timed to produce rotation of the zenith rotor 358. The zenith motor 350 includes the rotor hub 356, the zenith rotor 358, the stator mount 352, and the zenith stator 354.

In an embodiment, zenith encoder elements are positioned on a side of the zenith shaft opposite that of the zenith motor 350. On this side, the zenith bearing 320 is held in place with a bearing retaining ring 322 and a bearing spindle nut 324. An encoder disk 334 affixed to an encoder-disk mount 332 rotates with the zenith shaft 304. An encoder board 338 affixed to an encoder-board mount 336 is fixed with respect to the yoke frame 302. A zenith-encoder pack 330, which includes the encoder-disk mount 332, the encoder disk 334, the encoder-board mount 336, and the encoder board 338, enables determination of the zenith angle of rotation about the zenith axis 14.

In an embodiment, a zenith slip ring 310 is positioned within the zenith shaft 304, with the zenith slip-ring shaft 314 fixed with respect to the yoke frame 302 and the zenith slip-ring housing 312 fixed with respect to the zenith shaft 304. An incoming collection of electrical wires feeds into the slip-ring shaft 314, and an outgoing collection of electrical wires feeds out of the slip-ring housing 312. Electrical contacts internal to the zenith slip ring 310 cause electrical continuity to be maintained as the housing rotates relative to the shaft. Electrical power and electrical signals pass from the incoming collection of electrical wires and through to the outgoing collection of electrical wires and into electrical windings that create electromagnetic fields in the zenith stator 354.

FIG. 16A is a front view of the payload assembly 70 and an upper portion of the yoke assembly 60. FIG. 16B is a cross-sectional view D-D showing optical elements within the payload assembly 70. Optical elements placed mainly along a central portion of the payload assembly 70 are referred to as a central-optics assembly 400, which includes a launch/collimator assembly 410 and a position-detector assembly 460. Outside the central-optics assembly 410 are an ADM module 600 and a six-DOF launch 800.

FIGS. 17A, 17B, 17C are an isometric view, a rear view, and a cross-sectional view, respectively, of the launch/collimator assembly 410. In an embodiment, an optical fiber 422 attaches to a flange 424 and a ferrule 426. The ferrule 426 may be polished at a small angle such as 8 degrees to minimize back reflections. The ferrule 426 attaches to a ferrule mount 430, which along with a focus shim 432, is screwed to a collimator barrel 434. Light from the optical fiber 422, which in an embodiment is visible light such as red light, launches from a small ferrule spot having a diameter of a few micrometers and diverges to meet collimator lens elements which, in an embodiment, include a singlet lens 436 held in place by a singlet retaining ring 438 and a doublet lens 440 held in place by a doublet retaining ring 442. In an embodiment, the collimator barrel 434 is made of steel having a coefficient of thermal expansion (CTE) relatively close to the CTE of the glasses in the singlet and the doublet. The thickness of the glass and air spaces are designed to make the quality of the collimation insensitive to changes in temperature. In an embodiment, the launch/collimator assembly 410 is aligned outside of the laser tracker, with each launch/collimator assembly being essentially the same as any other, thereby enabling replacement of a launch/collimator assembly 410 in a laser tracker 10 with any other launch/collimator assembly 410 without performing further adjustments.

In an embodiment, alignment of the launch/collimator assembly 410 takes place in stages. In a first stage, the first lens 436 is centered within a bore of the collimator barrel 434. In this step, three identical gage pins having the same diameter are selected that provide a snug fit for the lens within the bore. The singlet retaining ring 438 and three set screws 443 are placed around the first lens 436 to hold it in place while epoxy is applied through epoxy injection holes 444. After the epoxy has set, the set screws 443 may be removed. In a second stage, the second lens 440 is centered within the bore of the collimator barrel 434. As above, three identical gage pins are used to roughly center the lens 440, which is afterwards held lightly in place while a further procedure is performed to center the second lens 440 with respect to the first lens 436. In an embodiment, centering is done by sending a plane wave of light through the doublet and singlet lens. A photosensitive array is used to view the light passing through the two lenses, and the position of the second lens adjusted to minimize optical aberrations observed on the photosensitive array. The doublet retaining ring 442 and three set screws 443 are tightened before applying epoxy through the epoxy injection holes 444. In a third stage, the focus shim 432 is selected to place the beam waist of the collimated beam of light at a predetermined distance from the launch/collimator assembly 410. This may be done by checking the diameter of the beam at a few different distances from the launch/collimator assembly 410. In a fourth stage, adjustment screws 446 are positioned to center the launched beam to travel along the optical axis of the lens.

FIG. 17A shows two alignment holes 449 on the front of the launch/collimator assembly 410. The alignment holes 449 mate with alignment pins 451 of a combiner assembly 450 shown in FIG. 18. By using alignment elements to enable consistent alignment of any launch/collimator assembly 410 to a combiner assembly, replacement of any launch/collimator assembly 410 with any other launch/collimator assembly 410 is possible without realigning any components within the laser tracker 10. Although a pin-and-hole alignment method is described here, it should be appreciated that any sort of repeatable alignment features may be used. Attachment screws 458 are used to firmly fix the launch/collimator assembly 410 to the combiner assembly 450.

The combiner assembly 450 is used to combine the launch/collimator assembly 410 with the position-detector assembly 460, and it is also used to combine different beams of light from the position detector splitter 454 and the six-DOF splitter 456. The position-detector assembly 460 includes a position detector 478 mounted on a position-detector circuit board 506. The position detector 478 is a detector that converts light into electrical signals and further provides secondary electrical signals that enable determination of a position at which light strikes a surface area of the position detector 478. Examples of position detectors include a lateral effect detector, a quadrant detector, a complementary metal-oxide-semiconductor (CMOS) array, and a charge-coupled detector (CCD).

The position-detector assembly 460 is ordinarily used to keep the outgoing beam of light 90 centered or nearly centered on a moving retroreflector 95, thereby causing the returning beam of light 92 to follow the same path as the outgoing beam of light 90. A control system causes the tracker motor to steer the beam to keep moving the beam toward the center of the position detector, thereby enabling tracking of the retroreflector 95 with the laser tracker 10. In practice, when the outgoing beam is exactly centered on a retroreflector, the returning beam may fall a little off a center of the position detector 478. The position on the position detector of the return beam when the outgoing beam is centered on the retroreflector is referred to as the beam-retrace position.

The position detector assembly 460 is aligned by sending a laser beam from the launch/collimator assembly 410 out of the tracker to the center of a retroreflector and then aligning elements of the position-detector assembly 460 to the returning laser beam. In an embodiment, the position-detector assembly 460 includes a position-detector filter 462, an aspheric lens mount 464, an aspheric lens 466, an aspheric-lens retaining ring 468, a pinhole 470, a pinhole retainer 472, a position-detector sensor mount 474, a holographic diffuser 476, the position detector 478, the position-detector circuit board 480, and a position-detector clamping ring 482. The position-detector filter 462 blocks unwanted light at wavelengths other than the wavelength launched by the launch/collimator assembly 410. The aspheric lens 466 reduces the size of the beam but does not focus it onto the position detector 478, which would result in measuring angle of returned light rather than lateral offset of returned light. The pinhole is used to block any unwanted ghost beams that might result, for example, from an unwanted double reflection off an optical element within the laser tracker 10. In an embodiment, the six-DOF splitter 456 has a dichroic coating that passes one wavelength and reflects another wavelength. For example, if the wavelength of the passed light is 640 nanometers (nm), which is red light, and the wavelength of a projected six-DOF light is 940 nm, the dichroic beam splitter 456 for the geometry shown would reflect the 940 nm light and transmit the 640 nm light.

In an embodiment, a launch-collimator assembly receives a first light through a first optical fiber, launces it into free space, and collimates the launched first light into a first beam of light. The launch-collimator assembly is pre-aligned and pre-collimated outside a coordinate measuring device, which might be a laser tracker. The launch-collimator assembly is further coupled through a first optical fiber to a distance meter operable to measure a first distance to a target illuminated by the first beam of light. The launch/collimator assembly is exchangeable in the coordinate measuring device with any other launch/collimator assembly without realignment of any elements within the coordinate measuring device. In a further embodiment, the exchangeable nature of the launch/collimator assembly is facilitated using mating features of the launch/collimator assembly with elements internal to the coordinate measuring device. In an embodiment, the mating features are alignment pins and alignment holes. In a further embodiment, the first beam of light is a visible beam of light such as a red beam of light.

Figure 19:
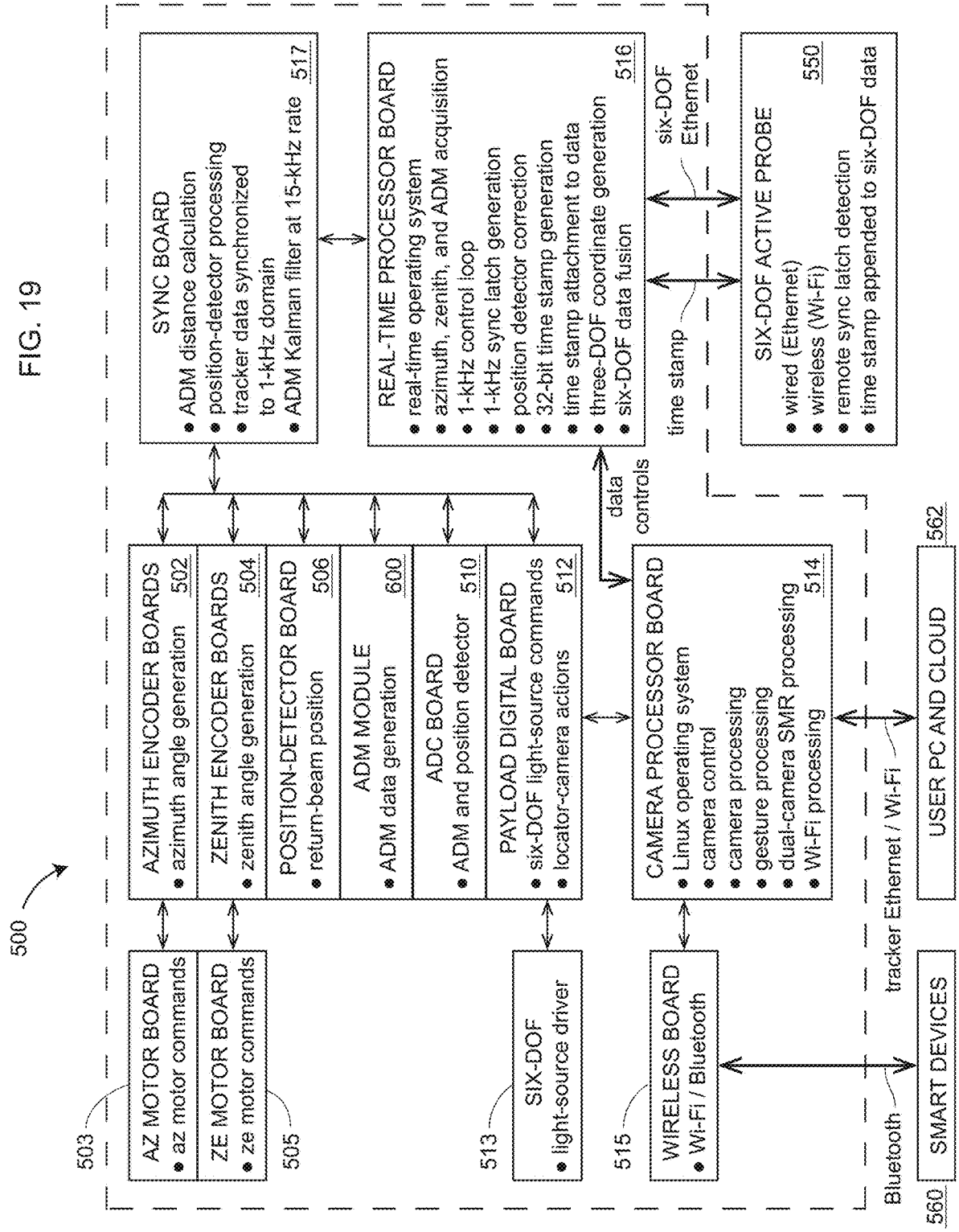
FIG. 19 is a block diagram of the electrical system of the laser tracker according to an embodiment.

FIG. 19 is a block diagram of tracker electronics 500. In an embodiment, fundamental circuit boards to obtain measurement data include an azimuth encoder board 502, a zenith encoder board 504, a position-detector board 506, an ADM module 600, an analog-to-digital converter (ADC) board 510, and a payload digital board 512. The azimuth encoder board 502 and the zenith encoder board 504 process encoder read-head information from the azimuth and zenith encoder boards, respectively, and communicate with the azimuth motor board 503 and the zenith motor board 505, respectively. The position detector board 506 determines position at which light strikes the position detector 478. The ADM module 600 provides RF modulation and processing for the ADM system 1300. The ADC board 510 digitizes signals from the ADM module 600 and the position detector 478. The payload digital board 512 provides electrical processing for the first locator camera 76 and the second locator camera 78 and communicates with the camera processor board 514. The payload digital board 512 also communicates with the six-DOF light source driver 513. These fundamental circuit boards described above communicate bidirectionally with a synchronization (sync) board 517, which performs ADM calculations, processes position detector data, synchronizes all tracker data to one kHz, and performs an ADM Kalman filtering calculation at a 15 kHz rate.

In an embodiment, the sync board 517 and the camera processor board 514 both communicate with a real-time processor board 516. The real-time processor board 516 further communicates with a six-DOF active probe by providing a time stamp and communicating over Ethernet. The real-time processor board 514 provides a real-time operating system. It is responsible for azimuth, zenith, and ADM data acquisition; for establishing the 1-kHz control loop; for generating the 1-kHz sync latch; for correcting the position detector readings; for generating a 32-bit time stamp and attaching it to readings; for generating three-DOF values; and for fusing readings from a six-DOF probe to obtain six-DOF readings.

In an embodiment, the camera processor board 514 has a Linux operating system. The camera processor board 514 performs camera control, camera processing, gesture processing, SMR position processing using two cameras, and Wi-Fi processing. The camera processor board 514 attaches to a daughter board 515 that provides Wi-Fi and Bluetooth (IEEE 802.15.1) for smart devices 560 such as laptops, notepads, and smart phones. The camera processor board 514 also provides an interface for communicating with external computers and networks by Ethernet and Wi-Fi. It should be appreciated that many types of tracker electronics may be used to perform the functions of the laser tracker 10. More or fewer processing components may be used, and some processing may be carried out by processors external to the laser tracker 10. Fewer circuit boards may be used to accommodate the required circuit components, or separated into further circuit boards. The term processor is generally understood to include memory used to store information and intermediate results.

Figure 20A:
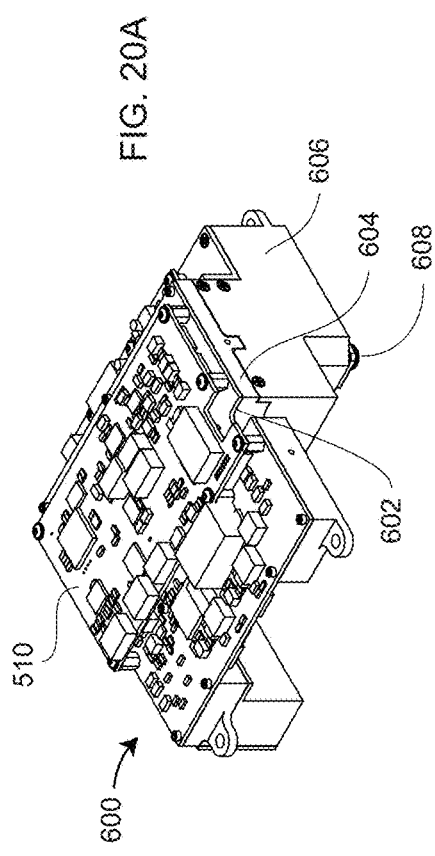
FIG. 20A is a perspective view of an ADM module and an ADC board according to an embodiment.
Figure 20B:
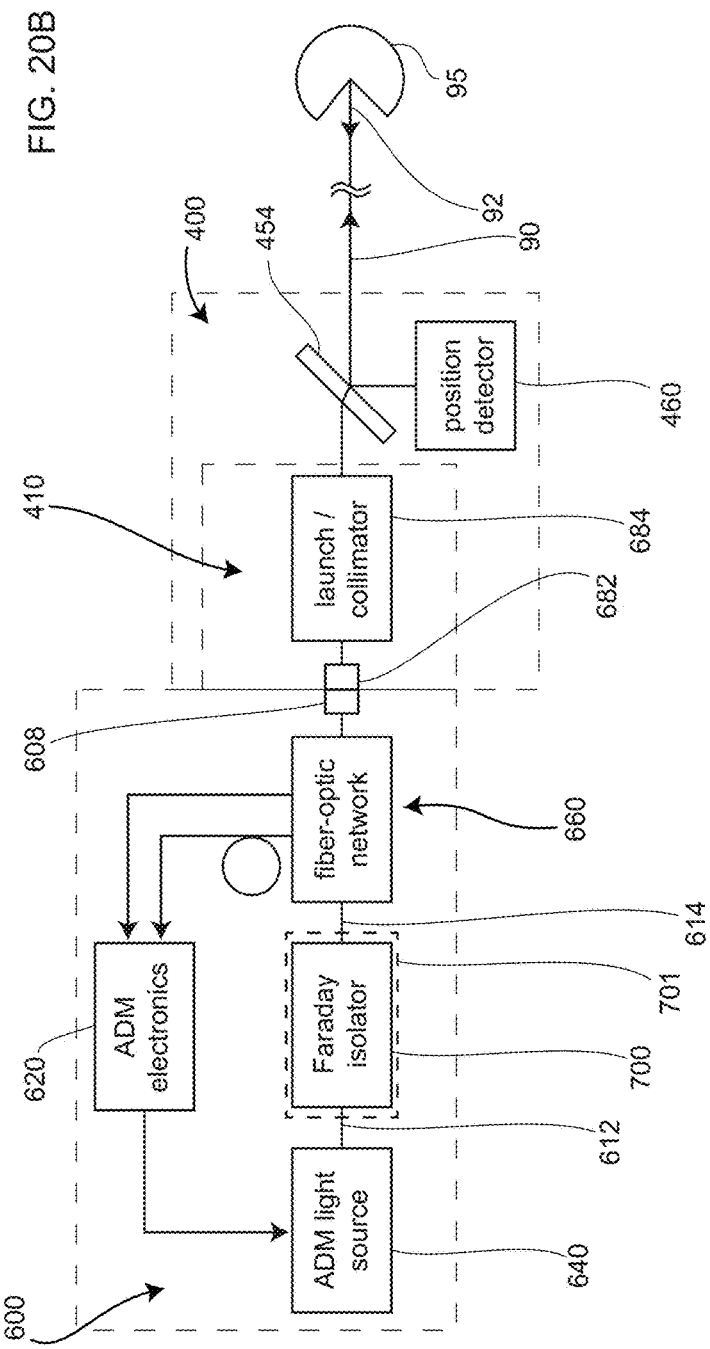
FIG. 20B is a block diagram of components within the ADM module and coupled to the ADM module according to an embodiment.

FIG. 20A is an isometric view of the ADM module 600 and the ADC board 510 according to an embodiment. The ADC board 510 is mounted over the ADM module 600, which at its top level includes an ADM transceiver board 602. On a lower side of the ADM transceiver board 602 is an upper shielded enclosure 604, which is a shielded enclosure operable to shield sensitive circuit elements of the ADM transceiver board 602 from RF electromagnetic interference. Below the upper shielded enclosure 604 is a lower shielded enclosure 606, which further includes a fiber-optic adapter 608. As shown in FIG. 20B, in an embodiment, the ADM module includes an ADM light source 640, an optional Faraday isolator 700, an optional temperature control 701, a fiber-optic network 660, and ADM electronics 620. In an embodiment, the ADM electronics 620 provides a bias current and an electrical RF modulation to the ADM light source 640, which in an embodiment is a visible laser such as a red laser. In an embodiment, the ADM light source 640 is connected to the Faraday isolator 700 by a first optical fiber 612, and the Faraday isolator 700 is connected to fiber-optic network 660 by a second optical fiber 614. As discussed further below, in an embodiment, the fiber-optic network 660 sends light to the fiber optic adapter 608 and also to the ADM electronics 620. A part of light returned from a target 95 also passes back through the launch/collimator assembly 410 and the fiber-optic network 660 to reach the ADM electronics 620.

In an embodiment illustrated in FIG. 20B, a collimator/launch assembly 410 includes a fiber-optic connector 682, which is attached to the optical fiber 422. The fiber-optic connector 682 mates with the fiber-optic adapter 608. In addition to the fiber-optic connector 682, the collimator/launch assembly 410 includes other launch/collimator components 684 as shown in FIGS. 17A, 17B, 17C. Central optics assembly 400 includes launch/collimator assembly 410, beam splitter 454, and position-detector assembly 460.

Many types of light sources may be used in the laser tracker 10, including lasers, superluminescent diodes, LEDs, or other types of light sources. If the light source 640 is a laser, it may be any of several types of laser such as a semiconductor laser (also referred to as a diode laser), a solid-state diode-pumped laser, or a gas laser. For a light source 640 used in an ADM module 600 in which distance is based on a phase determination, as described below with respect to FIG. 23, measurements have typically been carried out using a distributed feedback (DFB) semiconductor laser because DFB lasers are designed to maintain a constant laser wavelength and to produce a single longitudinal mode (as well as a single transverse mode), thereby providing a stability to the measurement of phase in the determination of the measured distance.

It would be highly desirable for a laser tracker 10 to make 3D measurements and to further track a retroreflector target 95 using a single visible wavelength. Use of a single visible wavelength eliminates potential problems from misalignment of multiple-wavelength laser beams in propagating over large distances. A further advantage is that a visible laser maintains a smaller beam size when propagating over distance, which is helpful when propagating to distant, small retroreflector targets. Another potential advantage is a potential reduction in the manufacturing cost of the laser tracker 10. However, DFB lasers are not readily available with desirable modulation characteristics for ADM measurements at visible wavelengths. An alternative to a DFB laser is a Fabry-Perot laser, which is a type of semiconductor (diode) laser. Such a laser does not include wavelength stabilizing structures as in a DFB laser and so a Fabry-Perot laser ordinarily generates multiple longitudinal modes. By providing a Fabry-Perot laser with a relatively large drive current and by avoiding conditions near mode-hop regions, it is possible for the Fabry-Perot laser to emit one wavelength that is much larger than emitted sideband wavelengths. The spacing of sideband wavelengths depends on the length of a cavity in the active lasing region. For a Fabry-Perot laser at visible wavelengths, sidebands might be spaced at intervals of around 200 picometers from the main lasing wavelength, for example.

Figure 20C:
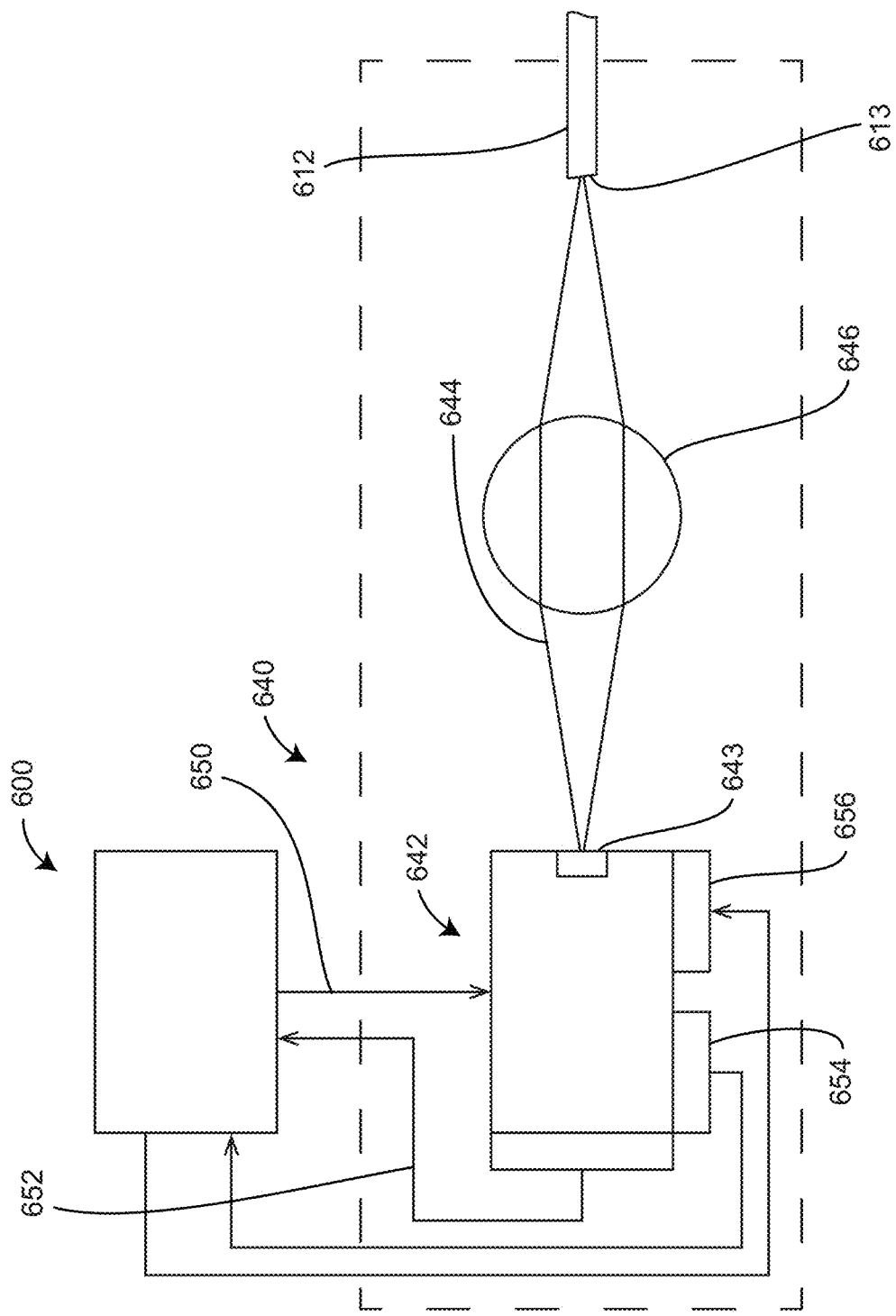
FIG. 20C is a schematic representation of components relevant to a packaged laser assembly according to an embodiment.

To obtain the best ADM measuring performance of an ADM module 600 using a Fabry-Perot laser, the size of the relatively small emitted sideband wavelengths should be stabilized relative to the main (largest) laser mode and the emitted wavelength of the main laser mode should further be stabilized. A way to achieve these objectives is to stabilize the temperature of the Fabry-Perot diode laser 642. FIG. 20C show how this may be done by coupling a temperature sensor 654 and a thermoelectric cooler (TEC) 656 to the laser 642. In an embodiment, the temperature sensor 654 sends a first electrical signal to electronics in the ADM module 600, which in turn sends the TEC 656 a second electrical signal adjusted to hold the temperature of the diode laser 642 at a constant value. An added advantage of holding the diode laser 642 at a constant temperature is that it may extend the lifetime of the diode laser 642 since lifetime of the diode laser 642 decreases with increasing temperature.

Distance measurements by the ADM module 600 may be further stabilized by controlling the level of the DC bias current applied by to diode laser 642 to hold the output optical power of the diode laser 642 at a constant level. In an embodiment, the DC bias and the RF signal are combined in the ADM module 600 using a bias-tee circuit that includes inductor and capacitor components. The combined RF/DC signal 650 is applied to the diode laser 642. In an embodiment, an electrical signal 652 from a back-facet monitor photodiode of the diode laser 642 is fed to electronics in the ADM module 600. This adjusts the level of the applied DC bias in the combined RF/DC signal 650 to hold the optical output power from the diode laser 642 at a constant level.

In an embodiment, the Fabry-Perot diode laser 642 includes an active region 643 from which the emitted light 644 emerges. The emitted light 644 passes through a lens 646, which might be a small glass sphere, for example. Other types of lenses, including non-spherical glass lenses and gradient-index lenses, may alternatively be used. In an embodiment, back reflections are minimized by coating the lens 646 with an antireflection coating. The lens 646 focuses the light into a core of an optical fiber 612. The optical fiber 612 may be a regular single-mode (SM) optical fiber that supports the selected visible wavelength, or it may be a polarization maintaining (PM), but still single-mode, optical fiber. The light is focused by the lens 646 into a small spot of approximately the same size as the core in the optical fiber 612. For visible light, the core diameter may be around 4 micrometers. Ordinarily laser light emitted by a Fabry-Perot laser 642 is linearly polarized. Effort is required to align the linearly polarized laser light to the polarization axis of a PM fiber. This effort may be reduced by using a polarization-insensitive Faraday isolator, which enables the light to be focused into a SM fiber rather than a PM fiber, as explained with reference to FIGS. 21A, 21B. In some cases, it may be possible to eliminate the Faraday isolator 700 altogether, as explained further below.

An integrated or packaged laser assembly 640 includes the diode laser 642, the lens 646, the optical fiber 612, the temperature sensor 654, the TEC 656, and the back-facet monitor diode, which produces a signal 652. Initially, the packaged laser assembly 640 includes a pigtailed optical fiber 612 at its output, but this is connected to an input fiber from the Faraday isolator 700 to become a connected optical fiber 612. In an embodiment, the pigtailed fibers of the packaged laser assembly 640 and the pigtailed fibers of the next component (either the Faraday isolator 700 or the fiber network 660) are fusion spiced together. Alternatively, the pigtailed fibers of the packaged laser assembly and the pigtailed fibers of the next components may be connected by mating a fiber-optic connector and a fiber-optic adapter. This latter option is more bulky than the fusion-spliced option, but it offers the possibility of easily exchanging a Fabry-Perot laser after a few years of use. In an embodiment, an optical-fiber end face 613 is not perpendicular to the optical fiber 612 but instead is angled to the perpendicular, for example, by 8 degrees from perpendicular. This angled back face minimizes the emitted light 644 that reflects off the fiber end face 613 and then passes back to the diode laser 642, potentially causing destabilization of the diode laser 642.

The purpose of the Faraday isolator 700 in FIG. 20B is to minimize back-reflected light, for example, light that leaves the laser tracker 10, reflects off the retroreflector 95, returns to the tracker, passes through the optical fiber 612 and enters the laser 642. In this document, the ratio of the optical power reflected from a target to the optical power launched from an ADM light source 640 is referred to as the back-reflection ratio. Generally, the back-reflection ratio needed to destabilize a diode laser depends on the particular laser but usually falls between one part in one thousand (0.001) and one part in one hundred thousand (0.00001). The required laser back-reflection ratio should be maintained over rated operating temperatures of the laser tracker 10. Rated operating temperatures are those temperatures for which specifications of the laser tracker 10 are applicable.

There are two ways to reduce the laser backreflection ratio: (1) by providing isolation using an isolator and (2) by providing optical loss over the round-trip path of the laser light from the laser light source to the target and back to the laser light source. These two ways of reducing laser back-reflection ratio are discussed further below in reference to FIGS. 20B, 21A, 21B, 22.

Figure 21A:
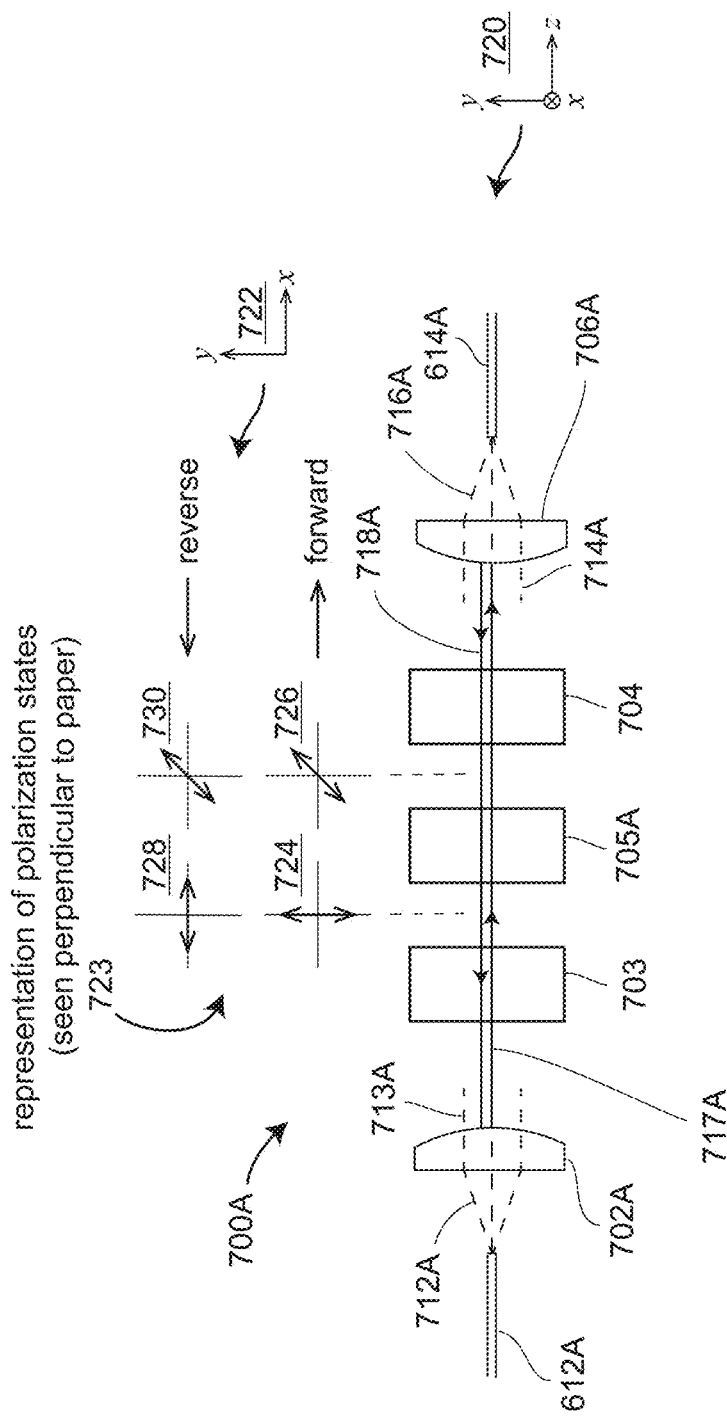

FIG. 21A is a schematic representation of a polarization-dependent Faraday isolator 700A. The term "polarization-dependent" means that the polarization of the light entering the Faraday isolator 700A must be linearly polarized in a specified direction. In an embodiment, the input optical fiber 612A is fusion spliced to the optical fiber from the ADM light source 640 as described previously. Light leaving the optical fiber 612A diverges as a cone of light 712A, arrives at collimating lens 702A, and becomes collimated light 713A. When traveling away from the light source, an outgoing light beam 717A passes through input polarizer 703, passes through Faraday rotator 705, passes through output polarizer 704, arrives at collimating lens 706A, converges as a cone of light 715A, and passes into optical fiber 614A, which in an embodiment is fusion spliced to the input optical fiber 614 of the fiber-optic network 660.

The polarization state 724 of the light after passing through the input polarizer 703 is shown in a representation 723 of the polarization states, which in 723 are shown in a plane perpendicular to the "paper." A coordinate system 720 applied to the Faraday isolator 700A shows that the light propagates along the z axis, with the optical components lying in the x-y plane. A coordinate system 722 shows the plane x-y in which the polarization states are shown in the representation 723, with x pointing into the paper and y pointing upward. In the example shown in FIG. 21A, the input polarizer 703 is oriented so that the light passing through it is linearly polarized in they direction in a polarization state 724. In an embodiment, the Faraday rotator 705A includes a Faraday-rotator crystal surrounded by permanent magnets. In passing through the Faraday rotator 705A, the polarization rotates 45 degrees in a clockwise direction, ending in a polarization state 726 aligned to a polarization direction of the output polarizer 704. Hence, for ideal polarizer and Faraday rotator components, there is no loss in optical power for light traveling in a forward direction A returning beam of light 718A may be decomposed into two polarization states, one aligned to the polarization direction of the output polarizer 704 and transmitted by the polarizer 704 to end in a polarization state 730. The other polarization state is perpendicular to the polarization state of the output polarizer 704 and is blocked from reaching the ADM light source 640. Light in the polarization state 730 passes through the Faraday rotator 705A and continues to rotate clockwise, ending in the polarization state 728, thereby being blocked by the input polarizer 703. Hence, an ideal Faraday isolator 700A completely blocks the returning beam of light 718A from reaching the ADM light source 640.

FIG. 21B is a block representation of a polarization-insensitive Faraday isolator 700B, which is a type of Faraday isolator capable of accepting light in any polarization state at the input to the Faraday isolator 700B. This property is convenient because it saves the effort and expense of aligning the linearly polarized laser light from the ADM light source 640 to a PM fiber and to align the output of the PM fiber to the input polarizer 703 in FIG. 21A. In an embodiment, an input optical fiber 612B is fusion spliced to the optical fiber 612 from the ADM light source 640. Light leaving the optical fiber 612B diverges as a cone of light 712B, arrives at a collimating lens 702B, and becomes collimated light 713B. When traveling away from the light source 640, an initial outgoing light beam 740B passes through a birefringent beam displacer 708 aligned to separate light into two orthogonal polarization states 771 and 781 that travel in two different beam paths. An outgoing light 742 travels in an upper channel 762, and an outgoing light 744 travels in a lower channel 760, respectively. The outgoing beams of light 742, 744 have polarization states 770, 780 respectively. These polarization states are shown in 770, 780 rotated perpendicular to the plane of the paper according to the coordinate systems 767, 766 respectively, with the meaning of the coordinate systems understood in relation to a coordinate system 765 aligned to components of the Faraday isolator 700B, with z being a direction of propagation.

The outgoing light 742 passes through a Faraday rotator 705B, which rotates it to a polarization state 772, and then through a half-wave plate 710, which rotates the light to a polarization state 773. The outgoing light 744 passes through Faraday rotator 705B, which rotates it to a polarization state 782, and then through the half-wave plate 710, which rotates the light to a polarization state 783. Light in the polarization state 773 passes through birefringent beam displacer 709 in the upper channel 762. Light in the polarization state 783 is in the lower channel 760 and passes through the birefringent beam displacer 709 to join the beam in the upper channel in a common outgoing light beam 746, which is a collimated beam of light 714B. A collimating lens 706B sends a converging cone of light 715B into an optical fiber 614B.

The returning beam of light traveling in the reverse direction may be decomposed into two polarization states, which are separated by the birefringent beam displacer 709 into returning light 748 in the upper channel 762 and returning light 750 in the lower channel 760. The returning light 748 passes the birefringent beam displacer 709, ending in a polarization state 774. It passes the half-wave plate 710 to end in polarization state 775 and the Faraday rotator 705 to end in polarization state 776. In passing through the birefringent beam displacer 708, it continues to travel in a straight path and encounters a beam block surface 752, which prevents the returning beam from reaching the ADM light source 640. In the lower channel, the returning light 750 passes the birefringent beam displacer 709, ending in a polarization state 784. It passes the half-wave plate 710, ending in a polarization state 785, and the Faraday rotator 776, ending in the polarization state 786. In passing through the birefringent beam displacer 708, it continues to travel in a straight path and encounters a beam block surface 752, which prevents the returning beam from reaching the ADM light source 640.

Figure 22:
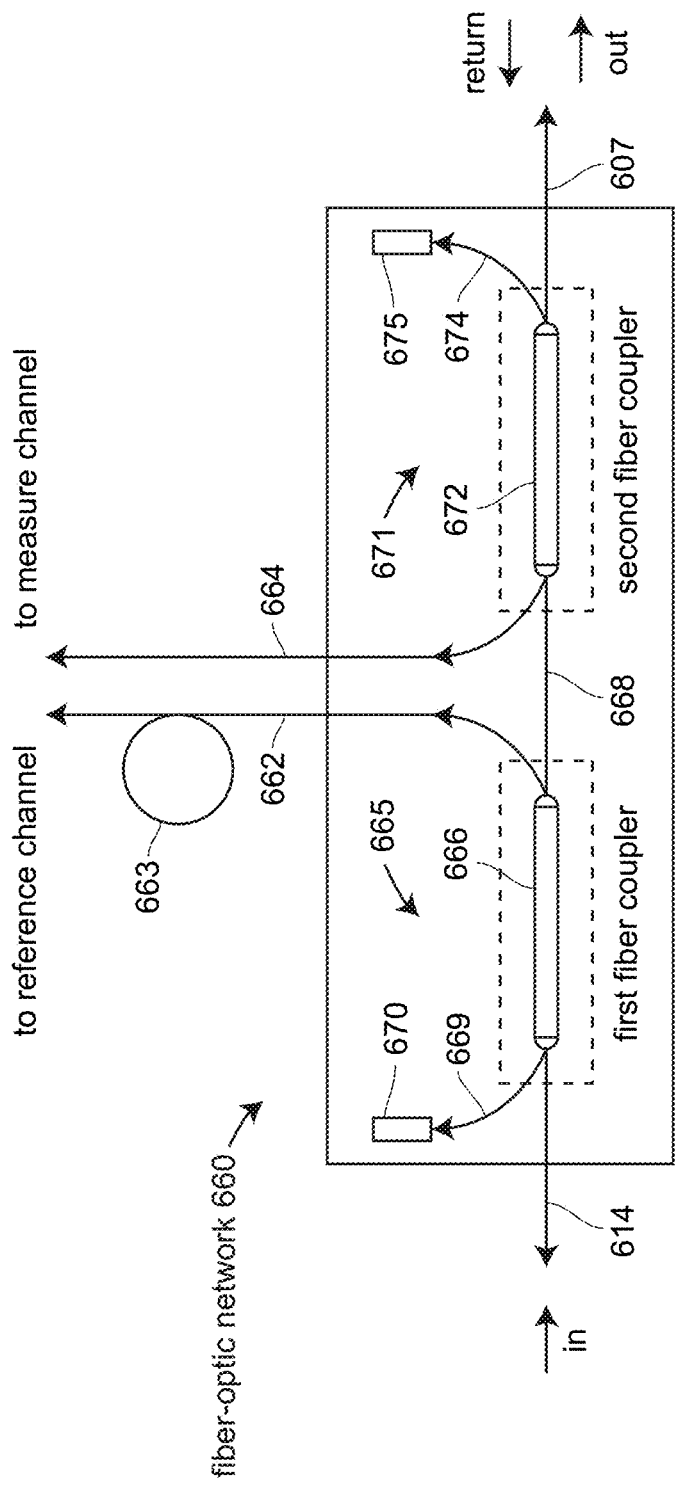
FIG. 22 is a fiber-optic network according to an embodiment.

Several types of fiber-optic networks 660 are possible in the ADM module 600. Three representative fiber-optic networks are described in FIGS. 8A, 8B, 8C of U.S. Pat. No. 8,537,376, the contents of which are incorporated by reference. FIG. 22 in the present application is a schematic representation of the fiber-optic network 660 according to an embodiment. The fiber-optic network 660 includes a first fiber coupler 666 and a second fiber coupler 672 connected together by an optical fiber 668, which may result from fusion-splicing together of pigtailed fibers from the two couplers 666, 672.

A portion of light exiting the first fiber coupler 666 passes through fibers 662, 663 to a reference detector 630 (FIG. 23) in a reference channel of the ADM module 600. Another portion of the light exiting the first fiber coupler 666 passes through the optical fiber 668 and on to the second fiber coupler 672. A portion of the light continues through an optical fiber 674 to a low-reflection termination 675. Another portion of the light continues through an optical fiber 607 out of the fiber-optic network 660. On a return path through the fiber-optic network 660, light passes in a reverse direction through the optical fiber 607 into the second fiber coupler 672. A portion of the returned light passes through an optical fiber 664 to a measure detector 631 (FIG. 23) in a measure channel. Another portion of the light passes through the second fiber coupler 672 and through the optical fiber 668 into the first fiber coupler 666. A portion of the light in the first fiber coupler passes through the optical fiber 669 to a low-reflection termination 670. Another portion of the light passes back through the optical fiber 614.

As an example of a change in optical power from the laser 642 to the retroreflector 95 and back to the laser 642, suppose the laser 642 has a coupling efficiency into the optical fiber 612 of 70 percent, the Faraday isolator 700 has a coupling efficiency of 70 percent, the first fiber coupler 666 passes 98 percent of remaining optical power to the second fiber coupler 672, the second fiber coupler passes 10 percent of remaining optical power to the launch/collimator assembly 410, the beam splitters 454, 456 have a combined transmittance of 95 percent, and the retroreflector 95 returns 75 percent of incident optical power. Further suppose that the Faraday isolator 700 has an isolation of −30 dB, which is a fractional return of optical power of 0.001. For these conditions, the fraction of optical power returned to the laser 642 relative to the launched power from the laser is (0.7)(0.7)(0.98)(0.1)(0.95)(0.75)(0.95)(0.1)(0.98)(0.7)(0.7)(0.001)=1.6×10$^{-6}$=−58 dB. Suppose that testing demonstrates that the diode laser 642 remains stable for back-reflected light as large as −28 dB. In this case, it might be possible to remove the Faraday isolator altogether and increase the optical loss slightly. Without the Faraday isolator 700, for the conditions given above, the fraction of optical power returned to the laser 642 relative to the launched power from the laser is (0.7)(0.98)(0.1)(0.95)(0.75)(0.95)(0.1)(0.98)(0.7)=0.0032=−25 dB. In this case, an increase in the system round-trip loss by 3 dB (a fractional factor of 2) somewhere in the system might be included to reduce the back-reflected optical power to −28 dB, thereby eliminating the need for the Faraday isolator 700. On the other hand, if testing demonstrated that the diode laser 642 remains stable for back-reflected light as large as −40 dB, the Faraday isolator 700 would need to provide at least 15 dB of isolation to maintain stable laser operation. If the laser tracker 10 were designed to meet its specifications over rated operating temperatures from 0 to 50° C., and if the isolation of the Faraday isolator 700 were found to fall by 15 dB for a change in temperature of 15° C., then a temperature control system 701 would be needed to hold the temperature range within ±15° C. One way to do this would be to include a heater blanket in the temperature control system. In this case, the heater blanket might be set to a baseline temperature of 40° C., with a minimum temperature (with no current applied to the heater blanket) of 25° C. and with maximum temperature (with maximum current applied to the heater blanket) of 55° C. In this case, the ambient air temperature (outside the laser tracker 10) would fall between 0 and 50° C. In this example, the temperature control system 701 would include three elements: a heater blanket, a temperature sensor, and a control circuit, the control circuit operable to set current to the heater blanket to keep the temperature of the Faraday isolator 700 as close to 40° C. as possible.

In an embodiment, a coordinate measuring device 10 includes a first light source 640, a Faraday isolator 700, and a fiber-optic network 660. The coordinate measuring device may be a laser tracker. The first light source 640 emits a first light. In an embodiment, the first light source 640 includes a Fabry-Perot laser, a lensing system, a first optical fiber, and a thermoelectric (TE) cooler. The Fabry-Perot laser produces visible light at a first wavelength. The lensing system couples the produced first light into the first optical fiber, which is a single-mode optical fiber. The TE cooler holds the Fabry-Perot laser at a constant temperature. The Faraday isolator passes first light traveling in a forward direction but blocks the first light traveling in a reverse direction toward the light source. The Faraday isolator includes an input optical fiber coupled to the first optical fiber. The Faraday isolator further includes an output optical fiber. The fiber network receives the first light from the output optical fiber and passes a first portion to a launch-collimator assembly that launches the first portion of the first light into free space and collimates the launched first light into a first beam of light. As stated above, the coordinate measuring device may be a laser tracker. In this case, the coordinate measuring device includes a first motor and a second motor to steer the beam, a first angle measuring device and a second angle measuring device to determine the direction of the first beam of light, a distance meter that measures distance to a retroreflector, and a processor that determines 3D coordinates of the retroreflector. In an embodiment, the laser tracker may further include a position detector. In an embodiment, the first light is used by the distance meter to determine distance and by the position detector to keep the first beam of light locked on the retroreflector. In an embodiment, the first light is visible light such as red light.

Figure 23:
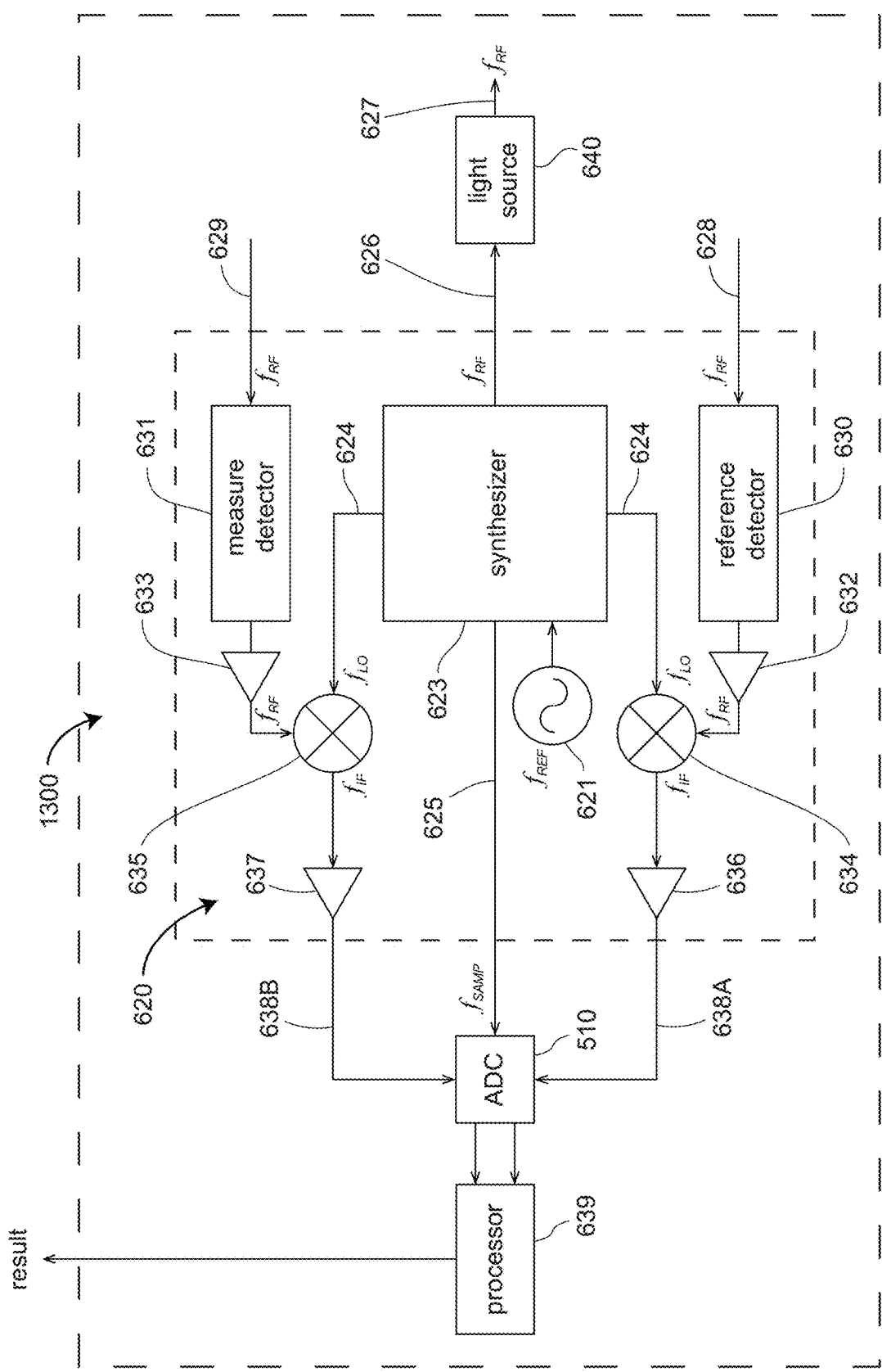
FIG. 23 shows elements of the ADM electrical and electro-optical system according to an embodiment.

FIG. 23 is a block diagram of components of an ADM 1300 according to an embodiment. The ADM 1300 includes the ADM light source 640, the ADM electronics 620, the ADC board 510, and a processor 639. The processor 639 may include one or more computing elements within the tracker electronics 500 and may further include one or more external computing elements outside the laser tracker 10. In the embodiment illustrated in FIG. 23, the ADM 1300 determines distance based on a calculated phase of electrically modulated light. In alternative embodiments, an absolute distance meter may be based on other operating principles such as a pulsed time-of-flight approach or a frequency-modulation continuous wave (FMCW) approach.

In an embodiment, the ADM electronics 620 includes a frequency reference 621 that provides a highly stable reference signal at a specified frequency. In an embodiment, the frequency reference 621 is an oven-controlled crystal oscillator (OCXO) generating a stable and accurate sinusoidal or square-wave signal. In an embodiment, the frequency reference 621 generates a frequency of 20 MHz that is accurate and stable to within 4 Hz. The frequency reference 621 is provided to a synthesizer 623 that generates signals at a radio frequency (RF) $f_{RF}$, a local-oscillator (LO) frequency $f_{LO}$, and a sampling frequency $f_{SAMP}$.

In an embodiment, the ADM light source 640 is a Fabry-Perot laser that emits visible light, such as red light. In alternative embodiments, another type of laser such as a distributed feedback (DFB) laser is used. The synthesizer 623 sends an electrical signal 626, which includes a modulation signal and a DC bias current, to the ADM light source 640. In an embodiment, the modulation signal may be sinusoidal, rectangular, or alternatively shaped signal having at least one fundamental modulation frequency $f_{RF}$. The ADM light source 640 emits light 627 modulated at the modulation frequency $f_{RF}$. In an embodiment, the optical power of the ADM light source 640 is modulated at the modulation frequency $f_{RF}$. This type of modulation is referred to as intensity modulation. Some of the modulated light 627 passes through the optical fibers 662, 663 (FIG. 22) and arrives as an optical signal 628 at a reference detector 630 that converts the optical signal 628 to an electrical signal having a fundamental modulation frequency $f_{RF}$. In an embodiment, the electrical signal passes from the reference detector 630 to conditioning electronics 632 that provides a conditioned electrical signal to a mixer 634. The synthesizer 623 sends a local-oscillator (LO) port of the mixer 634 an electrical signal 624 having the LO frequency $f_{LO}$. In response, the mixer 634 produces a signal having an intermediate frequency (IF) $f_{IF}$ equal to a difference in the LO and RF frequencies. The output of the mixer 634 may include additional frequencies besides $f_{IF}$. The output of the mixer 634 passes through conditioning electronics 636, which may include an electrical filter that removes unwanted frequencies. The signal from the conditioning electronics 636 passes to the ADC board 510, which samples the IF signal 638A at the sampling frequency $f_{SAMP}$ to obtain a collection of sampled values. In an embodiment, the intermediate frequency is 120 kHz and the sampling rate is 15 kHz, so that 8 sampled values are obtained for each cycle of the IF signal 638A. In an embodiment, a processor 639 uses an algorithm to extract the phase of the IF signal 638A from the sampled values.

Another part of the modulated light 627 is projected out of the laser tracker 10, strikes the retroreflector 95, and returns to the laser tracker 10. A part of the reflected light passes through the optical fiber 664 (FIG. 22) and arrives as an optical signal 629 at a measure detector 631 that converts the optical signal 629 to an electrical signal having the fundamental modulation frequency $f_{RF}$. The electrical signal passes from the measure detector 631 to conditioning electronics 633 that provides a conditioned electrical signal to a mixer 635. The synthesizer 623 sends the mixer 635 an electrical signal 624 having the LO frequency $f_{LO}$. In response, the mixer 635 produces a signal having an intermediate frequency (IF) $f_{IF}$ equal to a difference in the LO and RF frequencies. The output of the mixer 635 may include additional frequencies besides $f_{IF}$. The output of the mixer 635 passes through conditioning electronics 637, which may include an electrical filter to remove unwanted frequencies. The signal from the conditioning electronics 637 passes to the ADC board 510, which samples the IF signal 638B at the sampling frequency $f_{SAMP}$ to obtain a collection of sampled values. In an embodiment, the intermediate frequency is 120 kHz and the sampling rate is 15 kHz, so that 8 sampled values are obtained for each cycle of the IF signal 638B. In an embodiment, the processor 639 uses an algorithm to extract the phase of the IF signal 638B from the sampled values, using methods known in the art. In an embodiment, the processor 639 uses the determined phases for the IF signals 638A, 638B to determine a distance (the result) to the target.

In an embodiment, when a the light from the ADM light source 640 is first sent to the retroreflector 95, the frequency $f_{IF}$ is rapidly cycled among a plurality of different frequencies, thereby enabling determination of an unambiguity range for the retroreflector 95. Thereafter, the tracking of the retroreflector 95 by the laser tracker is relatively rapid, say 1000 measurements per second, thereby enabling the laser tracker 10 to keep track of the current unambiguity range occupied by the retroreflector 95 using a single modulation frequency $f_{RF}$ as the retroreflector 95 is moved. If the beam of light to the retroreflector 95 is broken, the ADM 1300 again rapidly cycles through the plurality of frequencies to re-establish the unambiguity range. In this discussion, the term unambiguity range $R_U$ is understood to be $R_U=c/(2fn)$, where c is the speed of light in vacuum, f is the modulation frequency $f_{RF}$, and n is the index of refraction of the air through which the beam of light from the ADM light source 640 travels to the retroreflector 95. In an alternative embodiment, the target 95 is not a retroreflector but is a diffusely scattering surface. In this case, since measured distances to a surface can abruptly change as the beam of light is moved transversely, the light from the ADM 1300 may simultaneously include a plurality of modulation frequencies to continually determine a present unambiguity range. A typical number of such simultaneous modulation frequencies is three to six.

A method for extracting phase from an ADM is described in U.S. Pat. No. 7,352,446, the contents of which are incorporated by reference. It should be understood that phase extraction may also be obtained using electrical architectures different than that of FIG. 23. An example of such an alternative electrical architecture is described in U.S. Pat. No. 9,157,987, the contents of which are incorporated by reference. It should further be appreciated that many alternative types of absolute distance meters are possible and may be used in place of the ADM 1300.

In an embodiment, the laser tracker 10 is a six-DOF laser tracker that uses a six-DOF launch 800 and a six-DOF probe 900 to determine six degrees-of-freedom of the six-DOF probe 900. In an embodiment, the six-DOF probe 900 includes a tactile probe 910 capable of measuring with a probe tip 916 object features not directly accessible by the beam of light 90 from the laser tracker 10. In other words, the retroreflector 940 may be in a direct line-of-sight of the beam of light 90, while an object feature measured by the probe tip 916 is hidden from view. In other embodiments, the tactile probe 910 is replaced by another type of six-DOF probe such as a six-DOF line scanner, a six-DOF area scanner, a six-DOF indicator, a six-DOF sensor, or a six-DOF projector. Examples of such six-DOF probes are given in U.S. Pat. No. 9,151,830, the contents of which are incorporated by reference.

In an embodiment illustrated in FIGS. 6A-6G, the tactile probe 910 includes a stylus 912 and a stylus extension 918, the stylus 912 further including the probe tip 916 and a stem 914. In an embodiment, the tactile probe 910 is screwed into a threaded hole 921 coupled to a frame-handle 920 that serves as a handle and that further encloses a retroreflector 940 and six-DOF sensor elements including a position-detector assembly 950 and a roll-detector assembly 960. An upper button 922 and a lower button 924 provide an operator a way to start and stop 3D measurements. In an embodiment, three indicator lights 926 provide status information to the operator.

In an embodiment, the position-detector assembly 950 includes a first lens 952, a spacer plate 953, a second lens 954, a position detector 955, and a first circuit board 956. In an embodiment, the roll-detector assembly 960 includes polarization assemblies 962 and reference assemblies 964. By determining a position at which incoming light from the laser tracker 10 strikes the position detector 955, the pitch and yaw angles of the six-DOF probe 900 may be determined. In an embodiment, this determination is made by a processor in the six-DOF probe 900. The polarization assemblies 962 each includes a diffuser-polarizer plate 966 followed by a second circuit board 968 having an optical detector. Each diffuser-polarizer plate 966 includes a linear polarizer that in addition diffuses incoming light. The reference assemblies 964 includes the second circuit board 968 having an optical detector, but the reference assemblies 964 do not include polarizers. Each of the four linear polarizers in the four polarization assemblies 962 is rotated to a different one of four relative angles 0, 45, 90, and 135 degrees. In an embodiment, the light is linearly polarized in a known direction relative to the laser tracker. By measuring the optical power passed through each of the four polarization assemblies 962 and correcting the observed level by the optical power observed in the reference assemblies 964, a roll angle of the six-DOF probe 900 may be determined by a processor. In an embodiment, the processor is included in the six-DOF probe, for example, in the third circuit board or the fourth circuit board. A port 928 of the six-DOF probe 900 is operable to receive signals from a cable arriving from the laser tracker port A or from the auxiliary box 1150 port A. The signal arriving through the port 928 provides the six-DOF probe 900 with 24 VDC power, a synchronization signal from the laser tracker 10, a 32-bit time stamp, and a 100-Mb Ethernet channel. In an alternative embodiment, the DC power is provided by a battery internal to the six-DOF assembly, with the synchronization, time stamp, and Ethernet signals transmitted wirelessly, for example, over Wi-Fi (IEEE 802.11).

FIG. 16B shows the general position of the six-DOF launch 800 within the payload assembly 70. FIGS. 24A, 24B show the six-DOF launch 800 in isometric and exploded views, respectively. The six-DOF launch 800 includes a fiber-optic adapter 804 operable to receive a fiber connector. In an embodiment, the fiber connector is configured receive a multimode fiber operable to carry light from a 940-nm LED light source. The fiber-optic adapter 804 is attached to the focus barrel 806 with a retainer nut 802. The focus barrel 806 attaches to a focus standoff 808, which in turn attaches to a fold-mirror mount 810 that holds a fold-mirror assembly 812. The fold-mirror mount further supports a collimating lens 814 and lens retainer 816. In an embodiment, the collimated 940-nm light is approximately 32 millimeters in diameter.

The collimated light passing through the collimating lens 814 further passes through a second Risley prism 820 and a first Risley prism 824. The two Risley prisms are attached to the optics body 828, with a flexure retainer 818 securing the Risley prisms 820, 824 to the optics body 828 and with the Risley prisms further separated from adjacent elements by spacers 822 and 826. The light arriving in optics body is folded by 90 degrees by the dichroic six-DOF beam splitter 456. Each Risley prism assembly includes a window having a slight wedge and a rotation mechanism that allows the wedged window to be rotated into a desired position. By adjusting the positions of the wedged windows in the first and second Risley prisms, an incoming beam of light can be adjusted to a desired direction. In this case, the Risley prisms are adjusted to align the beam from the six-DOF launch 800 with the beam from the ADM light source 640. In an embodiment described above, the light projected by the six-DOF launch 800 is generated by a LED that is linearly polarized and has a wavelength of 940 nm. In an embodiment, the 940-nm light is modulated at a relatively low frequency, detected at the six-DOF probe 900 by the optical detectors of the roll-detector assembly 960 and the position-detector assembly 950, and then filtered to remove background light not modulated at the modulation frequency applied by the six-DOF launch. In addition, optical filters may be used in the optical path to remove background light outside the projected wavelength, which in an embodiment is 940 nm. In an embodiment, electrical processing within the six-DOF probe is carried out by electronics 550 in a six-DOF active probe board(s), as shown in FIG. 19. In an embodiment, within tracker electronics 500, the payload digital board 512 communicates with a light-source driver sub-board 513 to obtain a desired modulation in the optical signal sent from the six-DOF launch 800. In an embodiment, the light from the six-DOF launch 800 reflects off the dichroic six-DOF beam splitter 656, combining with light from the ADM light source 640 to form the outgoing light 90. In an embodiment, the modulation of the light from the six-DOF launch is linked in time to the 1-kHz synchronization signal from the sync board 517 and to the 32-bit time stamp. In an embodiment, the real-time processor board 516 accepts electrical signals from the six-DOF probe 900 to fuse six-DOF data. This board further uses the fused six-DOF data to determine the 3D coordinates of the probe tip 916. In other embodiments, the real-time processor board 516 uses the fused six-DOF data to determine 3D coordinates of a surface using a six-DOF line or area scanner probe 900 in place of the tactile probe 910.

Figure 16D:
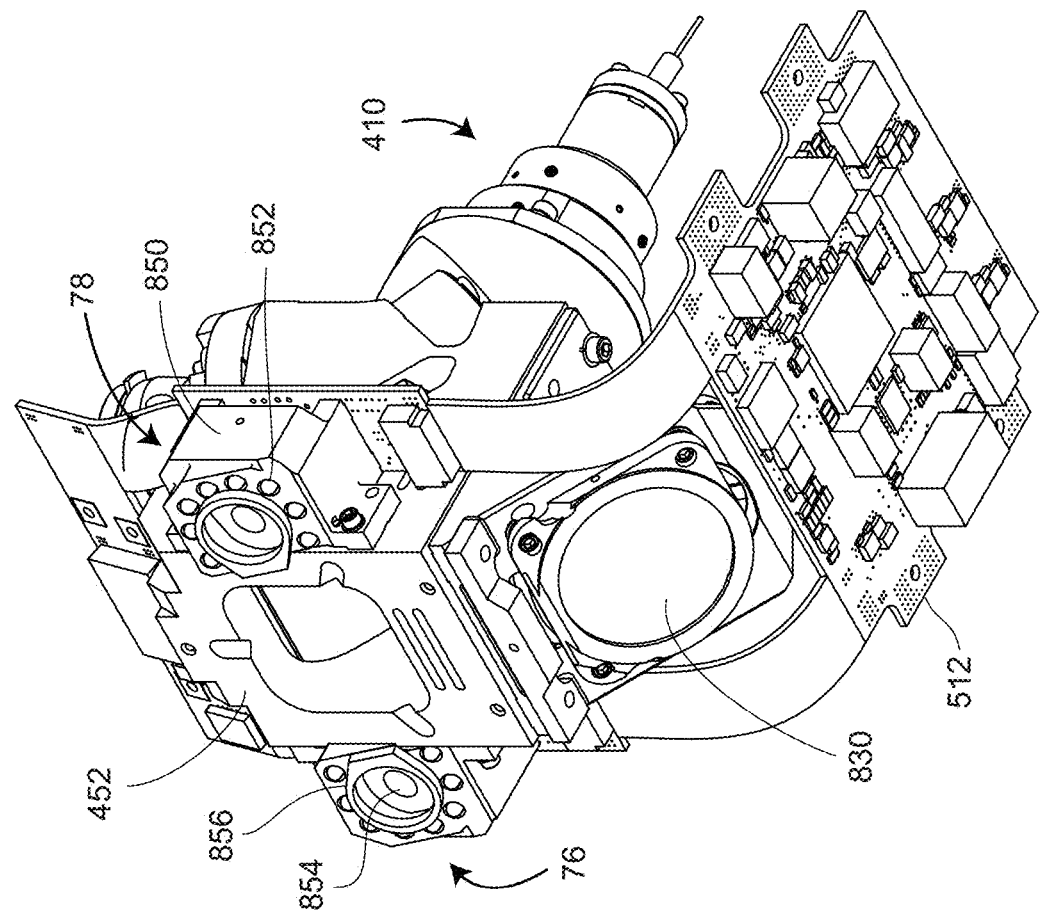
FIGS. 16C, 16D are front and isometric views of elements internal to the payload structure according to an embodiment.
Figure 16C:
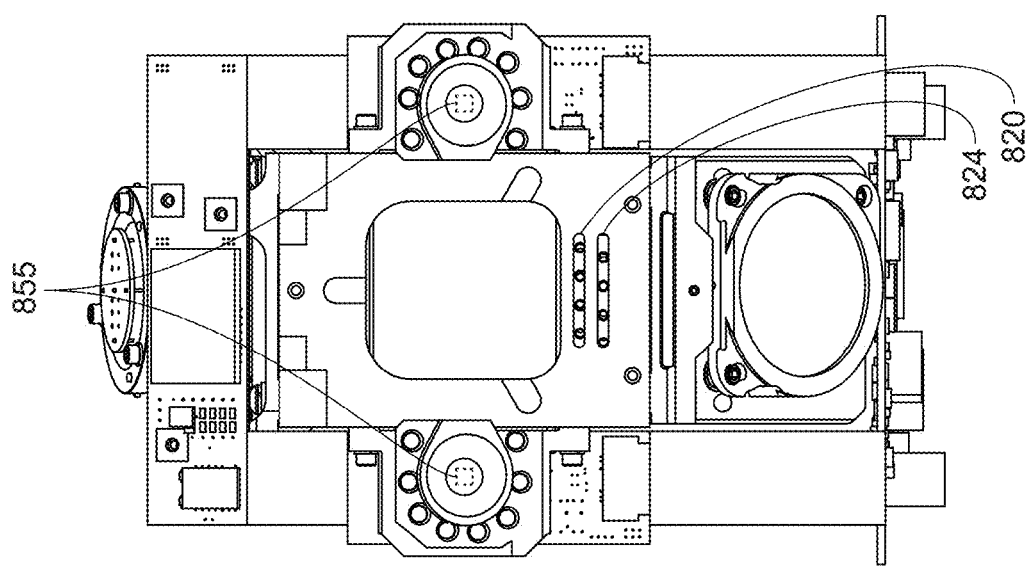

FIGS. 16C, 16D show front and isometric views, respectively, of some optical and electrical components that may be seen when covers of the payload assembly 70 are removed. FIGS. 16C, 16D show the launch/collimator assembly 410, the optics housing 452, the six-DOF fold mirror 830, the first Risley assembly 824, the second Risley assembly 820, and the payload digital board 512. In an embodiment, the payload digital board 512 includes a flex circuit that allows a portion of it to be bent by 90 degrees. These figures also show a first locator camera 76 and a second locator camera 78, each attached to the optics housing 452 and to the payload digital board 512. Each of the first and second locator cameras 76, 78 includes a camera mount 850, one or more infrared LEDs 852, camera baffle 856, camera lens 854, and photosensitive array 855. In an embodiment, camera cover windows 857 (FIG. 7) are attached in front of the camera baffles 856. In an embodiment, the front surface of the camera mount 850 and its attached components, including the one or more LEDs 852, the camera baffles 856, and the camera cover windows 857 are angled with respect to the optical axes of the first locator camera 76 and the second locator camera 78. This relative angle prevents ghost reflections from camera cover windows 857 from reaching the photosensitive arrays 855. In an embodiment, the angle of tilt of the camera mount and its attached components is at least 10 degrees. In some cases, the camera cover window is coated to provide an optical filter that blocks unwanted optical wavelengths outside desired wavelengths, which might be the wavelength of the LEDs, for example. In other instances, the optical coating if any may pass both visible light and infrared light at the LED wavelength. In an embodiment, the LEDs 852 emit at a wavelength of 850 nm. In other embodiments, light sources 852 are not LEDs but another type of light.

The locator cameras 76, 78 may be used to locate one or more retroreflectors 95 in an environment. A stereo-camera pair on a payload assembly is described in U.S. Pat. No. 8,670,114, the contents of which are incorporated by reference. In an embodiment, the light sources 852 flash at regular intervals. The flashing lights are picked up in images on the photosensitive arrays 855, with each illuminated retroreflector captured in the images as single spots of light. The flashing of the lights helps to distinguish retroreflectors 95 from background objects. However, in some cases, the flashing light of the light sources 852 may create a glint, which is a bright specular reflection from a region of the environment having an exactly correct orientation to create the specular reflection.

In an embodiment, a processor is used to help eliminate glints that might be mistaken for retroreflectors. In an embodiment, the processor matches retroreflectors in a first image of the first locator camera and a second image of the second locator camera. The retroreflectors illuminated by the flashing light sources 852 of the first locator camera 76 are seen as retroreflector spots in the first image. The retroreflectors illuminated by the flashing light sources 852 of the second locator camera 78 are seen as retroreflector spots in the second image. In an embodiment, the matching of the retroreflectors in the first image and the second image is based at least in part on a shape-and-context matching of retroreflector spots in the first image and the second image. In addition, the matching is based at least in part on an area-context-matching of background objects in the first image and the second image. The area-context-matching is based on identification and matching of natural features in the first and second images.

In an embodiment, the first locator camera 76 and the second locator camera 78 together provide image information in the visible spectrum and at the infrared wavelength of the flashing LEDs. In an embodiment, this image information is combined into a single composite image in which markers representing the LEDs are superimposed on the image of background objects in the visible spectrum. In an embodiment, the markers that indicate positions of the LEDs are shown in a bright color that is easily seen. In an embodiment, the single composite image including background objects and LED markers is presented on a display for a user to view. Such a display might be a computer monitor or a display of a smart device, for example.

In an embodiment, the tracker may steer its beam of outgoing light 90 to a retroreflector based on the first image and the second image. In an embodiment, this steering of the beam automatically occurs whenever there is a beam break in tracking the beam of light with the retroreflector 95. In other embodiments, the beam is steered to a retroreflector based on a gesture given by an operator. In other embodiments, the beam is steered to each of a collection of retroreflectors according to an inspection plan.

A problem that may occur in outdoor environments is that, on the first image and the second image, background objects illuminated by sunlight are relatively bright compared to retroreflectors illuminated by the infrared lights 852. In an embodiment, this problem is avoided by using one of the two locator cameras to preferentially capture a visible image of background objects and using the other of the two locator cameras to preferentially capture an infrared image of the illuminated retroreflectors. In an embodiment, a first locator camera assembly includes a first camera and one or more first flashing lights having a first infrared wavelength greater than 700 nm. The first camera includes a first lens corrected for both visible and first infrared wavelengths. The second locator camera assembly includes a second camera having a second lens, a second photosensitive array, and one or more flashing lights at a second infrared wavelength greater than 700 nm. The second locator camera also includes a second optical filter that passes the second infrared wavelength and blocks visible wavelengths. The second optical filter may be incorporated into a camera cover window 857 or it may be directly incorporated into the second lens by coating the second lens with an optical coating having optical filtering properties. The second lens is corrected for the second infrared wavelength. In an embodiment, the first infrared wavelength and the second infrared wavelength are the same. A processor is operable to capture background objects in a first image of the first camera and to capture illuminated retroreflectors in a second image of the second camera. The brightly illuminated retroreflectors in the second image may be matched to the more dimly illuminated retroreflectors in the first image. In an embodiment, a composite image is created of background objects at visible wavelengths and markers added to represent retroreflectors illuminated at infrared wavelengths. In an embodiment, the exposure times of the first and second cameras are set to different values according to the relative brightness of background objects and illuminated retroreflectors.

In the previous embodiment, one of the locator cameras included a lens corrected for both visible wavelengths and an infrared wavelength of the flashing lights 852. In some cases, lenses are not corrected for both wavelength ranges. In these cases, it may not be possible to obtain a clear image showing both background objects at visible wavelengths and retroreflectors illuminated at infrared wavelengths. This lack of clarity may make it difficult to carry out the matching of retroreflectors in the first locator camera and the second locator camera by using shape-and-context matching and area-context-matching as described above. A way around this problem is to adjust the distance between the camera lens and the photosensitive array to bring the visible images into clear focus on one camera and to bring the infrared illuminated retroreflectors into clear focus on the other camera. In an embodiment, a first locator camera assembly includes first flashing lights at a first infrared wavelength and a first camera. The first camera includes a first lens and a first photosensitive array, with a first separation distance between the first lens and the first photosensitive array adjusted to bring infrared wavelengths into focus in a first image. A second locator camera assembly includes second flashing lights at a second infrared wavelength and a second camera. The second camera includes a second lens and a second photosensitive array, with a second separation distance between the second lens and the second photosensitive array adjusted to bring visible wavelengths into focus in a second image. In the second image, the illuminated retroreflectors will still be visible but not as clearly as in the first image. However, there is enough information in the first image and the second image to enable matching of the retroreflectors within the fields of view of the cameras.

There is a tradeoff in selecting locator cameras having a wide field-of-view (FOV) or a narrow FOV. A wide FOV gives the possibility of capturing retroreflectors of a wide region, while a narrow FOV gives the possibility of rapidly locking onto a retroreflector target after it has been found. A way around this tradeoff is to select a different FOV for each of the two locator cameras. In an embodiment, a first locator camera assembly includes a first camera and first flashing lights at a first infrared wavelength. The first camera has a first FOV. A second locator camera assembly includes a second camera and second flashing lights at a second infrared wavelength. The second camera has a second FOV smaller than the first FOV by at least a factor of two.

A potential problem is ghost reflections from the camera cover windows 857. The camera cover windows 857 may be optical filters. Ghost reflections occur when light striking the camera cover windows reflects backwards off one of the window surfaces and then forward off a second of the window surfaces. The doubly reflected ghost beam may strike a photosensitive array, creating an illuminated spot in the image where there should be none. A way around this problem is to tilt the camera mount 850 to a large enough angle to cause the ghost beam to miss the photosensitive array. In an embodiment, a first locator camera assembly includes first flashing lights and a first camera. The first camera includes a first cover window, a first lens, and a first photosensitive array. In an embodiment, the first cover window is tilted to a first angle large enough to prevent first ghost beams from the first cover window from reaching the first photosensitive array. A second locator camera assembly includes second flashing lights and a second camera. The second camera includes a second cover window, a second lens, and a second photosensitive array. The second cover window is tilted to a second angle large enough to prevent second ghost beams from the second cover window from reaching the second photosensitive array. In an embodiment, the first cover window and the second cover window are tilted by at least ten degrees.

According to one or more embodiments, a coordinate measuring device is provided. The coordinate measurement device includes a light source operable to emit a first light, the first light being visible light having a first wavelength. A launch-collimator assembly is operable to receive the first light through a first optical fiber, to launch the first light into free space, and to collimate the launched first light into a first beam of light. The launch-collimator assembly being pre-aligned and pre-collimated outside of the coordinate measuring device. The launch-collimator assembly being further coupled through the first optical fiber to a distance meter operable to measure a first distance to a target illuminated by the first beam of light, the launch/collimator assembly being exchangeable in the coordinate measuring device with any other launch/collimator assembly without realignment of any elements within the coordinate measuring device. The coordinate measurement device further includes a first motor and a second motor that are operable to direct the first beam of light to a first direction, the first direction determined by a first angle of rotation about a first axis and a second angle of rotation about a second axis, the first angle of rotation produced by the first motor and the second angle of rotation produced by the second motor. A first angle measuring device is provided that is operable to measure the first angle of rotation and a second angle measuring device operable to measure the second angle of rotation. The coordinate measurement device further includes a processor operable to determine three-dimensional (3D) coordinates of the target based at least in part on the measured first angle of rotation, the measured second angle of rotation, and the measured first distance.

In accordance with one or more embodiments, the first light of the coordinate measurement device is red light. In an embodiment, the coordinate measuring device further includes a position-detector assembly, wherein the launch-collimator assembly and the position-detector assembly are coupled to a combiner assembly, the combiner assembly being operable to direct the first light from the launch-collimator assembly out of the coordinate measuring device to the target. In an embodiment, the combiner assembly of the coordinate measurement device is further operable to receive returned first light from the target, the combiner assembly sending a first portion of the returned first light to the first optical fiber in the launch-collimator assembly and a second portion of the returned first light to the position-detector assembly. In an embodiment, the position-detector assembly of the coordinate measurement device includes a position detector responsive to the first wavelength of light, the position detector having a position-detector surface, the position detector providing a first signal indicative of a position of the second portion of the returned first light on the position-detector surface. In still another embodiment, the position detector of the coordinate measurement device is selected from the group consisting of: a lateral-effect detector, a quadrant detector, a complimentary metal-oxide-semiconductor (CMOS) array, and a charge-coupled device (CCD) array.

In accordance with one or more embodiments, the distance meter of the coordinate measurement device is an absolute distance meter. In accordance with an embodiment, the elements of the position detector assembly of the coordinate measurement device are aligned to the combiner assembly based at least in part on the second portion of the returned first light. In an embodiment, the position detector assembly of the coordinate measurement device further includes a lens and a pinhole. In an embodiment, the target of the coordinate measurement device is a retroreflector. In still a further embodiment, the coordinate measurement device further includes a control system, the control system operable to direct the first beam of light to a center of the target based at least in part on the first signal.

In accordance with an embodiment, the coordinate measuring device further comprises a dichroic beam splitter configured to direct the first beam of light to the target and a second beam of light to the target, the second beam of light being a collimated beam of light having a second wavelength, the second beam of light having a larger diameter than the first beam of light. In accordance with an embodiment, the launch/collimator assembly coordinate measurement device mates or couples to the combiner assembly of the coordinate measurement device through the coupling of alignment pins to alignment holes. In still another embodiment, the alignment pins on the combiner assembly mate with alignment holes on the launch/collimator assembly.

In accordance with one or more embodiments, the launch-collimator assembly of the coordinate measurement device includes a plurality of optical lens elements, including a first and second optical elements. The first of the optical lens elements being fixed in place in the launch-collimator assembly. The second of the plurality of optical lens elements being centered to the first of the optical lens elements by sending a plane wave of light through the combination of elements and adjusting the centering to minimize aberrations as viewed on a photosensitive array. A distance of the first optical fiber to the plurality of optical lens elements being set using a shim, a thickness of the shim selected to place a beam waist of the first beam of light at a preferred distance from the launch-collimator assembly.

In accordance with one or more embodiments, another coordinate measuring device is provided. The coordinate measurement device having a light source operable to emit a visible first light having a first wavelength. The coordinate measurement device further having a launch-collimator assembly that is operable to receive the first light through a first optical fiber, to launch the first light into free space, and to collimate the launched first light into a first beam of light. The launch-collimator assembly being pre-aligned and pre-collimated outside the coordinate measuring device. The launch-collimator assembly being further coupled through the first optical fiber to an absolute distance meter operable to measure a first distance to a target illuminated by the first beam of light. The coordinate measurement device further includes a first motor and a second motor operable to direct the first beam of light to a first direction, the first direction determined by a first angle of rotation about a first axis and a second angle of rotation about a second axis, the first angle of rotation produced by the first motor and the second angle of rotation produced by the second motor. The coordinate measurement device further includes a first angle measuring device operable to measure the first angle of rotation and a second angle measuring device operable to measure the second angle of rotation. The coordinate measurement device further includes a position-detector assembly having a position detector responsive to the first wavelength of light, the position detector having a position-detector surface, the position detector providing a first signal indicative of a position of the second portion of the returned first light on the position-detector surface. The coordinate measurement device still further includes a combiner assembly coupled to the launch-collimator assembly and the position-detector assembly, the combiner assembly operable to send the first beam of light to the target, to receive a returned first beam of light from the target, to send a first portion of the returned first beam of light through the launch-collimator assembly into the optical fiber and on to the absolute distance meter, and to send a second portion of the returned first beam of light to the position-detector assembly. The coordinate measurement device also includes a processor operable to determine three-dimensional (3D) coordinates of the target based at least in part on the measured first angle of rotation, the measured second angle of rotation, and the measured first distance.

In accordance with an embodiment, the target is a retroreflector target. In accordance with an embodiment, the coordinate measurement device further includes a control system, the control system operable to direct the first beam of light to a center of the retroreflector target based at least in part on the first signal.

In accordance with one or more embodiments, another coordinate measuring device is provided. The coordinate measurement device includes a light source operable to emit a first light, the light source including a Fabry-Perot laser, a lensing system, a first optical fiber, and a thermoelectric cooler, the Fabry-Perot laser operable to produce visible light at a first wavelength. The lensing system being operable to couple the produced first light into the first optical fiber. The first optical fiber being a single-mode optical fiber and the thermoelectric cooler being operable to hold the Fabry-Perot laser at a constant temperature. The coordinate measurement device also includes a fiber network operable to receive the first light from the output optical fiber and to pass a first portion of the first light to a launch-collimator assembly. The launch-collimator assembly being operable to launch the first portion of the first light into free space and to collimate the launched first light into a first beam of light. The coordinate measurement device further including a first motor and a second motor operable to direct the first beam of light to a first direction, the first direction determined by a first angle of rotation about a first axis and a second angle of rotation about a second axis, the first angle of rotation produced by the first motor and the second angle of rotation produced by the second motor. The coordinate measurement device further includes a first angle measuring device operable to measure the first angle of rotation and a second angle measuring device operable to measure the second angle of rotation. The coordinate measurement device further includes a distance meter operable to measure a first distance to a target illuminated by the first beam of light. The coordinate measurement device also includes a processor operable to determine three-dimensional (3D) coordinates of the target based at least in part on the measured first angle of rotation, the measured second angle of rotation, and the measured first distance.

In accordance with an embodiment, the coordinate measuring device further includes a Faraday isolator operable to pass the first light traveling in a forward direction away from the light source and to block the first light traveling in a reverse direction toward the light source. The Faraday isolator including an input optical fiber coupled to the first optical fiber, the Faraday isolator further including an output optical fiber, the output optical fiber being a single-mode optical fiber. In an embodiment, a bias current sent to the Fabry-Perot laser is adjusted to emit light at a constant average optical power. In another embodiment, the optical power losses from the Fabry-Perot laser to the target and back to the Fabry-Perot laser are large enough are large enough to prevent destabilization of the Fabry-Perot laser over a range of rated operating temperatures of the coordinate measuring device.

In accordance with an embodiment, a combination of isolation from the Faraday isolator and optical power losses from the Fabry-Perot laser to the target and back to the Fabry-Perot laser is large enough to prevent destabilization of the Fabry-Perot laser over a range of rated operating temperatures of the coordinate measuring device. In accordance with an embodiment, a temperature control device is brought into contact with the Faraday isolator. The temperature control device operable to control the temperature of the Faraday isolator, thereby increasing the isolation of the Faraday isolator over the range of rated operating temperatures. In accordance with an embodiment, the Faraday isolator includes a Faraday rotator having a Faraday-rotator crystal and a magnet, the magnet positioned to immerse the Faraday-rotator crystal in a magnetic field. In accordance with an embodiment, the Faraday isolator is a polarization-independent Faraday isolator including a first birefringent beam displacer, the Faraday rotator, a half-wave plate, and a second birefringent beam displacer. In accordance with an embodiment, the first optical fiber is not a polarization-maintaining optical fiber and the input optical fiber is not a polarization-maintaining optical fiber.

In accordance with one or more embodiments, the target is a retroreflector. In accordance with one or more embodiments, the distance meter is an absolute distance meter (ADM). In accordance with an embodiment a first portion of the first returned light from the target passes through the launch-collimator assembly to the ADM.

In accordance with one or more embodiments, the coordinate measurement device further includes an ADM module, the ADM module being an integrated unit that includes the first light source, the Faraday isolator, the fiber network, and radio-frequency (RF) electronics, the RF electronics used to modulate the Fabry-Perot laser and to process electrically-detected optical signals passing through the fiber network, the ADM module further including an optical-fiber adapter for coupling the fiber network to the launch-collimator assembly.

In accordance with an embodiments, another coordinate measuring device is provided. The coordinate measurement device including a housing and a light source operable to emit a first beam of light. A first motor and a second motor are provided that are operable to direct the first beam of light to a first direction, the first direction determined by a first angle of rotation about a first axis and a second angle of rotation about a second axis. The first angle of rotation produced by the first motor and the second angle of rotation produced by the second motor. The coordinate measurement device further includes a first angle measuring device operable to measure the first angle of rotation and a second angle measuring device operable to measure the second angle of rotation. The coordinate measurement device further includes a distance meter operable to measure a first distance to a target illuminated by the first beam of light. The coordinate measurement device further includes a shock-absorber assembly coupled to a lower portion of the housing, the shock-absorber assembly operable to reduce mechanical shock to the coordinate measuring device when the coordinate measuring device is brought into contact with an external element that supports the housing. The coordinate measurement device also includes a processor operable to determine three-dimensional (3D) coordinates of the target based at least in part on the measured first angle of rotation, the measured second angle of rotation, and the measured first distance.

In accordance with an embodiment, the external element of the coordinate measuring device is a mandrel. In accordance with an embodiment the mandrel is attached to a stand. In accordance with one or more embodiments, the shock-absorber assembly of the coordinate measuring device includes a retractable surface that, when brought into contact with the external element, retracts toward the interior of the housing through compression of a damper material.

In accordance with one or more embodiments, another coordinate measuring device is provided. The coordinate measuring device including a housing and a light source operable to emit a first beam of light. The coordinate measuring device includes a first motor and a second motor operable to direct the first beam of light to a first direction, the first direction determined by a first angle of rotation about a first axis and a second angle of rotation about a second axis. The first angle of rotation produced by the first motor and the second angle of rotation produced by the second motor. The coordinate measuring device further includes a first angle measuring device operable to measure the first angle of rotation and a second angle measuring device operable to measure the second angle of rotation. The coordinate measuring device further includes a distance meter operable to measure a first distance to a target illuminated by the first beam of light. The coordinate measuring device further includes a first locator camera assembly that is affixed to the housing, the first locator camera assembly including a first camera and one or more first flashing lights. The coordinate measuring device further includes a second locator camera assembly affixed to the housing, the second locator camera assembly including a second camera and one or more second flashing lights. The coordinate measuring device also includes a processor operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the matching based at least in part on a shape-and-context matching of retroreflector spots in the first image and the second image and on an area-context-matching of background objects in the first image and the second image, the retroreflector spots in the first image produced by illumination of the retroreflectors by the first flashing lights, the retroreflector spots in the second image produced by illumination of the retroreflectors by the second flashing lights, the processor further operable to provide a third image that includes both the background objects and markers indicating the matched retroreflectors.

In accordance with an embodiment, the processor of the coordinate measuring device is operable to provide the third image to a display. In accordance with an embodiment, the processor of the coordinate measuring device is further operable to select one of the matched retroreflectors as the target, to direct the first beam of light to the selected target, and to determine the 3D coordinates of the selected target.

In accordance with one or more embodiments, another coordinate measuring device is provided. The coordinate measuring device including a housing and a light source operable to emit a first beam of light. The coordinate measuring device includes a first motor and a second motor operable to direct the first beam of light to a first direction, the first direction determined by a first angle of rotation about a first axis and a second angle of rotation about a second axis. The first angle of rotation produced by the first motor and the second angle of rotation produced by the second motor. The coordinate measuring device includes a first angle measuring device that is operable to measure the first angle of rotation and a second angle measuring device operable to measure the second angle of rotation. The coordinate measuring device includes a distance meter operable to measure a first distance to a target illuminated by the first beam of light. The coordinate measuring device further includes a first locator camera assembly affixed to the housing, the first locator camera assembly including a first camera and one or more first flashing lights having a first infrared wavelength greater than 700 nanometers, the first camera including a first lens and a first photosensitive array, the first camera being corrected for both visible and first infrared wavelengths. The coordinate measuring device further includes a second locator camera assembly affixed to the housing, the second locator camera assembly including a second camera and one or more second flashing lights having a second infrared wavelength greater than 700 nanometers, the second camera including a second filter, a second lens and a second photosensitive array, the second filter being operable to pass the second infrared wavelength and to block visible wavelengths, the second camera being corrected for the second infrared wavelength. The coordinate measuring device also includes a processor operable to determine three-dimensional (3D) coordinates of the target based at least in part on the measured first angle of rotation, the measured second angle of rotation, and the measured first distance, the processor further operable to capture background objects in a first image of the first camera and to capture illuminated retroreflectors in a second image of the second camera, the captured illuminated retroreflectors being within a field-of-view of second camera, the processor further operable to provide a third image of both the background objects and the illuminated retroreflectors.

In accordance with an embodiment, the first exposure time of the first camera is selected based on a quality of the first image at the first infrared wavelength and the second exposure time of the second camera is selected based on a quality of the second image at the visible wavelengths.

In accordance with one or more embodiments, another coordinate measuring device is provided. The coordinate measuring device including a housing and a light source operable to emit a first beam of light. The coordinate measuring device including a first motor and a second motor operable to direct the first beam of light to a first direction, the first direction determined by a first angle of rotation about a first axis and a second angle of rotation about a second axis. The first angle of rotation produced by the first motor and the second angle of rotation produced by the second motor. The coordinate measuring device includes a first angle measuring device operable to measure the first angle of rotation and a second angle measuring device operable to measure the second angle of rotation. The coordinate measuring device further includes a distance meter operable to measure a first distance to a target illuminated by the first beam of light. The coordinate measuring device further includes a first locator camera assembly affixed to the housing, the first locator camera assembly including a first camera and one or more first flashing lights, the first flashing lights operable at a first infrared wavelength longer than 700 nanometers, the first camera having a first lens and a first photosensitive array, a first separation distance between the first camera and the first photosensitive array being selected to permit a first image to be obtained in focus for the first infrared wavelength. The coordinate measuring device further includes a second locator camera assembly affixed to the housing, the second locator camera assembly including a second camera and one or more second flashing lights, the second flashing lights operable at a second infrared wavelength longer than 700 nanometers, the second camera having a second lens and a second photosensitive array, a second separation distance between the second camera and the second photosensitive array being selected to permit a second image to be obtained in focus for the visible wavelengths. The coordinate measuring device also includes a processor operable to determine three-dimensional (3D) coordinates of the target based at least in part on the measured first angle of rotation, the measured second angle of rotation, and the measured first distance, the processor further operable to provide a third image of both the background objects and the illuminated retroreflectors.

In accordance with one or more embodiments, another coordinate measuring device is provided. The coordinate measuring device including a housing and a light source operable to emit a first beam of light. The coordinate measuring device includes a first motor and a second motor operable to direct the first beam of light to a first direction, the first direction determined by a first angle of rotation about a first axis and a second angle of rotation about a second axis. The first angle of rotation produced by the first motor and the second angle of rotation produced by the second motor. The coordinate measuring device includes a first angle measuring device operable to measure the first angle of rotation and a second angle measuring device operable to measure the second angle of rotation. The coordinate measuring device further includes a distance meter operable to measure a first distance to a target illuminated by the first beam of light. The coordinate measuring device further includes a first locator camera assembly affixed to the housing, the first locator camera assembly including a first camera and one or more first flashing lights, the first flashing lights operable at a first infrared wavelength longer than 700 nanometers, the first camera having a first lens and a first photosensitive array, the first locator camera having a first field of view. The coordinate measuring device further includes a second locator camera assembly affixed to the housing, the second locator camera assembly including a second camera and one or more second flashing lights, the second flashing lights operable at a second infrared wavelength longer than 700 nanometers, the second camera having a second lens and a second photosensitive array, the second locator camera having a second field of view smaller than the first field of view by at least a factor of two. The coordinate measuring device also includes a processor operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the processor further operable to provide a third image that includes both the background objects and the matched retroreflectors.

In accordance with one or more embodiments, another coordinate measuring device is provided. The coordinate measuring device includes a housing and a light source operable to emit a first beam of light. The coordinate measuring device includes a first motor and a second motor operable to direct the first beam of light to a first direction, the first direction determined by a first angle of rotation about a first axis and a second angle of rotation about a second axis. The first angle of rotation produced by the first motor and the second angle of rotation produced by the second motor. The coordinate measuring device further includes a first angle measuring device operable to measure the first angle of rotation and a second angle measuring device operable to measure the second angle of rotation. The coordinate measuring device further includes a distance meter operable to measure a first distance to a target illuminated by the first beam of light. The coordinate measuring device further includes a first locator camera assembly affixed to the housing, the first locator camera assembly including a first camera and one or more first flashing lights, the first flashing lights operable at a first infrared wavelength longer than 700 nanometers, the first camera having a first cover window, a first lens and a first photosensitive array, the first cover window being tilted to a first angle, the first angle being large enough to prevent first ghost beams from reflections of the first cover window from reaching the first photosensitive array. The coordinate measuring device further includes a second locator camera assembly affixed to the housing, the second locator camera assembly including a second camera and one or more second flashing lights, the second flashing lights operable at a second infrared wavelength longer than 700 nanometers, the second camera having a second cover window, a second lens and a second photosensitive array, the second cover window being tilted to a second angle, the second angle being large enough to prevent second ghost beams from reflections of the second cover window from reaching the second photosensitive array. The coordinate measuring device also includes a processor operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the processor further operable to provide a third image that includes both the background objects and the matched retroreflectors.

In accordance with an embodiment, the first angle is at least 10 degrees. In accordance with an embodiment, the first cover window of the coordinate measuring device is a first optical filter that is configured to pass at least one of the first infrared wavelength and visible wavelengths.

Terms such as processor, controller, computer, DSP, FPGA are understood in this document to mean a computing device that may be located within an instrument, distributed in multiple elements throughout an instrument, or placed external to an instrument.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A coordinate measuring device comprising:
  a housing;
  a light source operable to emit a first beam of light;
  a first motor and a second motor operable to direct the first beam of light to a first direction, the first direction determined by a first angle of rotation about a first axis and a second angle of rotation about a second axis, the first angle of rotation produced by the first motor and the second angle of rotation produced by the second motor;
  a first angle measuring device operable to measure the first angle of rotation and a second angle measuring device operable to measure the second angle of rotation;
  a distance meter operable to measure a first distance to a target illuminated by the first beam of light;
  a first locator camera assembly affixed to the housing, the first locator camera assembly including a first camera and one or more first flashing lights having a first infrared wavelength greater than 700 nanometers, the first camera including a first lens and a first photosensitive array, the first camera being corrected for both visible and first infrared wavelengths;
  a second locator camera assembly affixed to the housing, the second locator camera assembly including a second camera and one or more second flashing lights having a second infrared wavelength greater than 700 nanometers, the second camera including a second filter, a second lens and a second photosensitive array, the second filter being operable to pass the second infrared wavelength and to block visible wavelengths, the second camera being corrected for the second infrared wavelength; and
  a processor operable to determine three-dimensional (3D) coordinates of the target based at least in part on the measured first angle of rotation, the measured second angle of rotation, and the measured first distance, the processor further operable to capture background objects in a first image of the first camera and to capture illuminated retroreflectors in a second image of the second camera, the captured illuminated retroreflectors being within a field-of-view of second camera, the processor further operable to provide a third image of both the background objects and the illuminated retroreflectors.

2. The coordinate measuring device of claim 1 wherein the first exposure time of the first camera is selected based on a quality of the first image at the first infrared wavelength and the second exposure time of the second camera is selected based on a quality of the second image at the visible wavelengths.

3. A coordinate measuring device comprising:
  a housing;
  a light source operable to emit a first beam of light;
  a first motor and a second motor operable to direct the first beam of light to a first direction, the first direction determined by a first angle of rotation about a first axis and a second angle of rotation about a second axis, the first angle of rotation produced by the first motor and the second angle of rotation produced by the second motor;

a first angle measuring device operable to measure the first angle of rotation and a second angle measuring device operable to measure the second angle of rotation;

a distance meter operable to measure a first distance to a target illuminated by the first beam of light;

a first locator camera assembly affixed to the housing, the first locator camera assembly including a first camera and one or more first flashing lights, the first flashing lights operable at a first infrared wavelength longer than 700 nanometers, the first camera having a first lens and a first photosensitive array, a first separation distance between the first camera and the first photosensitive array being selected to permit a first image to be obtained in focus for the first infrared wavelength;

a second locator camera assembly affixed to the housing, the second locator camera assembly including a second camera and one or more second flashing lights, the second flashing lights operable at a second infrared wavelength longer than 700 nanometers, the second camera having a second lens and a second photosensitive array a second separation distance between the second camera and the second photosensitive array being selected to permit a second image to be obtained in focus for the visible wavelengths; and a processor operable to determine three-dimensional (3D) coordinates of the target based at least in part on the measured first angle of rotation, the measured second angle of rotation, and the measured first distance, the processor further operable to provide a third image of both the background objects and the illuminated retroreflectors.

4. A coordinate measuring device comprising:

a housing;

a light source operable to emit a first beam of light;

a first motor and a second motor operable to direct the first beam of light to a first direction, the first direction determined by a first angle of rotation about a first axis and a second angle of rotation about a second axis, the first angle of rotation produced by the first motor and the second angle of rotation produced by the second motor;

a first angle measuring device operable to measure the first angle of rotation and a second angle measuring device operable to measure the second angle of rotation;

a distance meter operable to measure a first distance to a target illuminated by the first beam of light;

a first locator camera assembly affixed to the housing, the first locator camera assembly including a first camera and one or more first flashing lights, the first flashing lights operable at a first infrared wavelength longer than 700 nanometers, the first camera having a first lens and a first photosensitive array, the first locator camera having a first field of view;

a second locator camera assembly affixed to the housing, the second locator camera assembly including a second camera and one or more second flashing lights, the second flashing lights operable at a second infrared wavelength longer than 700 nanometers, the second camera having a second lens and a second photosensitive array, the second locator camera having a second field of view smaller than the first field of view by at least a factor of two; and a processor operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the processor further operable to provide a third image that includes both the background objects and the matched retroreflectors.

5. A coordinate measuring device comprising:

a housing;

a light source operable to emit a first beam of light;

a first motor and a second motor operable to direct the first beam of light to a first direction, the first direction determined by a first angle of rotation about a first axis and a second angle of rotation about a second axis, the first angle of rotation produced by the first motor and the second angle of rotation produced by the second motor;

a first angle measuring device operable to measure the first angle of rotation and a second angle measuring device operable to measure the second angle of rotation;

a distance meter operable to measure a first distance to a target illuminated by the first beam of light;

a first locator camera assembly affixed to the housing, the first locator camera assembly including a first camera and one or more first flashing lights, the first flashing lights operable at a first infrared wavelength longer than 700 nanometers, the first camera having a first cover window, a first lens and a first photosensitive array, the first cover window being tilted to a first angle, the first angle being large enough to prevent first ghost beams from reflections of the first cover window from reaching the first photosensitive array;

a second locator camera assembly affixed to the housing, the second locator camera assembly including a second camera and one or more second flashing lights, the second flashing lights operable at a second infrared wavelength longer than 700 nanometers, the second camera having a second cover window, a second lens and a second photosensitive array, the second cover window being tilted to a second angle, the second angle being large enough to prevent second ghost beams from reflections of the second cover window from reaching the second photosensitive array; and a processor operable to determine three-dimensional (3D) coordinates of the target based at least in part on the measured first angle of rotation, the measured second angle of rotation, and the measured first distance, the processor further operable to match retroreflectors in a first image of the first locator camera and a second image of the second locator camera, the processor further operable to provide a third image that includes both the background objects and the matched retroreflectors.

6. The coordinate measuring device of claim 5 wherein the first angle is at least 10 degrees.

7. The coordinate measuring device of claim 5 wherein the first cover window is a first optical filter configured to pass at least one of the first infrared wavelength and visible wavelengths.

* * * * *